(12) United States Patent
Davies

(10) Patent No.: US 8,530,963 B2
(45) Date of Patent: Sep. 10, 2013

(54) POWER SEMICONDUCTOR DEVICE AND METHOD THEREFOR

(75) Inventor: Robert Bruce Davies, Tempe, AZ (US)

(73) Assignee: Estivation Properties LLC, Dover, DE (US)

(*) Notice: Subject to any disclaimer, the term of this patent is extended or adjusted under 35 U.S.C. 154(b) by 994 days.

(21) Appl. No.: 11/387,209

(22) Filed: Mar. 23, 2006

(65) Prior Publication Data

US 2006/0226498 A1    Oct. 12, 2006

Related U.S. Application Data

(62) Division of application No. 10/557,135, filed as application No. PCT/US2005/000205 on Jan. 6, 2005, now abandoned.

(51) Int. Cl.
*H01L 29/78* (2006.01)

(52) U.S. Cl.
USPC ................................. 257/333; 257/E29.257

(58) Field of Classification Search
USPC ................. 257/329, 333, E29.257, E29.262
See application file for complete search history.

(56) References Cited

U.S. PATENT DOCUMENTS

| | | | |
|---|---|---|---|
| 3,763,403 A | 10/1973 | Lootens | |
| 4,710,794 A | 12/1987 | Koshino et al. | |
| 4,960,723 A | 10/1990 | Davies | |
| 5,008,736 A | 4/1991 | Davies et al. | |
| 5,032,878 A | 7/1991 | Davies et al. | |
| 5,075,739 A | 12/1991 | Davies | |
| 5,075,759 A | 12/1991 | Moline | |
| 5,252,848 A | 10/1993 | Adler et al. | |
| 5,254,491 A | 10/1993 | Boland et al. | |
| 5,281,839 A | 1/1994 | Cambou et al. | |
| 5,372,960 A | 12/1994 | Davies et al. | |
| 5,510,648 A | 4/1996 | Davies et al. | |
| 5,519,250 A | 5/1996 | Numata | |
| 5,541,132 A | 7/1996 | Davies et al. | |
| 5,563,437 A | 10/1996 | Davies et al. | |

(Continued)

FOREIGN PATENT DOCUMENTS

| | | |
|---|---|---|
| JP | 54-044481 A | 4/1979 |
| JP | 61-184843 A | 8/1986 |

(Continued)

OTHER PUBLICATIONS

Office Action received for U.S. Appl. No. 10/557,135. mailed on May 13, 2009, 13 Pages.

(Continued)

*Primary Examiner* — Colleen Matthews

(57) ABSTRACT

A power transistor includes a plurality of transistor cells. Each transistor cell has a first electrode coupled to a first electrode interconnection region overlying a first major surface, a control electrode coupled to a control electrode interconnection region overlying the first major surface, and a second electrode coupled to a second electrode interconnection region overlying a second major surface. Each transistor cell has an approximately constant doping concentration in the channel region. A dielectric platform is used as an edge termination of an epitaxial layer to maintain substantially planar equipotential lines therein. The power transistor finds particular utility in radio frequency applications operating at a frequency greater than 500 megahertz and dissipating more than 5 watts of power. The semiconductor die and package are designed so that the power transistor can efficiently operate under such severe conditions.

44 Claims, 39 Drawing Sheets

(56) References Cited

U.S. PATENT DOCUMENTS

| | | | |
|---|---|---|---|
| 5,612,244 | A | 3/1997 | Davies et al. |
| 5,640,041 | A | 6/1997 | Lur et al. |
| 5,641,712 | A | 6/1997 | Grivna et al. |
| 5,652,452 | A | 7/1997 | Asano |
| 5,688,700 | A | 11/1997 | Kao et al. |
| 5,780,324 | A | 7/1998 | Tokura et al. |
| 5,792,706 | A | 8/1998 | Michael et al. |
| 5,814,859 | A | 9/1998 | Ghezzo et al. |
| 5,846,849 | A | 12/1998 | Shaw et al. |
| 6,033,231 | A | 3/2000 | Davies et al. |
| 6,084,269 | A | 7/2000 | Davies et al. |
| 6,118,171 | A | 9/2000 | Davies et al. |
| 6,180,995 | B1 | 1/2001 | Hebert |
| 6,197,640 | B1 | 3/2001 | Davies |
| 6,204,115 | B1 * | 3/2001 | Cho ............................. 438/253 |
| 6,251,734 | B1 | 6/2001 | Grivna et al. |
| 6,261,892 | B1 | 7/2001 | Swanson |
| 6,271,106 | B1 | 8/2001 | Grivna et al. |
| 6,307,247 | B1 | 10/2001 | Davies |
| 6,348,712 | B1 | 2/2002 | Korec et al. |
| 6,410,958 | B1 | 6/2002 | Usui et al. |
| 6,455,393 | B1 | 9/2002 | Swanson |
| 6,455,925 | B1 | 9/2002 | Laureanti |
| 6,465,276 | B2 | 10/2002 | Kuo |
| 6,489,652 | B1 | 12/2002 | Jeon et al. |
| 6,498,069 | B1 | 12/2002 | Grivna |
| 6,503,838 | B1 | 1/2003 | Swanson |
| 6,512,283 | B2 | 1/2003 | Davies |
| 6,531,376 | B1 | 3/2003 | Cai et al. |
| 6,566,749 | B1 | 5/2003 | Joshi et al. |
| 6,586,833 | B2 | 7/2003 | Baliga |
| 6,617,252 | B2 | 9/2003 | Davies |
| 6,617,686 | B2 | 9/2003 | Davies |
| 6,621,136 | B2 | 9/2003 | Grivna |
| 6,653,691 | B2 | 11/2003 | Baliga |
| 6,661,068 | B2 | 12/2003 | Durham et al. |
| 6,674,157 | B2 | 1/2004 | Lang |
| 6,727,117 | B1 | 4/2004 | McCoy |
| 6,740,931 | B2 | 5/2004 | Kouzuki et al. |
| 6,758,746 | B1 | 7/2004 | Hunter et al. |
| 6,759,746 | B1 | 7/2004 | Davies |
| 6,764,918 | B2 | 7/2004 | Loechelt |
| 6,784,366 | B1 | 8/2004 | Boucher et al. |
| 6,803,317 | B2 | 10/2004 | Grivna |
| 6,809,396 | B2 | 10/2004 | Morgan et al. |
| 6,870,219 | B2 | 3/2005 | Brech |
| 6,939,788 | B2 | 9/2005 | Davies |
| 6,984,860 | B2 | 1/2006 | Grivna et al. |
| 7,019,358 | B2 | 3/2006 | Amato |
| 7,078,784 | B2 | 7/2006 | Davies |
| 7,087,925 | B2 | 8/2006 | Grivna |
| 7,126,426 | B2 | 10/2006 | Mishra et al. |
| 7,148,533 | B2 | 12/2006 | Hsu et al. |
| 7,148,553 | B1 | 12/2006 | Davies |
| 7,176,524 | B2 | 2/2007 | Loechelt et al. |
| 7,202,152 | B2 | 4/2007 | Davies |
| 7,253,477 | B2 | 8/2007 | Loechelt et al. |
| 7,256,119 | B2 | 8/2007 | Grivna et al. |
| 7,282,406 | B2 | 10/2007 | Grivna et al. |
| 7,285,823 | B2 | 10/2007 | Loechelt et al. |
| 7,300,850 | B2 | 11/2007 | Grivna |
| 7,446,003 | B2 | 11/2008 | Moscatelli et al. |
| 7,452,796 | B2 | 11/2008 | Davies |
| 7,462,550 | B2 | 12/2008 | Grivna |
| 7,482,220 | B2 | 1/2009 | Loechelt et al. |
| 7,847,369 | B2 | 12/2010 | Davies |
| 7,898,057 | B2 | 3/2011 | Davies et al. |
| 2001/0044167 | A1 | 11/2001 | Kuo |
| 2002/0063259 | A1 | 5/2002 | Usui et al. |
| 2002/0130362 | A1 | 9/2002 | Park |
| 2002/0167044 | A1 | 11/2002 | Weber |
| 2003/0136984 | A1 | 7/2003 | Masuda et al. |
| 2004/0099896 | A1 | 5/2004 | Zdebel et al. |
| 2004/0217443 | A1 | 11/2004 | Davies |
| 2006/0180858 | A1 | 8/2006 | Loechelt et al. |
| 2006/0226451 | A1 | 10/2006 | Davies |
| 2006/0246652 | A1 | 11/2006 | Grivna et al. |
| 2007/0034947 | A1 | 2/2007 | Loechelt et al. |
| 2007/0057289 | A1 | 3/2007 | Davies |
| 2007/0075399 | A1 | 4/2007 | Grivna |
| 2007/0090434 | A1 | 4/2007 | Davies et al. |
| 2007/0093077 | A1 | 4/2007 | Grivna |
| 2007/0148947 | A1 | 6/2007 | Davies |
| 2007/0207582 | A1 | 9/2007 | Grivna et al. |
| 2008/0197407 | A1 * | 8/2008 | Challa et al. .................. 257/330 |
| 2010/0032750 | A1 | 2/2010 | Davies |

FOREIGN PATENT DOCUMENTS

| | | |
|---|---|---|
| JP | 04-264776 A | 9/1992 |
| JP | 06-334503 A | 12/1994 |
| JP | 2001-127292 A | 5/2001 |
| JP | 2002-164540 A | 6/2002 |
| JP | 2002-203964 A | 7/2002 |
| JP | 2003-309261 A | 10/2003 |
| JP | 2006310836 A2 | 11/2006 |
| JP | 2006310837 A2 | 11/2006 |
| JP | 2006310838 A2 | 11/2006 |
| JP | 2007505505 | 3/2007 |
| WO | 2005069378 | 7/2005 |

OTHER PUBLICATIONS

Office Action received for U.S. Appl. No. 10/557,135, mailed on Jul. 24, 2008, 12 Pages.

Notice of Allowance received for U.S. Appl. No. 10/557,135, mailed on Aug. 24, 2009, 9 Pages.

Office Action Received for U.S. Appl. No. 11/387,617, mailed on Dec. 9, 2009, 12 Pages.

Office Action received for U.S. Appl. No. 11/387,210, mailed on Jan. 20, 2010, 10 Pages.

Office Action receiver for U.S. Appl. No. 11/387,210, mailed on May 13, 2009, 9 Pages.

Office Action Received for U.S. Appl. No. 11/387,210, mailed on Oct. 8, 2008, 9 Pages.

Office Action Received for U.S. Appl. No. 11/387,210, mailed on Oct. 6, 2009, 8 Pages.

Office Action received for Chinese Patent Application No. 200580000549X, mailed on Feb. 29, 2008, 4 pages of Chinese Office Action and 7 pages of English translation.

Office Action received for EP Application No. 05711267.4, mailed on Aug. 30, 2006, 7 Pages.

Office Action received for European Patent Application No. 05711267.4, mailed on Nov. 30, 2007, 5 Pages.

European Search Report received for European Patent Application No. 05711267.4, mailed on Dec. 14, 2007, 7 Pages.

Office Action received for Korean Patent Application No. 10-2005-7024779, mailed on Jun. 21, 2007, 3 Pages of Korean Office Action and 1 Page of Translation.

Office Action Received for Japanese Patent Application No. P2006104155, mailed on Nov. 13, 2006, 3 Pages of Office Action and 2 Pages of English Translation.

International Search Report and Written Opinion Received for PCT Application No. PCT/US2005/000205, mailed on Jan. 19, 2006, 20 Pages.

International Preliminary Report on Patentability received for PCT Application No. PCT/US2005/000205, mailed on Jul. 20, 2006, 11 Pages.

Office Action received for European Patent Application No. 05711267.4, mailed on Aug. 13, 2010, 6 pages.

Final Office Action received for U.S. Appl. No. 11/387,617, mailed on Jun. 22, 2010, 14 pages.

Office Action received for Japanese Patent Application No. 2006-104154, mailed on Apr. 26, 2010, 6 Pages of Office Action including English Translation.

Office Action received for Japanese Patent Application No. 2006-104156, mailed on Apr. 26, 2010, 8 Pages of Office Action including English Translation.

Office Action received for Japanese Patent Application No. 2006-526445 mailed on Apr. 26, 2010, 10 Pages of Office Action including English Translation.

Notice of Allowance received for U.S. Appl. No. 11/387,617, mailed on Nov. 12, 2010, 11 pages.

Notice of Allowance received for U.S. Appl. No. 12/580,390, mailed on Sep. 29, 2010, 24 pages.

Notice of Allowance on U.S. Appl. No. 11/387,210, mailed Feb. 14, 2013.

Adamson, Philip, "Lead-free Packaging for Discrete Power Semiconductors", *International IOR Rectifier*—as presented at the 2002 JEDEC Conference, (Apr./May 2002), 5 pages.

Burns, Lawrence M., "Applications for GaAs and Silicon Integrated Circuits in Next Generation Wireless Communication Systems", *IEEE Journal of Solid-State Circuits*, vol. 30, No. 10, (Oct. 1995), 1088-1095.

Bussarakons, Tiva, "New Materials and Technologies Solve Hermetic SMD Integration", *International IOR Rectifier*—as appeared in PCIM Power Electronic Systems Magazine, (Dec. 1999), 5 pages.

Craninckx, Jan, et al., "A 1.8-GHz Low-Phase-Noise Spiral-LC CMOS VCO", *1996 IEEE: 1996 Symposium on VLSI Circuits Digest of Technical Papers*, (1996), 30-31.

Erzgraber, H.B., et al., "A Novel Buried Oxide Isolation for Monolithic RF Inductors on Silicon", *IEDM 98-535, IEEE 1998*, (1998), 535-539.

Hartung, Jurgen, "Integrated Passive Components in MCM-Si Technology and their Applications in RF-Systems", *1998 International Conference on Multichip Modules and High Density Packaging*, (1998), 256-261.

Juhel, S., et al., "PowerSO-10RF: The First True RF Power SMD Package", *AN1294 Application Note*, (Feb. 2001), 12 pages.

Mahalingam, Mali, et al., "Low Rth Device Packaging for High Power RF LDMOS Transistors for Cellular and 3G Base Station Use", *Freescale Semiconductor Inc.*, Motorola Inc. 2003, 4 pages.

Niknejad, Ali M., et al., "Analysis, Design, and Optimization of Spiral Inductors and Transformers for Si RF IC's", *IEEE Journal of Solid-State Curcuits*, vol. 33, No. 10, (Oct. 1998), 1470-1481.

Prophet, Graham, "Power FETs find their place" *EDN* (Apr. 17, 2003), 6 pages.

Radivojevic, Z., et al., "Novel Material for Improved Quality of RF-PA in Base-Station Applications", *Presented at 10th International Workshop on Thermal Investigations of ICs and Systems*, Co-Authored by Nokia Research Center and Freescale Semiconductor,(Sep./Oct. 2004), 7 pages.

Sawle, Andrew, et al., "DirectEFT—A Proprietary New Source Mounted Power Package for Board Mounted Power", http://www.irf.com/technical-info/whitepaper/directfet.pdf, (Unknown), 5 pages.

Non-Final Office Action on U.S. Appl. No. 11/387210, mailed Jul. 16, 2012.

* cited by examiner

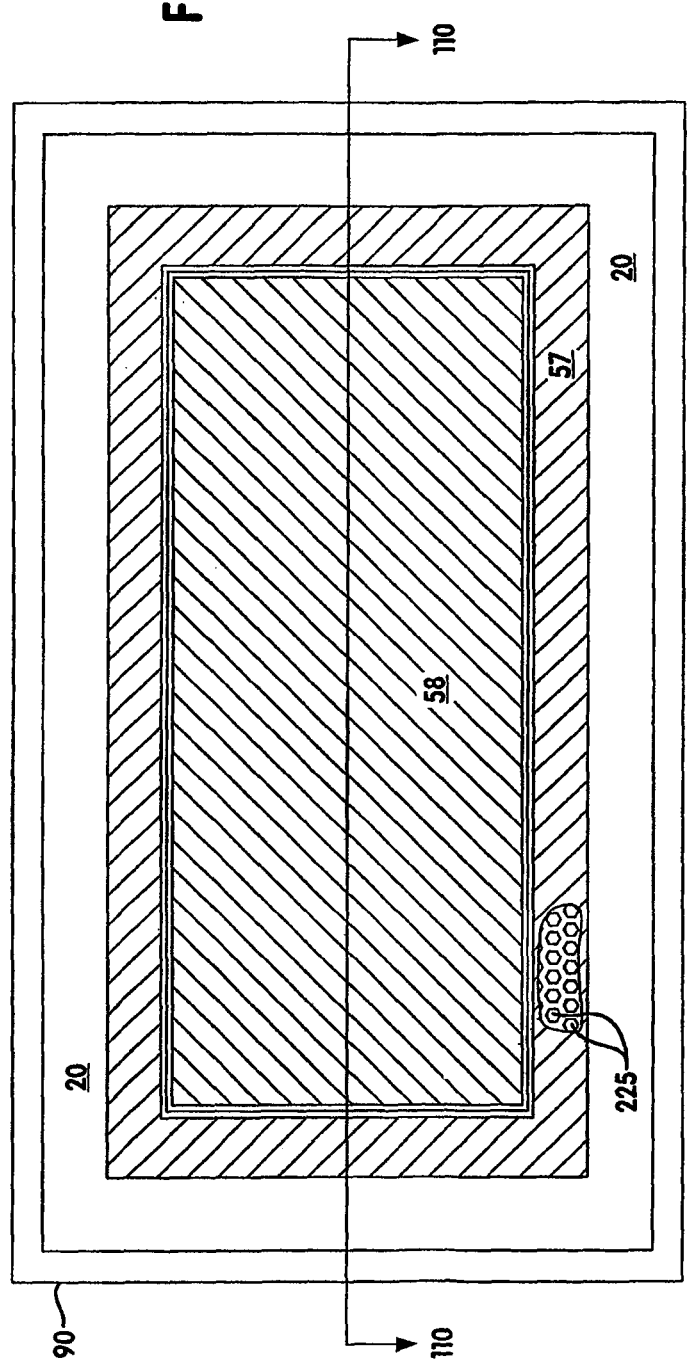
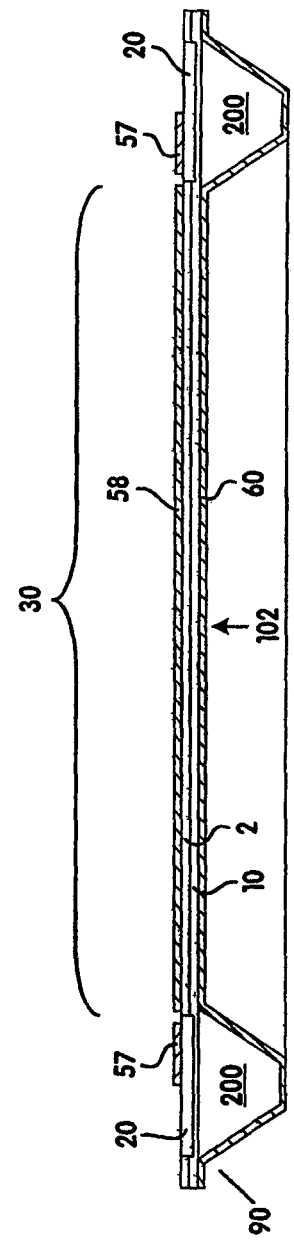

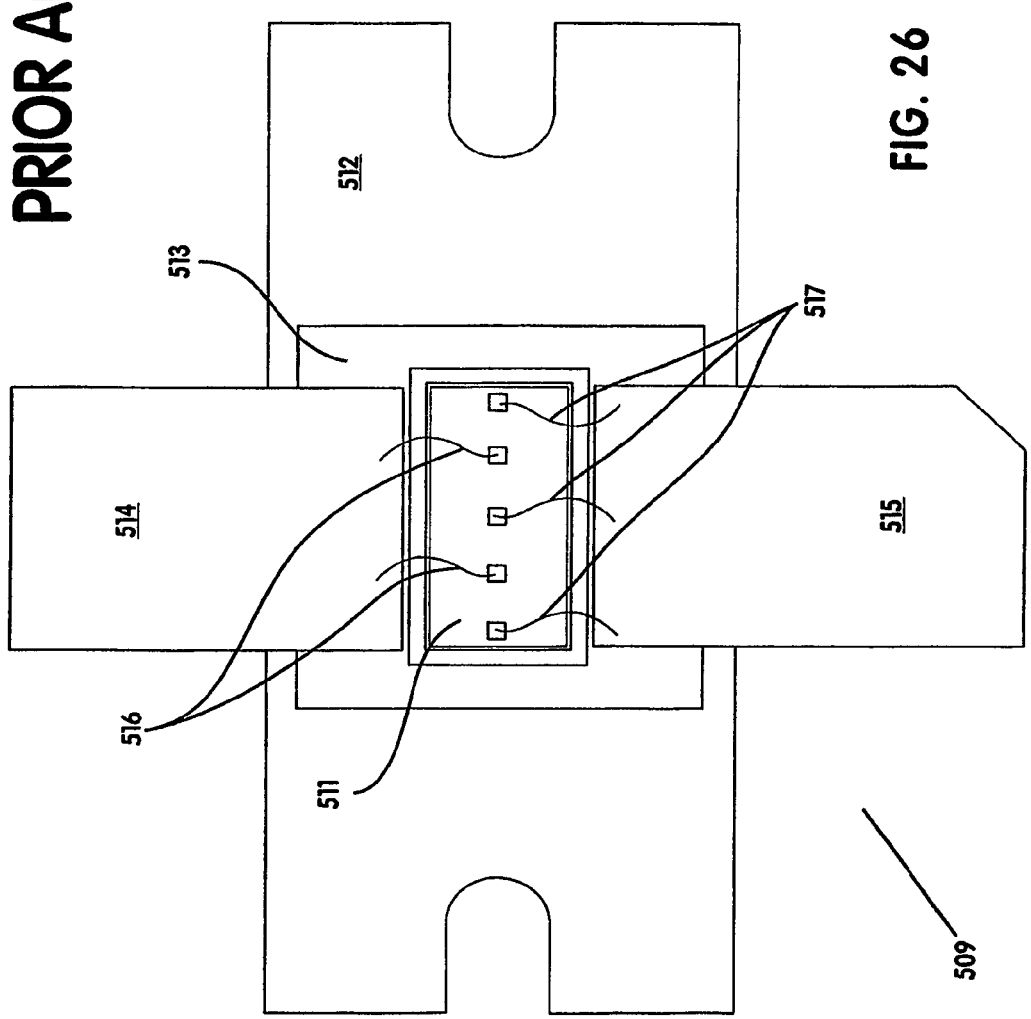

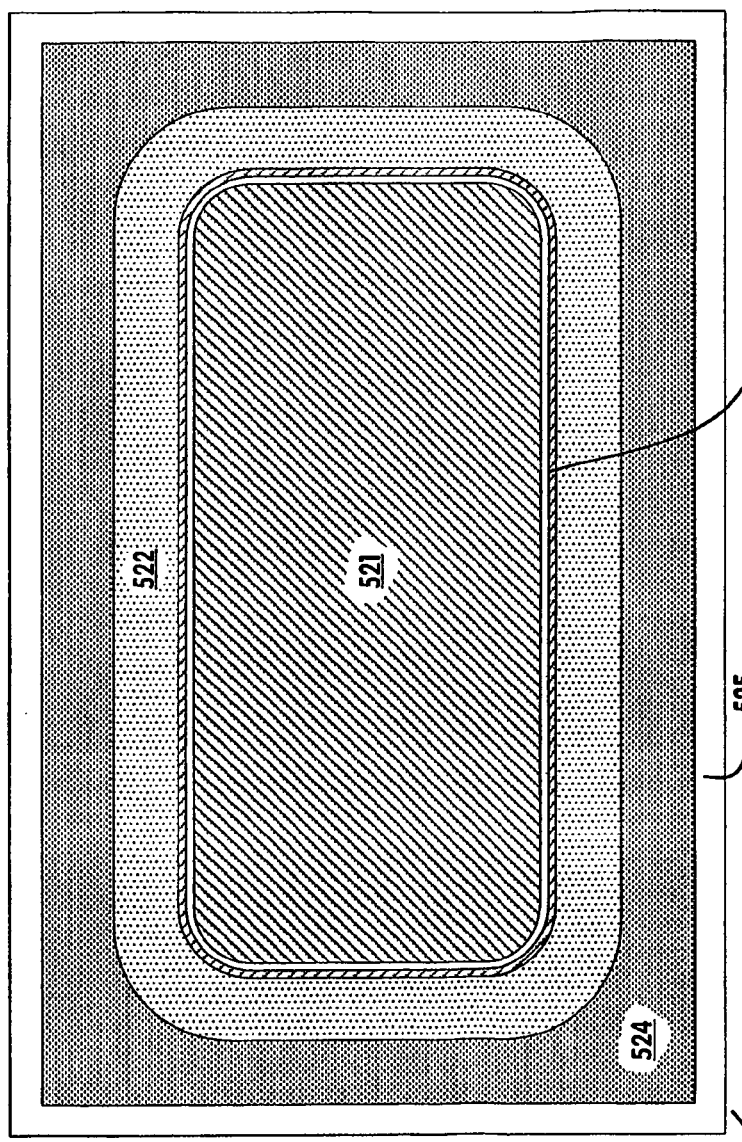
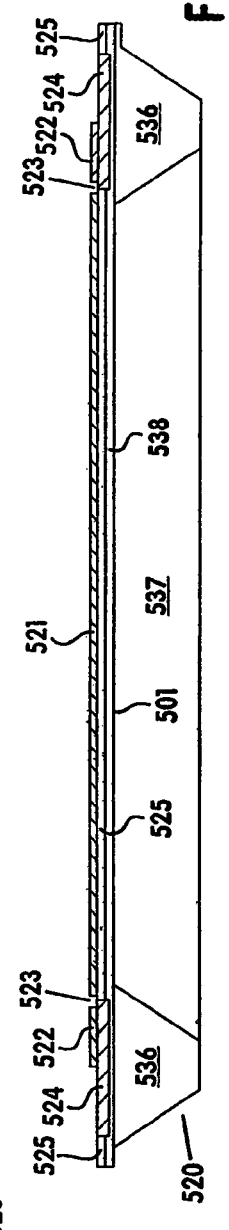

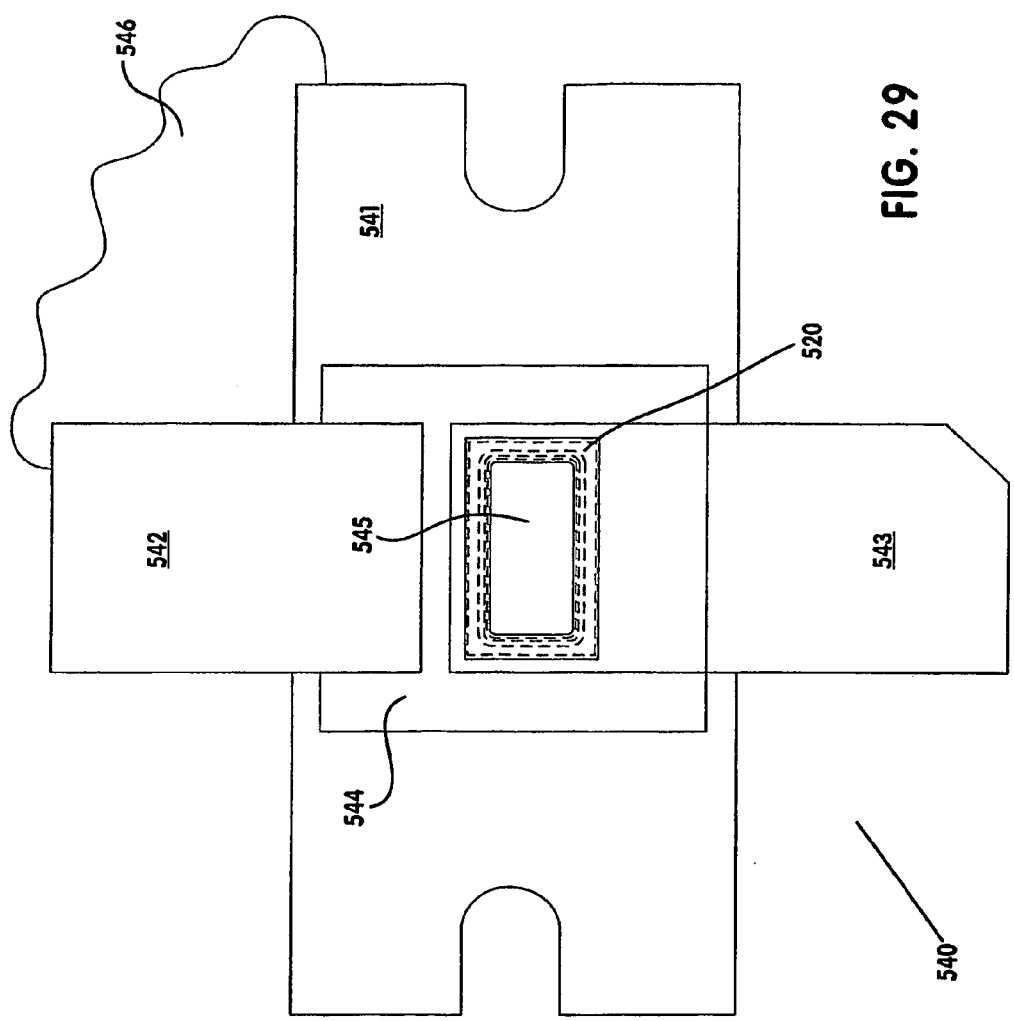

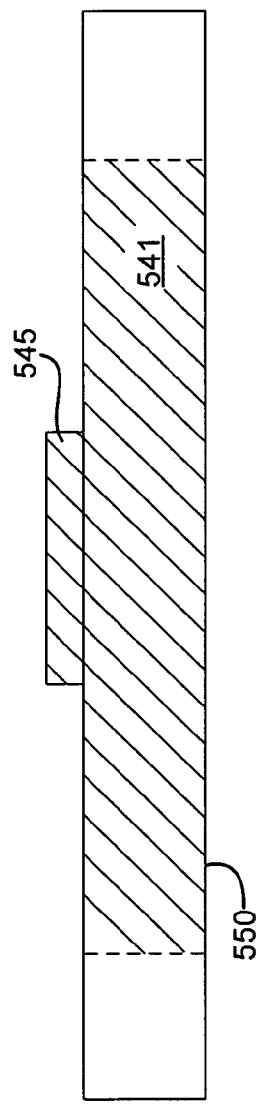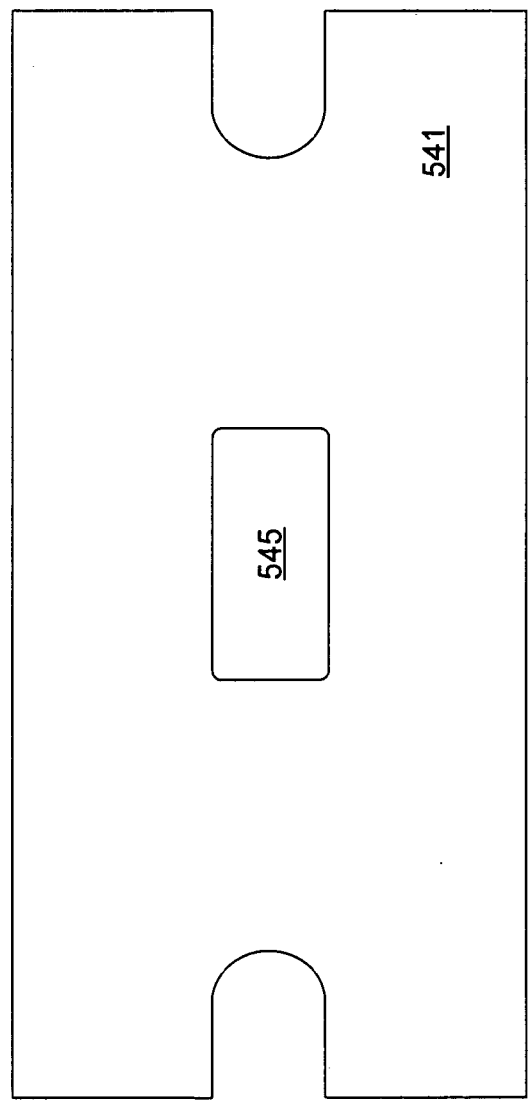

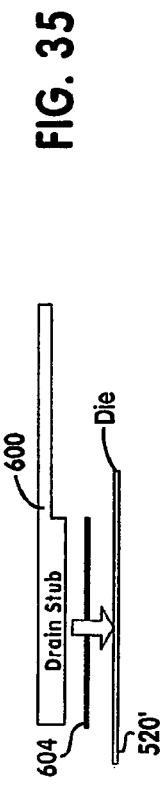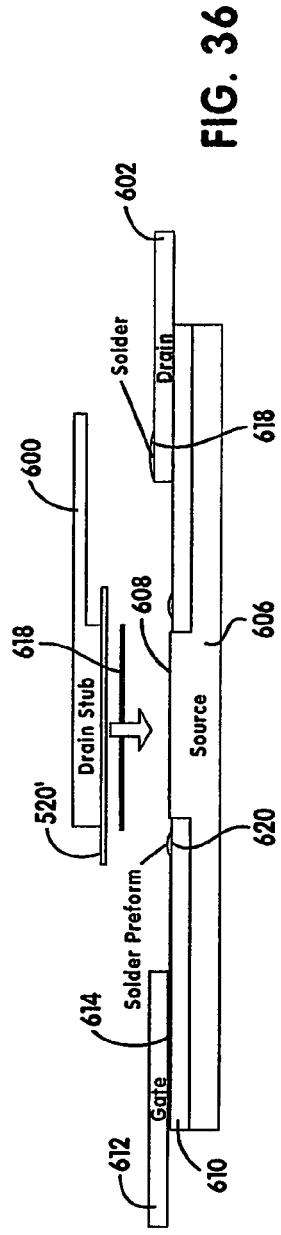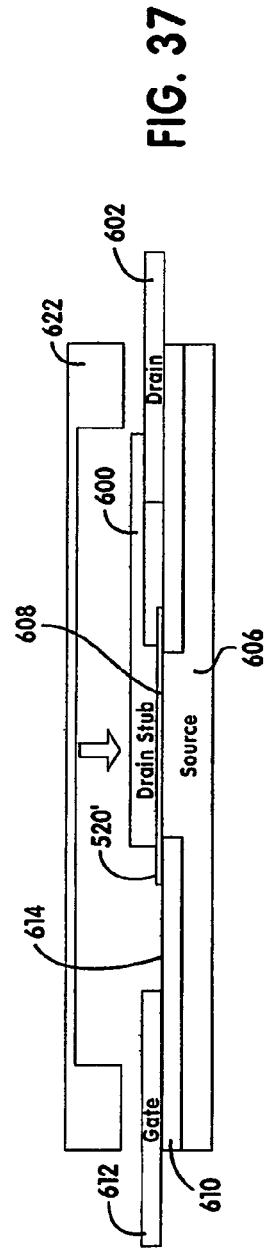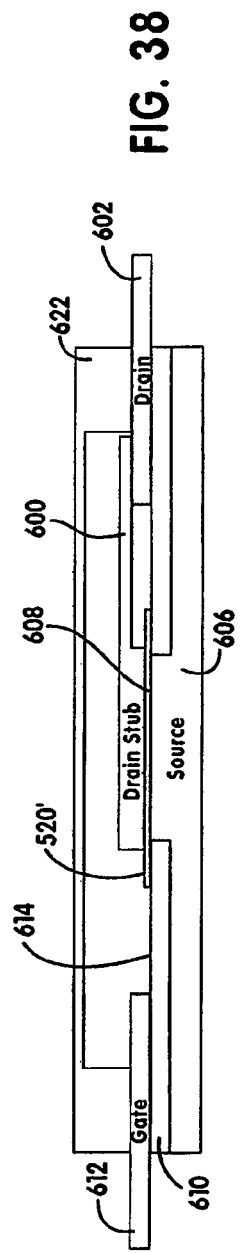

POWER SEMICONDUCTOR DEVICE AND METHOD THEREFOR

CROSS REFERENCE TO RELATED APPLICATIONS

This is a divisional of application Ser. No. 10/557,135, filed Nov. 17, 2005, now abandoned which claims priority to Patent Cooperation Treaty (PCT) International Application Number PCT/US2005/000205 having an International Filing Date of Jan. 6, 2005, which claims priority to U.S. Provisional application No. 60/535,956 filed Jan. 10, 2004 and U.S. Provisional application No. 60/535,955 filed Jan. 10, 2004. All of the foregoing applications are hereby incorporated by reference.

TECHNICAL FIELD OF THE INVENTION

The present invention generally relates to a silicon semiconductor device, and more particularly relates to a radio frequency (RF) power transistor.

BACKGROUND OF THE INVENTION

The present invention relates, in general, to radio frequency (RF) power transistors, and more particularly, to radio frequency (RF) power transistors operating at a frequency greater than 500 megahertz and dissipating more than 5 watts of power. However, it should be understood that certain aspects of this invention have applicability at frequencies below 500 MHz and below 5 Watts. For example, it could find particular utility in power supply and power management circuitry, as well. Therefore, the term "radio frequency (RF) power semiconductor device" or "radio frequency (RF) power transistor" as used in this specification should not be construed as limiting the invention unless the claims specifically recite such limitations.

The number of wireless applications has grown significantly over the past decade. The cellular telephone market is among the most pervasive of wireless technologies. The use of wireless devices is no longer considered a luxury but has become a necessity in the modern world. Wireless is by no means limited to cellular applications. Local area networks, digital television, and other portable/non-portable electronic devices are all moving towards having wireless interconnect. Not only are the number of different types of wireless devices increasing but there is also a need for higher data content that can be transmitted and received. Increasing the content being delivered requires more bandwidth to transmit the data at a rate that is usable for the customer. For example, it is well known that most cellular telephones are currently operating with 2 G ($2^{nd}$ generation) or 2.5 G wireless infrastructure. Second generation wireless (2 G) is known for the conversion from analog to digital technology for voice applications. The 2 G and 2.5 G wireless infrastructure has limited capability to send large amounts of data or information to a user.

Third generation cellular (3G) is an upgrade in cellular transmission capabilities to meet the demands for the transmission of higher content. An example of the higher content includes video information and real time access to the internet. One area of licensed spectrum that will be utilized for 3 G is at a frequency of 2.1 GHz which will be deployed having a minimum of 144 kbps packet-data service. Furthermore, there are plans for an enhanced 3G that requires transmission in the 2.6-2.8 GHz range. Although 4 G has not been defined, it is predicted that higher frequency operation will be required to provide the bandwidth needed for high data rate transmission. In particular, it is expected that 4 G wireless transmission will be at frequencies greater than 3 GHz.

There are similar changes occurring in areas other than cellular, such as television transmission where the conversion to digital television is mandated by the federal government within the next decade. The simultaneous transmission of high definition television (HDTV) further increases the complexity of the RF transmission equipment. Another area that is rapidly expanding wireless activity is wireless broadband for access to the internet. What all of these applications have in common is the use of RF power transistors in power amplifiers (PA) that provide a power output from 5 watts to kilowatt levels.

The move to high frequency and high power transmission places enormous demands on the RF power transistor. RF power transistors are typically used in output stages of transmitters, for example in cellular base transceiver stations (BTS). The operating frequency for a cellular BTS can be as low as 450 MHz and as high as 2.7 GHz at this time. The power output of a cellular BTS is typically 5 watts and above. Moreover, the wireless industry is moving to standards that require better linearity and lower distortion at the higher frequency of operation. Wireless interface technologies such as WCDMA (wideband code division multiple access) and OFDM (orthogonal frequency division multiplexing) require high linearity to maximize data throughput and prevent spurious signals from being transmitted outside the transmission band.

The RF power transistor is typically used in a grounded source configuration. The predominant device being used for this type of high power radio frequency application has severe device design constraints when attempting to further extend frequency, operating voltage, and lowering distortion. Furthermore, thermal issues of the RF power transistor are as important as electrical design in a RF power amplifier and must be addressed for higher power and higher frequency operation.

Accordingly, it is desirable to provide a RF power transistor that operates at higher frequencies with increased linearity. In addition, it is desirable to provide a RF power transistor that is simple to manufacture and lower in cost. It would be of further benefit if the RF power transistor had improved thermal management, higher voltage operation and reduced parasitics.

BRIEF SUMMARY OF THE INVENTION

Various aspects of this invention can be used alone or in combination with one another. For example, if it is desired to make a RF power transistor for cellular applications then many of the improvements disclosed herein in both the die manufacture and the package design should preferably be considered. On the other hand, one or more of the improvements can be used alone if the application requirements are not so demanding. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1 is a top view of a radio frequency (RF) power transistor die made in accordance with the present invention;

FIG. 2 is a cross-sectional view of the radio frequency (RF) power transistor die of FIG. 1;

FIG. 26 is a top view of a Prior Art semiconductor package for a RF power transistor;

FIG. 27 is a top view of a radio frequency (RF) power transistor in accordance with the present invention;

FIG. 28 is a cross-sectional view of the radio frequency power transistor die of FIG. 27;

FIG. 29 is a top view of a radio frequency (RF) power transistor package in accordance with the present invention;

FIG. 30 is cross-section of a portion of the radio frequency power transistor package of FIG. 29;

FIG. 31 is a top view of FIG. 30;

FIGS. 35-38 are cross sectional views of a semiconductor package according to another embodiment of the present invention;

DETAILED DESCRIPTION OF THE INVENTION

Figure 3:
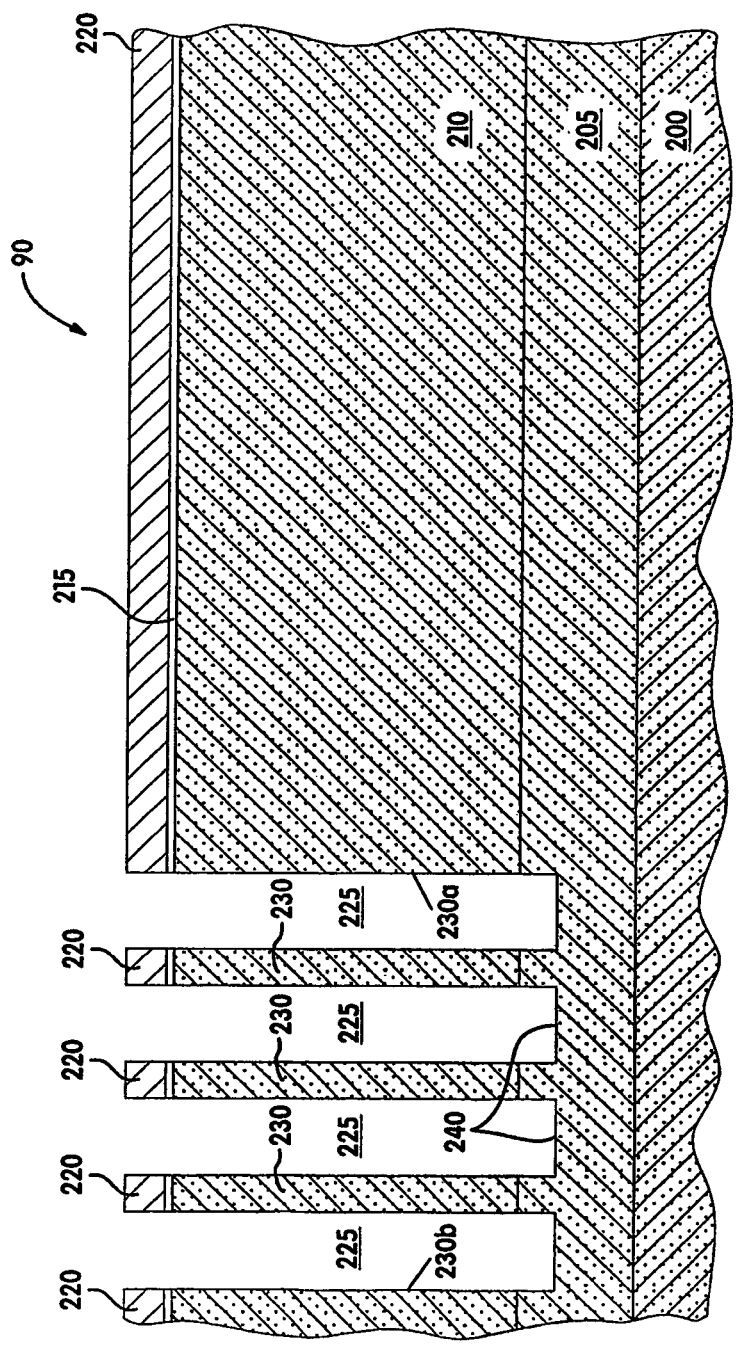
FIGS. 3-21 are exploded cross-sectional views of a portion of the RF power transistor of FIG. 2 illustrating wafer processing steps to form the device in accordance with the present invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The Die

Turning now to the drawings, in which like reference characters indicate corresponding elements throughout the several views, attention is first directed to FIG. 1 where a top view of a radio frequency (RF) power transistor integrated circuit (IC) device or die 90 is shown. The device die and packaging therefore according to the present invention is expected to have a higher voltage breakdown, improved linearity, better thermal management, lower $R_{dson}$, higher output impedance, lower output capacitance, and extended frequency response when compared against prior art RF power transistors. In an embodiment of the RF power transistor, die 90 is fabricated from a p-type silicon semiconductor die or substrate. Various aspects of the inventions described herein find particular utility in a RF power transistor device that operates at frequencies greater than 500 MHz and has a power output greater than 5 watts. A device operating at these levels must account for both electrical and thermal considerations. Moreover, the package and device becomes a radio frequency system which marries the electrical and thermal performance in a manner where the device is both rugged and reliable over all operating conditions. Thus, the specification will be directed to this specific example of an RF power transistor but those skilled in the art will appreciate that certain features of this invention can be used in other types of semiconductor devices.

The current predominant RF power transistor on the market has a drain and gate of the device wire bonded respectively to the drain and gate lead of the package. The device is a lateral structure having the drain and gate contact on an upper surface of the die and the source contact on the bottom surface of the die. A RF power device typically requires more than one wire bond to make a low resistance connection. Multiple wire bonds are used and distributed in a manner that minimizes resistive path differences to drains of the transistors that comprises the RF power transistor. In general, the prior art RF power transistor die is made having a high length to width aspect ratio such that wire bonds are distributed over the length of the die. The small width of the die reduces the length of the wire bond from the die to the lead of the package. A wire bond is an inductor that bandwidth limits the RF power transistor and is used as an element in an impedance matching network. Wire bond length cannot be perfectly controlled in a production environment and the variance in inductance can impact power amplifier yield. Thus, the preferred embodiment of the present invention employs a design that eliminates wire bonds.

RF power transistor die 90 has a first major side (top surface) and a second major side (bottom surface). The first major side of die 90 has a first electrode interconnection region 58 and a control electrode interconnection region 57. In general, first electrode interconnection region 58 and control electrode interconnection region 57 are layers of metal or metal alloy providing low resistance and excellent thermal conductivity. In an embodiment of the RF power transistor, first electrode interconnection region 58 is centrally located on die 90 and provides an electrically conductive path between source electrodes on the die and an external metallic contact on the package (which will be discussed later herein). In general, the RF power transistor comprises a number of substantially identical transistor cells coupled in parallel to one another. The central active area of die 90 is the area where the transistor cells of the RF power transistor are formed. In an embodiment of the RF power transistor, first electrode interconnection region 58 overlies a majority of the active area and preferably approximately all of the active area. First electrode interconnection region 58 provides a large contact area, low resistance and substantially equal (balanced) coupling to all transistor cells.

The total area and central location of first electrode interconnection region 58 provides a substantial benefit. No wire bonds are required to couple first electrode interconnection region 58 to the external contact of a RF power transistor package. The metallic external contact or lead of the RF power transistor package can be directly connected to first electrode interconnection region 58 eliminating the inductance and resistance of wire bonding. A substantial second benefit of contacting the surface area of first electrode interconnection region 58 is that heat can be removed from the first major side of die 90 through the lead of the RF power transistor package. Since first electrode interconnection region 58 overlies the active area of die 90, it is a low resistance thermal path in which heat can be effectively pulled out from the first major side through the package lead coupled thereto. By providing the correct geometry and thermal conductive characteristics the lead can also be used as a heat sink or coupled to a heat sink.

A dielectric platform region 20 is formed inside the outer periphery of die 90 and outside of the active area. Among other things, dielectric platform region 20 provides a non-conductive sidewall of dielectric material that extends downward through the epitaxial layer adjacent to the active transistor cells. In an embodiment of the RF power transistor, dielectric platform 20 is formed in a ring around the active area. Among the advantages of the dielectric platform is that it is used as an edge termination to induce planar breakdown in the active area of the transistor thereby increasing the operating voltage of the transistor. In addition, dielectric platform 20 is used to minimize capacitance by utilizing the low dielectric constant of platform 20. In an embodiment of die 90, dielectric platform 20 makes up a substantial portion of the total die area. For example, a dielectric platform could take up more than 30-40% of the total die area of a 100 watt RF power transistor and typically will be greater than 10% of the total die area. Because dielectric platform 20 may constitute a large portion of die 90, it is important that dielectric platform 20 does not induce stress in the die 90 during wafer processing because it can cause the wafer to bow or warp yielding an unusable wafer. Further details will be provided later in this description.

Control electrode interconnection region 57 is spaced a predetermined distance from first electrode interconnection region 58. Typically, control electrode interconnection region 57 does not conduct a substantial current like first electrode interconnection region 58. In an embodiment of this invention, control electrode interconnection region 57 is shaped as a ring that surrounds first electrode interconnection region 58. Control electrode interconnection region 57 overlies dielectric platform region 20. The capacitance normally associated with control electrode interconnection region 57 is greatly reduced by isolating it from the underlying semiconductor material surface of die 90 thereby increasing frequency and linearity performance of the RF power transistor.

FIG. 2 is a cross-section of the radio frequency (RF) power transistor die 90 made in accordance with the teachings of this invention. The point of cross-section is indicated by arrow 110 of FIG. 1. A surface of a p-type substrate 200 is doped forming a heavily doped region or buried layer 10. P-type substrate 200 is shown having a substantial portion etched away in this embodiment. Substrate 200 initially is conventionally provided as a wafer having a uniform thickness. In this embodiment, buried layer 10 is doped N+ and has a low resistance. As shown, buried layer 10 is continuous and covers the entire surface of die 90. An alternate embodiment utilizes a mask to place buried layer 10 only in the active area where the transistor cells of the RF power transistor are formed. For example, buried layer 10 would be masked off from being formed around the periphery of die 90 from approximately dielectric platform region 20 to the edge of die 90.

An epitaxial layer 2 is formed overlying buried layer region 10. In this embodiment, epitaxial layer 2 is n-type and overlies buried layer 10. Dielectric platform region 20 is formed in epitaxial layer 2 and buried layer 10. In this embodiment, dielectric platform region 20 extends through epitaxial layer 2 into (but not through) buried layer 10. The top surface of dielectric platform region 20 is approximately planar to the top surface of epitaxial layer 2. A chemical mechanical planarization step can be used to make the surface of dielectric platform region 20 substantially planar to a surface of epitaxial layer 2. Alternately, the top surface of dielectric platform region 20 can be formed using a sequence of wafer processing steps that allows a planar surface to be formed. As will be described in greater detail herein, the transistor cells are formed in epitaxial layer 2; thus an active area 30 of the device is defined as the area of die 90 corresponding to the portion of epitaxial layer 2 within an inner boundary of the ring shape of dielectric platform region 20. The dielectric platform thus forms a moat or curtain of insulating material that extends downwardly at least through the epitaxial layer 2 and surrounds the active area 30 of die 90. As will be described in detail later herein, the inner sidewall of the dielectric platform 20 adjacent to active area 30 is formed as a thermal oxide layer such that epitaxial layer 2 (corresponding to active area 30) terminates on the thermal oxide and provides edge termination to the transistor. Ideally the sidewall thermal oxide has high integrity with a low level of contaminants therein.

First electrode interconnection region 58 overlies epitaxial layer 2 containing active area 30. Control electrode interconnection region 57 overlies dielectric platform region 20. As mentioned previously, first electrode interconnection region 58 and control electrode interconnection region 57 are coupled to metallic contacts or external leads of a radio frequency package, as will be described herein.

In this embodiment, material is removed from substrate 200 to reduce the thickness of die 90 in the active area 30. A second electrode interconnection region 60 is formed on the second or lower major surface of die 90. The electrical and thermal path from the second external contact of the package to second electrode interconnection region 60 can affect the performance of the device. In this embodiment, an active portion of the transistor cell (here, the drain) is electrically connected to the external package contact through the epitaxial layer 2 and the buried layer 10 that provides a low resistance electrical path to the second electrode interconnection 60 that, in turn, is connected to the external package contact 543 (not shown in FIG. 2 but see, for example FIG. 33). The efficiency of the RF power transistor is related to the on-resistance ($r_{dson}$) of the RF power transistor. The on-resistance ($r_{dson}$), in part, related to the resistive path from epitaxial layer 2 to second electrode interconnection region 60. Similarly, the operating temperature of die 90 and thermally generated non-linearities are functions of the thermal path from epitaxial layer 2 to second electrode interconnection region 60. In general, both the device efficiency and thermal performance can be improved by reducing the thickness of die 90 in particular, in the region of die 90 where the transistor cells of the RF power transistor are formed in the active area 30. Heat originates from active area 30 and it is desirable to have die 90 thinned in this area to reduce the thermal resistance to second electrode interconnection region 60 allowing the thermal energy to be removed through this path. A device having low $r_{dson}$ would be valuable in applications other than radio frequency power amplifiers. For example, low $r_{dson}$ would be highly desirable in a switching application such as a power management device where the efficiency of conversion is directly related to the $r_{dson}$ of the transistor.

In this embodiment, material is removed to reduce the thickness from the second major surface of die 90 by etching. In general, material from p-type substrate 200 is removed underlying active area 30. In particular, a mask is used to pattern the second major surface of die 90 such that an outer peripheral area of the substrate 200 underlying dielectric platform is not etched. The etch step preferentially removes p-type material from the substrate along a plane in a 54.7 degree angle towards the upper major surface of die 90. N+ buried layer 10 acts as an etch stop in the etching process thereby preventing further material from being removed. As shown, the remaining portion of substrate 200 has a trapezoidal shaped cross-section that forms a ring around the periphery of die 90 and is substantially removed from active area 30. A cavity 102 is thus created by the etch step that underlies active area 30. Note that the thickness of die 90 in active area 30 is approximately the thickness of epitaxial layer 2 and buried layer 10. The remaining portion of substrate 200 formed as a "picture frame" acts to stiffen and support die 90. In other words, substrate 200 forms a frame or support structure for thinned active area 30 which allows handling of the wafer similar to a non-thinned wafer. In this embodiment, substrate 200 (composed of a high resistivity p-type material) is not ohmically coupled to a voltage potential and is substantially left floating.

Buried layer 10 provides a low resistance path for current from the active area (drain) of die 90 to second electrode interconnection region 60. Second electrode interconnection region 60 is formed underlying the surface of buried layer 10. In an embodiment of the RF power transistor, second electrode interconnection region 60 can be formed from a metal or metal alloy for low resistance and excellent thermal conductivity. The shape of the lower major surface of die 90 provides another substantial benefit. The external metal contact or lead of the RF package can be designed to fit in cavity 102. The lead is then easily aligned and coupled to second electrode interconnection region 60. For example, the lead can be physically and electrically coupled to second electrode interconnection region 60 by solder or a conductive epoxy. The lead can then be used to handle die 90 in subsequent steps to package the device. Directly coupling the lead to second electrode interconnection region 60 minimizes inductance and provides a large surface area for removing heat through the lower major surface of die 90. Thus, the thermal efficiency is substantially greater than prior art RF power transistors because heat can be removed from both the first (upper) and second (lower) major surfaces simultaneously. Moreover, the increased thermal efficiency is achieved while improving device performance by reducing parasitics that degrade device operation.

There are alternate embodiments that result in a device of reduced thickness although some may lack some of the benefits described hereinabove. For example, a substrate comprising N+ material could be used. Buried layer 10 would not be needed with a N+ substrate. The N+ substrate could be thinned using wafer grinding/thinning techniques well known to one skilled in the art. A second electrode interconnection region would then be formed overlying the thinned N+ substrate. The die would have a uniform thickness in this embodiment.

FIGS. 3-21 are exploded cross-sectional views of a portion of the RF power transistor of FIG. 2 that sequentially illustrate wafer processing steps to form the device in accordance with an embodiment of the present invention. In most cases, different reference numbers are used for the same items as in FIGS. 1-2. FIG. 3 is an enlarged cross-section of an area of the RF power transistor near a periphery of the die 90. Illustrating the die periphery allows the fabrication of the dielectric platform 20, edge termination, and a transistor cell to be shown. However, it should be understood that the RF power transistor device of the preferred embodiment includes a number of these transistor cells coupled in parallel to form an array of mesh-connected transistor cells. Moreover, the values given in this description of the invention are for illustrative purposes. It is well known that the design of RF power transistors vary greatly depending on the specific desired operating characteristics of the device such as power and frequency and that these variations fall under the scope of this description.

The processing steps shown in FIGS. 3-21 are applied to a first major surface of the die (sometimes referred to herein as the upper surface). The second major surface of the die (sometimes referred to as the lower surface) is protected during wafer processing on the first major surface. For example, an oxide layer is formed on the second major surface. A layer of silicon nitride is then formed over the oxide layer. The combination of the oxide layer and the silicon nitride layer will protect the second major surface during wafer processing on the first major surface. Additional protective layers can be added should the protective layers on the second major surface be removed during any of the wafer processing steps. The subsequent etching step to create the cavity in the second major surface of the die and forming the second electrode interconnection region are not shown in FIGS. 3-21 but were previously described in connection with FIG. 2

A starting material for forming the RF power transistor device of the present invention comprises a substrate 200. In an embodiment of the wafer process, substrate 200 is a p-type silicon substrate having a crystal orientation. Buried layer 205 is formed in substrate 200 and typically is a highly doped low resistance layer. In an embodiment of the wafer process, buried layer 205 is doped N+ and is approximately 15 µm thick. Buried layer 205 has a resistivity in a range of 0.001 Ω-cm to 0.02 Ω-cm and is provided to improve ohmic contact to a second electrode interconnection region. Buried layer 205 is exposed by etching away substrate 200 in a subsequent step (not shown) to allow the second electrode interconnection region to be formed thereon.

Epitaxial layer 210 overlies buried layer 205. In an embodiment of the wafer process, epitaxial layer 210 is n-type. Initially, epitaxial layer 210 is approximately 25 µm. Subsequent thermal processes will change the resistivity and the thickness of this region to approximately 20 µm which is selected for determining a breakdown voltage of the RF power transistor. In particular, epitaxial layer 210 has been selected to support 25V/µ, thus allowing a RF power transistor with a 500 V breakdown voltage to be created.

It is highly desirable for power efficiency to operate a RF power transistor at as high a voltage as possible. Prior art silicon RF power transistors operating at approximately 2 GHz are design limited for high voltage operation. For example, the standard for power amplifier operating voltage is 28 volts for a cellular base transceiver station (BTS) power amplifier (PA). A general rule of thumb for RF power transistor breakdown voltage to operating voltage is approximately 3 to 1. In other words the breakdown voltage for state of the art RF power transistors is approximately 75 volts. The 28 volt power amplifier operating voltage yields disappointing power efficiency ratings in the 25% range. A RF power transistor operating at a voltage greater than 28 volts will operate at a lower current to generate the same power output. Operating at lower current in conjunction with a low $r_{dson}$ results in improved device efficiency. Moreover, the lower operating current reduces the thermal requirements on the device which increases reliability. The output impedance of the transistor also increases with operating voltage. Higher output impedance allows a more efficient matching network to be designed for the power amplifier. Thus, a RF power transistor with a higher voltage breakdown has a substantial advantage. For example, the RF power transistor of this invention having a 500 V breakdown voltage can operate at supply voltages greater than 150 V which will significantly increase the power efficiency. Similarly, a RF power transistor manufactured as disclosed herein with a 150V breakdown voltage that is operated at 50 V would have a substantial advantage over the existing 28 V transistors.

A dielectric layer 215 overlies epitaxial layer 210. In an embodiment of the wafer process, dielectric layer 215 comprises $SiO_2$. The layer of $SiO_2$ is thermally grown overlying epitaxial layer 210 having a thickness of approximately 5000 Å. A masking layer 220 is formed overlying dielectric layer 215. Masking layer 220 is patterned exposing portions of dielectric layer 215. The exposed portions of dielectric layer 215 are removed revealing the underlying epitaxial layer 210. Masking layer 220 is then removed. An etching process is then performed to form a matrix of hexagonal vertical hollow wells or cavities 225 in a ring surrounding the active area in the manner illustrated at 57 in FIG. 1. In particular, an anisotropic etching process is used to etch substantially vertically through at least the epitaxial layer 210 and, preferably, at least part way into buried layer 205. In this embodiment, vertical cavities 225 are approximately 2.0 μm wide and spaced 0.4 μm apart from one another and define a matrix of vertically extending structures or walls. Using the anisotropic etching process, vertical cavities 225 are etched through epitaxial layer 210 and into buried layer 205 to a depth of approximately 30 μm deep. The etching of vertical cavities 225 creates silicon matrix walls 230 between the cavities 225. The innermost wall 230a spans outer portions of epitaxial layer 210 and buried layer 205 in the active area. Silicon matrix walls 230 are approximately 0.4 μm wide. Dielectric layer 215 is affected by the above wafer process steps such that dielectric layer 215 is reduced in thickness from the $SiO_2$ layer of 5000 Å to approximately 3000 Å.

Figure 4:
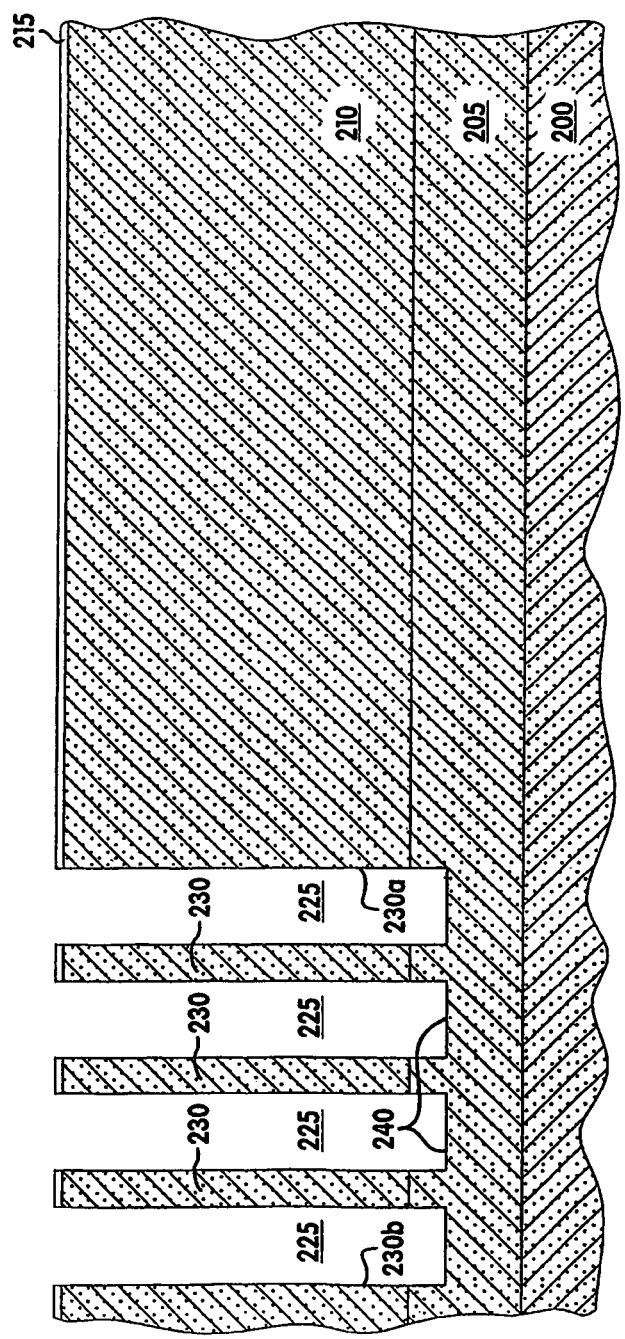

Referring to FIG. 4, an optional process step is illustrated that removes material from silicon matrix walls 230. A silicon etch is performed that etches exposed portions of silicon matrix walls 230, epitaxial layer 210, and buried layer 205. In an embodiment of the wafer process, the silicon etch thins silicon matrix walls 230 to a width or thickness of approximately 0.2 μm.

Figure 5:
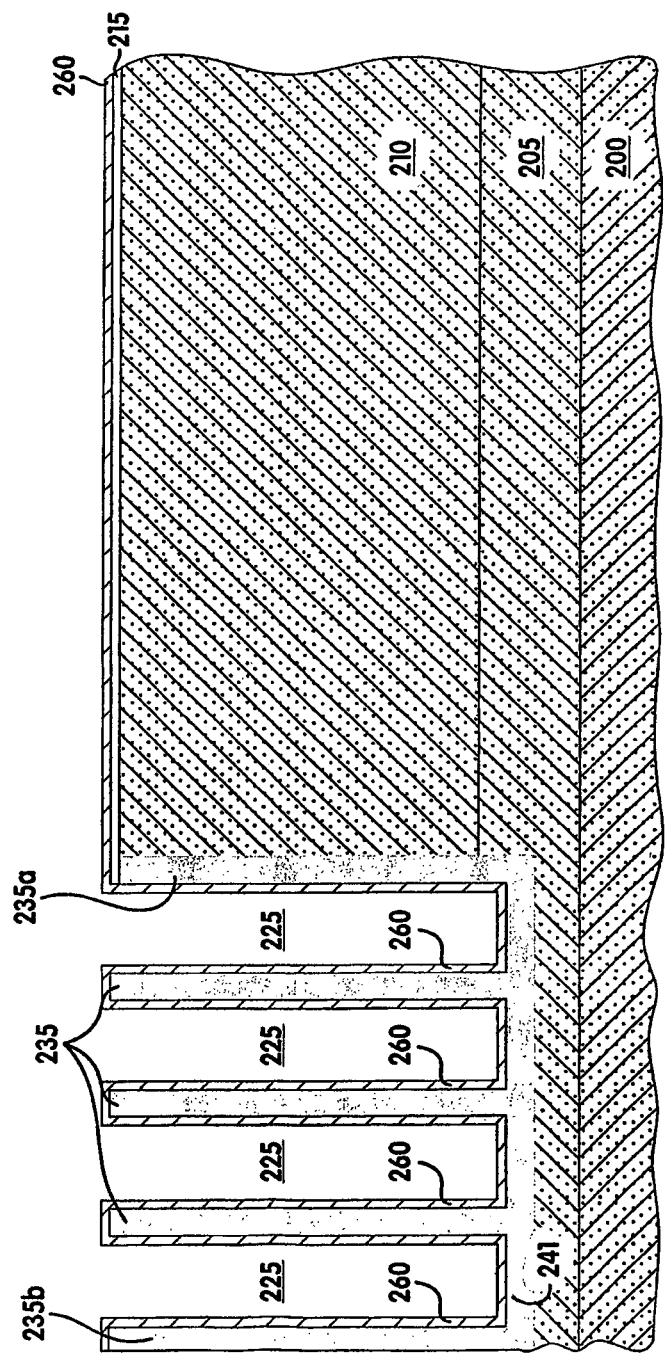

Referring to FIG. 5, a thermal oxidation process is performed that forms silicon dioxide on any exposed silicon area. In particular, the silicon of silicon matrix walls 230 of FIG. 4 are substantially completely converted to silicon dioxide forming silicon dioxide matrix walls 235 in the form of a matrix of vertically extending dielectric structures. The exposed silicon surface of the innermost wall (230a in FIG. 4), the bottom of cavities 225 (240 in FIG. 4) and the outermost wall (230b in FIG. 4) are likewise converted to thermal oxide layers 235a, 241 and 235b as shown in FIG. 5. The thermal oxide layer 235a adjacent to the active area where the transistor cells are formed is an edge termination to induce planar breakdown in the RF power transistor. Depending on the application, it may be desirable to deposit further dielectric material to increase the thickness of the dielectric material to enhance a voltage that can be withstood before breakdown occurs. A further consideration is the time required to form the dielectric layer and stress applied to the structure. For example, an additional deposition of a polysilicon layer is performed. Then, a thermal oxidation step oxidizes the polysilicon layer forming dielectric layer 260 that increases the amount of dielectric material on silicon dioxide matrix walls 235, 235a, 235b and 241.

Figure 6:
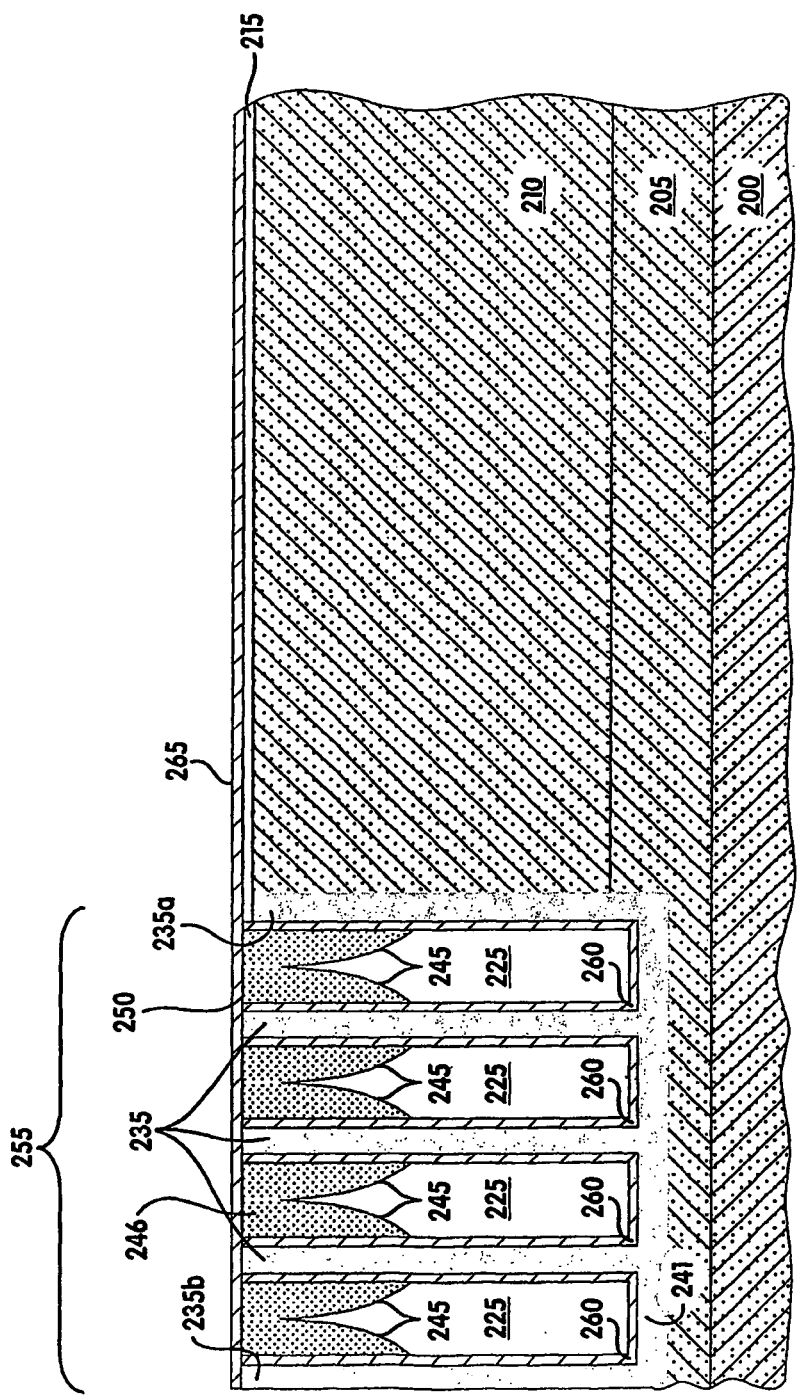

Referring to FIG. 6, a dielectric material is applied to the die. In an embodiment of the wafer process, a low-pressure deposition of TEOS (tetra-ethyl-ortho-silicate) 245 is applied to the first major surface. Some of the deposited material builds up in each opening of vertical cavities 225 gradually reducing the size of the opening until the opening is closed forming a dielectric plug or layer 246. The remaining lower portions of cavities 225 are not filled in this embodiment. In an alternate embodiment, the lower portions of the cavities could be filled with a dielectric material if so desired. Note that a continuous layer of dielectric material is formed in each cavity 225 by way of dielectric layer 245, dielectric matrix walls 235, and dielectric layer 260. This layer of dielectric material is denoted as dielectric platform 255. In an embodiment of the wafer process, approximately 11,000 Å of TEOS is deposited such that an upper region of vertical cavities 225 are sealed. A thermal oxidation process follows that densifies the TEOS that is part of dielectric platform 255.

In one embodiment, an oxide CMP (chemical mechanical planarization) step is then performed to planarize the oxide on the first major surface after the dielectric material deposition. The CMP step removes from the first major surface portions of TEOS layer 245 and dielectric layer 260 and creates a planar surface 250 on the first major surface of the die. It should be noted that although vertical cavities 225 are sealed at the upper surface by dielectric layer 245, vertical cavities 225 are not filled with solid material and comprise a substantial amount of empty space. A protective layer 265 is then applied overlying the oxide on the first major surface. In an embodiment of the wafer process, a layer of silicon nitride approximately 500 Å thick overlies planar surface 250. As mentioned previously, an alternate process flow that does not require an oxide CMP step could be developed should CMP not be available. The surface should be sufficiently planar to prevent step coverage problems with subsequent wafer processing steps.

In general, dielectric platform 255 is formed greater than 10 microns wide and 4 microns deep. The control electrode interconnection region 57 (FIGS. 1-2) is formed overlying dielectric platform 255 and is formed greater than 10 microns wide to ensure low resistance. In an embodiment of the RF power transistor, dielectric platform 255 is formed to, a depth greater than 4 microns to standoff a voltage required of device operation and to reduce gate to drain capacitance from the control electrode interconnection region. Moreover, dielectric platform 255 can be formed at these dimensions or greater without significant stress being added to the die. Also, it should be understood that various different manufacturing processes can be employed to form the dielectric platform. For example, the cavities can be filled forming a solid dielectric platform.

For high voltage applications, dielectric layer 245 by itself may not be sufficient to stand off the desired voltage. As mentioned previously, an optional dielectric layer 260 was added to the bottom and sidewalls that define vertical cavities 225. In an embodiment of the wafer process for forming a 500V breakdown RF power transistor, prior to forming dielectric layer 245, polysilicon is deposited into vertical cavities 225 forming a polysilicon layer on the bottom and sidewalls. For example, 1000 Å of polysilicon is deposited into vertical cavities 225. The polysilicon is then oxidized to form a 2200 Å oxide layer in vertical cavities 225. A second, 1000 Å of polysilicon is then deposited and oxidized to form a second 2200 Å oxide layer in vertical cavities 225. The combination forms a 4400 Å oxide layer in vertical cavities 225 that is denoted as dielectric layer 260. Dielectric layer 260 is formed in more than one step to reduce the oxidation time. Other techniques known to one skilled in the art can also be applied that increase the amount of dielectric material. The openings to vertical cavities 225 cannot be made so large that they cannot be closed by a process step such as the low pressure TEOS deposition.

In general, the dielectric platform is a non-conductive structure having a low dielectric constant that provides edge termination for the vertical RF power transistor to improve breakdown voltage. The dielectric platform must be capable of standing off the breakdown voltage of the transistor. For example, the total oxide thickness on the bottom 241 of cavities 225 of dielectric platform 255 (or the sidewall 235a adjacent to the active area of the RF power transistor) in combination with dielectric layer 245 is designed to withstand 500 volts. From a structural perspective, the oxide formed on the bottom 241 of cavities 225 and the sidewall 235a adjacent to the active area should not be formed to a thickness where stress is induced into substrate 200 that produces warpage in the wafer. Thus, the dielectric platform is designed to withstand the breakdown voltage of the RF power transistor while minimizing stress imparted to the wafer when the dielectric platform comprises a substantial portion of the die area.

Edge termination comprises a sidewall formed of a dielectric material adjacent to the active area of the transistor which aids in achieving planar breakdown within the structure. In an embodiment of the transistor, the active area is bounded by dielectric platform 255 such that the drain region (epitaxial layer 210) of the transistor terminates in a thermal oxide sidewall of dielectric platform 255. Ideally, the sidewalls of a dielectric platform are formed to terminate electric fields in the drain region of a RF power transistor at a 90 degree angle to minimize field curvature. Thus, an equipotential electric field line in the drain of the transistor would be approximately horizontal in epitaxial layer 210. Electric field lines of different potential would be in different horizontal planes but parallel to one another within epitaxial layer 210. Care should be taken in forming the thermal oxide sidewall to prevent trapped charge that could add curvature to the electric field and lower transistor breakdown voltage.

The dielectric platform 255 is also a support structure that requires sufficient structural strength to allow the formation of interconnect, passive components, or active devices overlying the platform. In general, vertical support structures are formed that support a top surface layer. The vertical support structures and top surface layer comprise a dielectric material. In one embodiment, empty compartments underlying the top surface layer are formed between the vertical support structures to form air gaps that lower the dielectric constant of the dielectric platform. Conversely, a solid or filled dielectric platform could be formed which would have a higher dielectric constant if desired. In the embodiment shown, dielectric platform 255 is an array of hexagonal cells having vertical walls formed of silicon dioxide when viewed looking down on the top surface. The center region of each hexagonal cell is an empty void or space. A cap or top surface layer is formed to seal each hexagonal cell. The diameter of a cell in dielectric platform 255 is determined by the capping process. The diameter of the cell is selected to allow the build up of deposited dielectric material near the opening near the top surface which closes off and seals the cell without filling the cell up (with the deposited dielectric material such as TEOS). Similar spacing constraints would apply to other air gap dielectric platforms requiring a capping process.

The dielectric platform 255 also reduces parasitic capacitances of a RF power transistor thereby extending the frequency response of the device. The dielectric platform separates conductive regions from one another thus a low dielectric constant is preferred to minimize the capacitance. The lowest dielectric constant for a dielectric platform is achieved by maximizing the volume of empty space in the platform between conductive regions which form the parasitic capacitance. In particular, the number of cells in dielectric platform 255 or the area of the die that dielectric platform 255 comprises is related to reducing the gate to drain and drain to source capacitance which will be described in more detail herein below.

Figure 7:
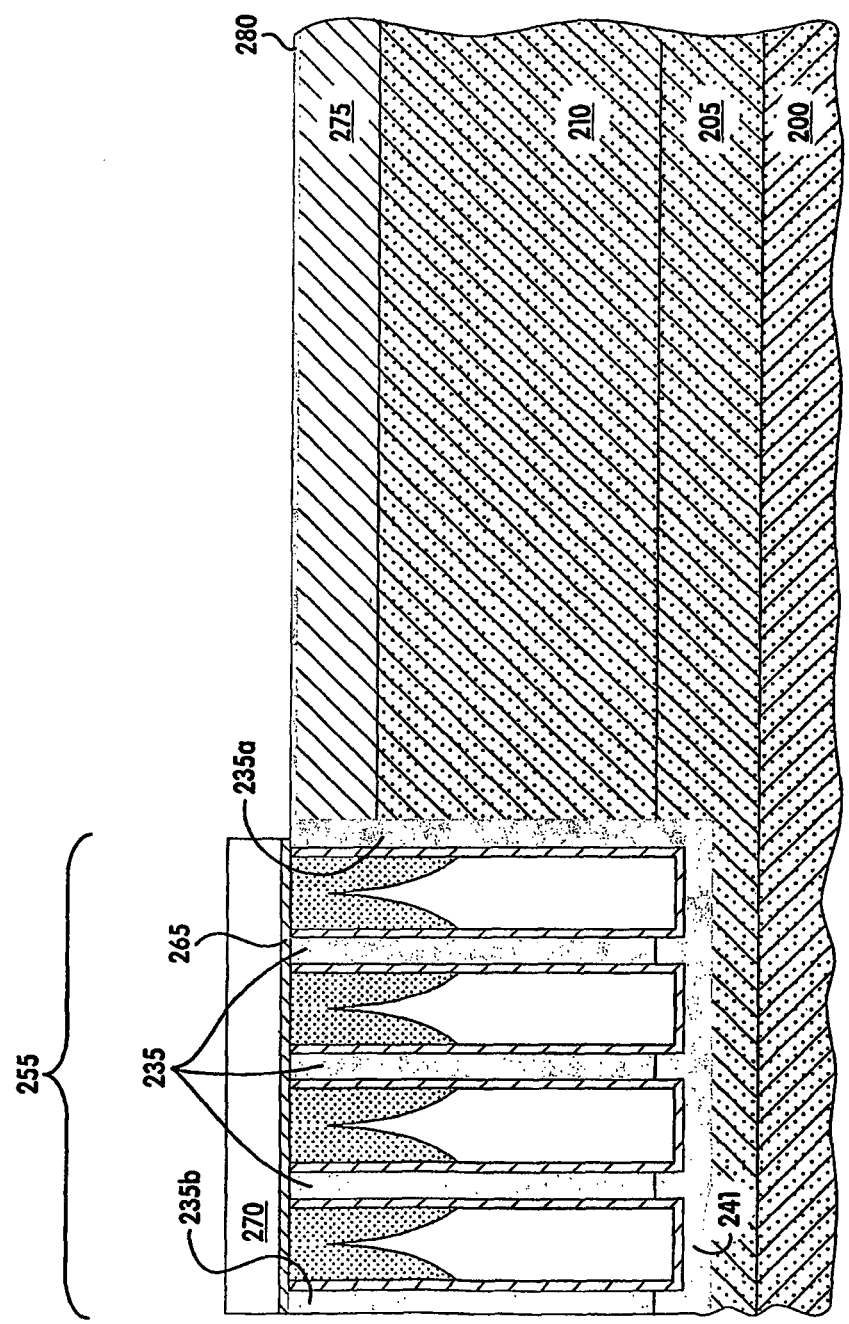

Referring to FIG. 7, a mask layer 270 is applied and patterned on the first major surface. Mask layer 270 overlies dielectric platform 255. Exposed portions of protective layer 265 are removed revealing the underlying oxide layer 215. In an embodiment of the wafer process, oxide layer 215 of FIG. 6 is reduced in thickness to approximately 100 Å. An optional layer 275 is formed that is more heavily doped than epitaxial layer 210 to reduce the $R_{DSon}$ of the RF power transistor. In an embodiment of the process, layer 275 is doped with an arsenic or phosphorous ion implantation process. Oxide layer 215 is removed and a new oxide layer 280 is formed overlying layer 275. In an embodiment of the wafer process, oxide layer is thermally grown to a thickness in a range of 200 Å to 1000 Å and preferably 700 Å.

Figure 8:
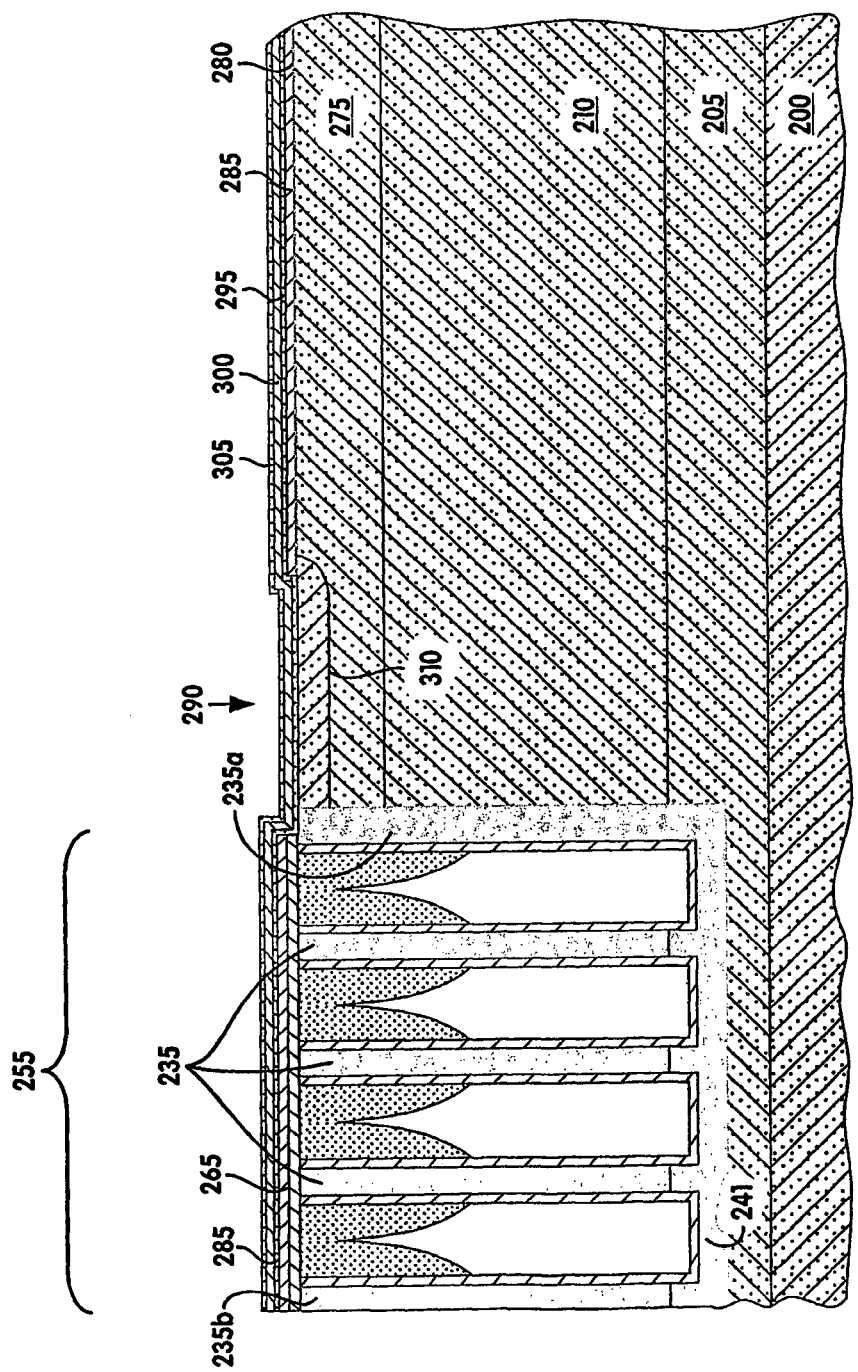

Referring to FIG. 8, a protective layer 285 is formed overlying the first major surface. In an embodiment of the wafer process, protective layer 285 is a silicon nitride layer ($Si_3N_4$). The silicon nitride layer is formed having a thickness of approximately 500 Å. Protective layers 265 and 285 in the exemplary embodiment are both silicon nitride layers having a combined thickness of approximately 1000 Å overlying dielectric platform 255.

A masking layer (not shown) is provided and patterned overlying the first major surface. The pattern exposes an opening 290 that is inboard and adjacent to dielectric platform 255. In opening 290, protective layer 285 is removed revealing underlying dielectric layer 280. Dielectric layer 280 is then removed in opening 290 exposing layer 275. A polysilicon layer 295 is then deposited overlying the first major surface. Polysilicon layer 295 couples to exposed layer 275 in opening 290. In an embodiment of the wafer process, polysilicon layer 295 is formed having a thickness of approximately 250 Å.

A layer 300 is then formed overlying the first major surface. Layer 300 is a conductive material. In an embodiment of the wafer process, layer 300 is a tungsten silicide layer ($WSi_{2.8}$). The tungsten silicide layer is formed having a thickness of approximately 500 Å. A polysilicon layer 305 is then formed overlying the first major surface. In an embodiment of the wafer process, polysilicon layer 305 is formed having a thickness of approximately 250 Å. A pre-implant silicon dioxide layer approximately 100 Å thick is then formed. A p-type region 310 is formed by a blanket implantation process which dopes through opening 290. Protective layer 285 prevents doping in other areas of the top surface. The blanket implantation process also dopes polysilicon layers 295 and 305, and tungsten silicide layer 300. In an embodiment of the wafer process, the dopant is boron and it is implanted at approximately 5 KeV. Tungsten silicide ($WSi_{2.8}$) is used to form layer 300 for film stability consideration. The tungsten silicide layer 300 and doped polysilicon layers 295 and 305 serve as a grounded shielding plate that significantly reduces gate to drain capacitance of the RF power transistor. Reduction of the gate to drain capacitance greatly extends the operating frequency of the device. Although multiple conductive layers are disclosed that couple in common to form a composite low resistance grounded shielding plate layer it should be understood that a single conductive layer could also be used if desired. The composite low resistance grounded shielded plate layer is coupled to ground through p-type doped region 310 which is described in more detail herein below.

Figure 9:
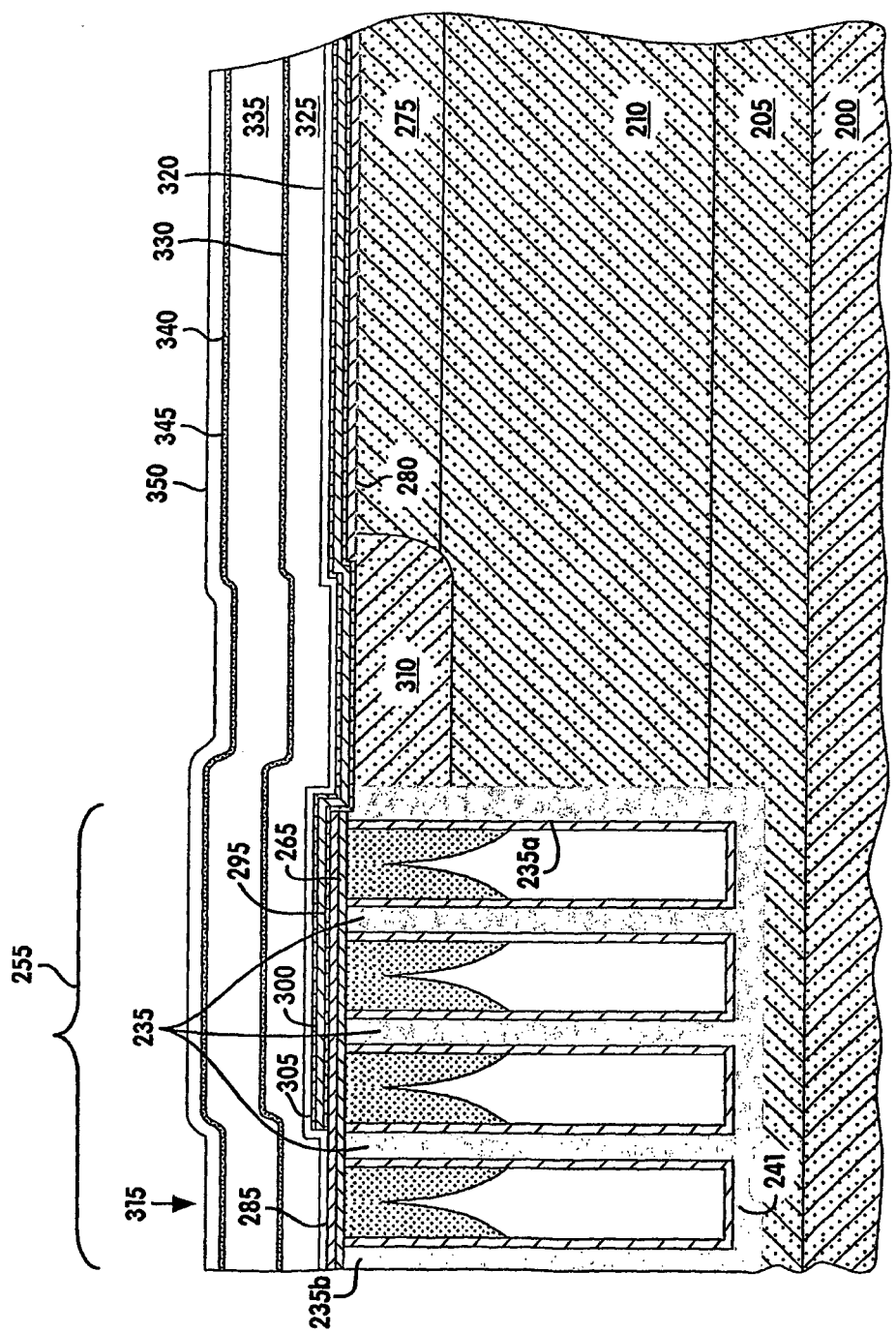
Figure 10:
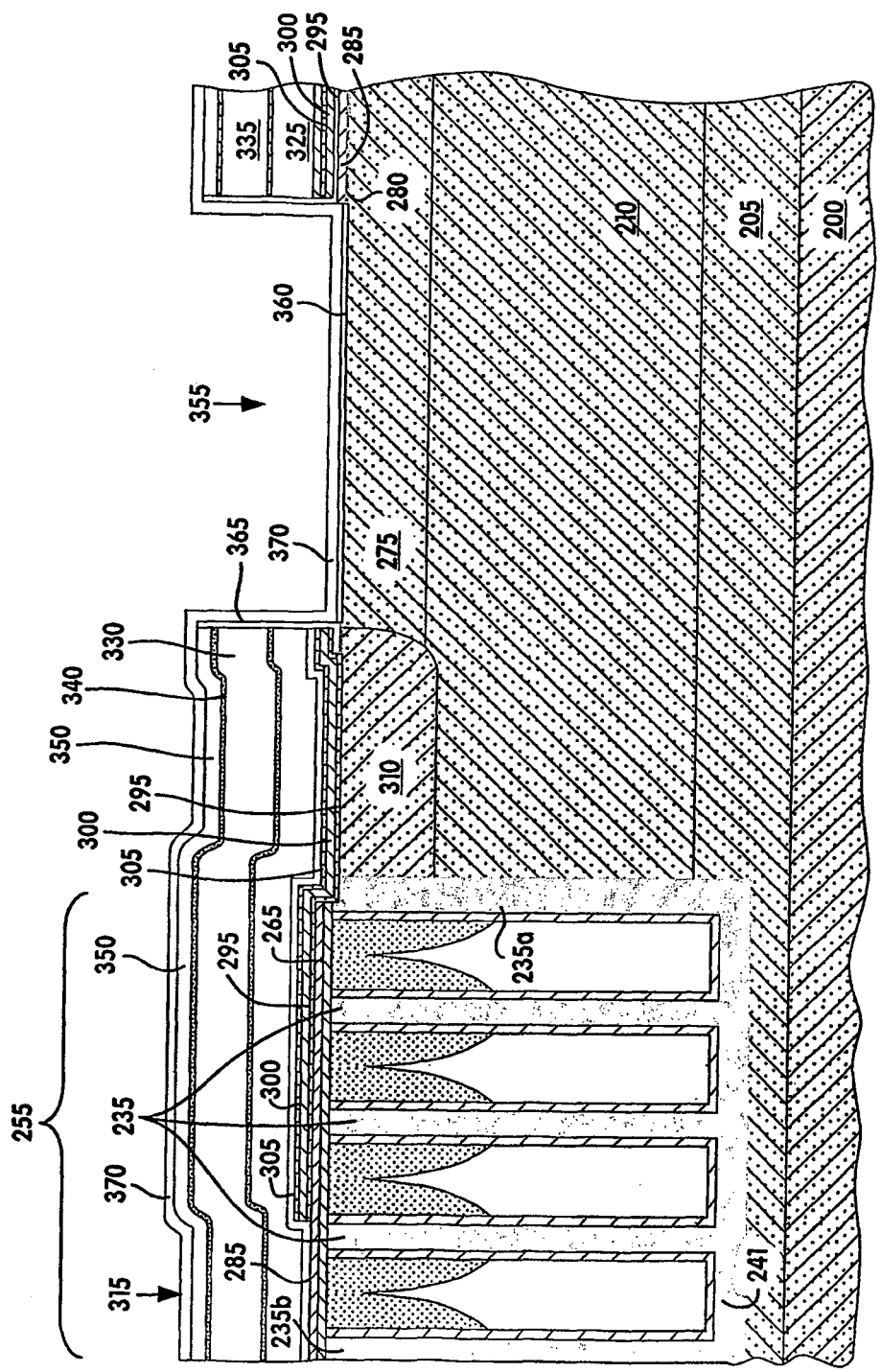

Referring to FIG. 9, a masking layer (not shown) is formed and patterned over the first major surface. The patterned masking layer has an opening 315 over dielectric platform 255. Polysilicon layer 305, tungsten silicide layer 300, and polysilicon layer 295 are removed in opening 315 revealing protective layer 285. The remaining masking layer is then removed and a protective layer 320 is formed overlying the first major surface. In an embodiment of the wafer process, protective layer 320 comprises silicon nitride ($Si_3N_4$). The silicon nitride is formed approximately 500 Å thick over the first major surface.

A dielectric layer 325 is then formed over the first major surface. In an embodiment of the wafer process, dielectric layer 325 comprises TEOS (tetra-ethyl-ortho-silicate). The TEOS dielectric layer is approximately 4000 Å thick. Although more than one non-conductive layer (layers 320, 325) is disclosed hereinabove that form an isolation region between conductive layers of the transistor it should be understood that a single non-conductive layer could also be used if desired.

A polysilicon layer 330 is then formed overlying the first major surface. In an embodiment of the wafer process, polysilicon layer 330 is n-doped polysilicon. The n-doped polysilicon layer is approximately 500 Å thick. A layer 335 is then formed overlying the first major surface. In an embodiment of the wafer process, layer 335 is a conductive layer comprising tungsten silicide ($WSi_{2.8}$). The tungsten silicide layer is formed approximately 3000 Å thick. The layer 335 is provided to reduce gate resistance and could alternatively be constructed of doped polysilicon or tungsten. Some of the steps provided hereinabove are thermal steps that drive in edge termination region 310 such that it is diffused into epitaxial layer 210 extending below layer 275. A polysilicon layer 340 is then formed overlying the first major surface. In an embodiment of the wafer process, polysilicon layer 340 is n-doped polysilicon. The n-doped polysilicon layer is formed approximately 500 Å thick. Although multiple conductive layers (layers 330, 335, and 340) are disclosed that couple in common to form a composite low resistance layer it should be understood that a single conductive layer could also be used if desired.

A thermal oxidation process is then performed that oxidizes an upper portion of polysilicon layer 340. In an embodiment of the wafer process, a dielectric layer 345 is formed in the thermal oxidation process. The thermal oxidation process forms an oxide layer approximately 150 Å thick from polysilicon layer 340. A protective layer 350 is then formed overlying the first major surface. In an embodiment of the wafer process, protective layer 350 comprises silicon nitride ($Si_3N_4$). The silicon nitride is formed approximately 1500 Å thick. Although more than one non-conductive layer (layers 345, 350) is disclosed hereinabove it should be understood that a single non-conductive layer could also be used if desired Referring to FIG. 10, a masking layer (not shown) is formed and patterned overlying the first major surface. The pattern in the masking layer includes an opening 355 exposing protective layer 350. The opening 355 corresponds to an area of the die where a single transistor cell of the RF power transistor is formed. Although not shown in this figure, it should be noted that the RF power transistor will comprise a plurality of transistor cells formed within the active area of the die. The following layers are removed in opening 355: protective layer 350, dielectric layer 345, polysilicon layer 340, tungsten silicide layer 335, polysilicon layer 330, dielectric layer 325, protective layer 320, polysilicon layer 305, tungsten silicide layer 300, and polysilicon layer 295, thus stopping on protective layer 265. The masking layer is then removed.

A protective layer is then formed overlying the first major surface. In an embodiment of the wafer process, the protective layer comprises silicon nitride. The silicon nitride layer is formed approximately 500 Å such that it overlies protective layers 350 and 265 (both silicon nitride in the exemplary embodiment). In particular, the protective layer is conformal and forms on the sidewalls of opening 355. The protective layer on the sidewalls is indicated as protective layer 365.

In an embodiment of the wafer process, an anisotropic etch is used to remove some of the upper portion of protective layers 350 and 265. In particular, material is removed from the upper portion of protective layers 350 leaving protective layer 365 on the sidewalls of opening 355. Because protective layer 350 is substantially thicker than protective layer 265, a portion of protective layer 350 remains following the etch process while protective layer 265 in opening 355 is removed. Removing protective layer 265 in opening 355 exposes an underlying dielectric layer. This dielectric layer is then removed revealing layer 275. A gate oxide layer 360 is thermally grown to a thickness of 25 Å to 150 Å. A thicker gate oxide could be used if a higher gate to source breakdown voltage was desired. In particular, gate oxide layer 360 is formed approximately 100 Å thick. A polysilicon layer 370 is then formed overlying the first major surface. In an embodiment of the wafer process, polysilicon layer is undoped polysilicon. The undoped polysilicon layer is formed approximately 1000 Å thick.

Figure 11:
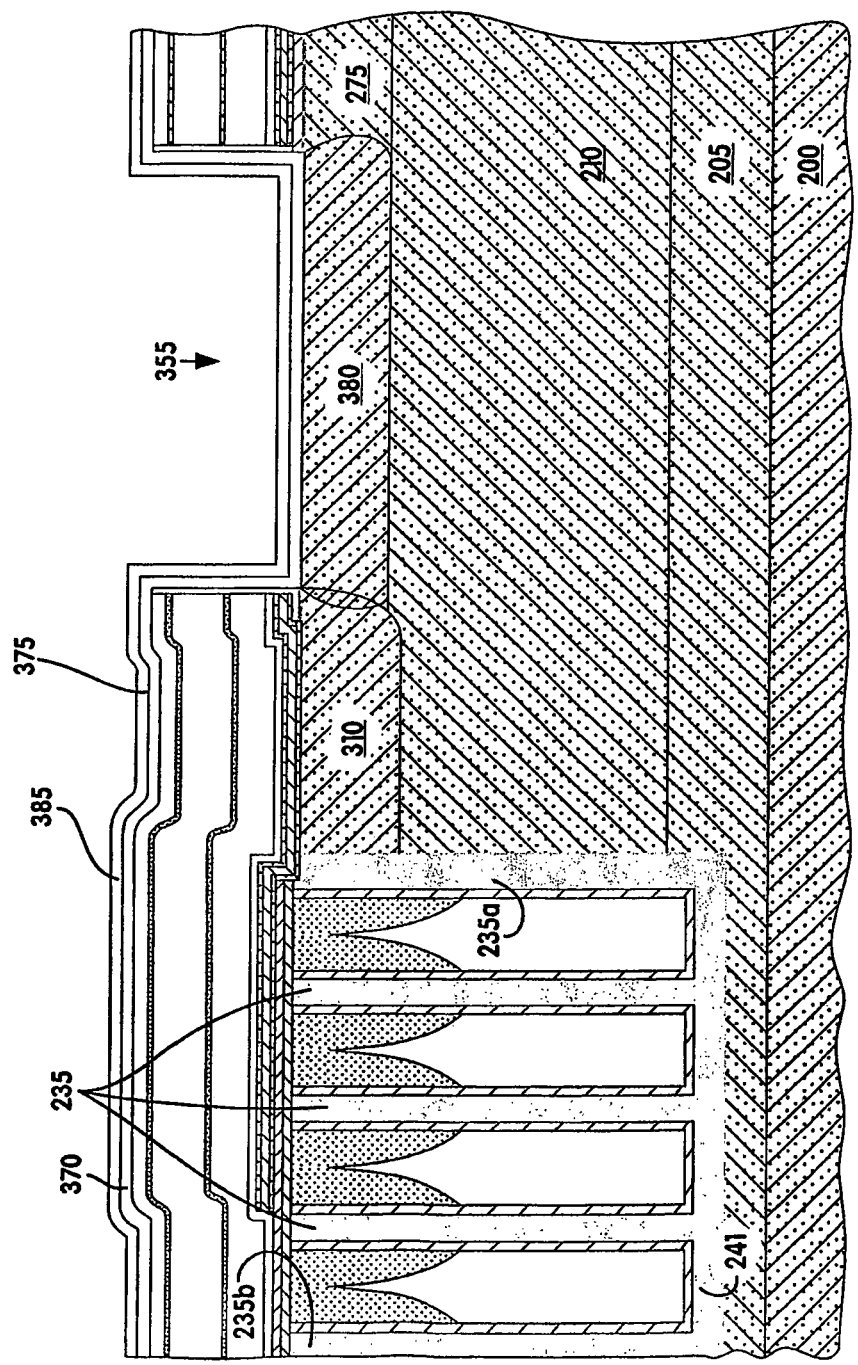

Referring to FIG. 11 a thermal oxidation process is performed that oxidizes a portion of polysilicon layer 370. The oxidation process forms a dielectric layer 375. In an embodiment of the wafer process, dielectric layer 375 is formed approximately 150 Å thick. An implant step is then performed. In an embodiment of the wafer process, boron is implanted in quadrature at three different energies. In particular, some of the p-dopant is provided into layer 275 through opening 355 at different depths corresponding to the different energy used in the implant. Using more than one implant and implant energy allows control of the doping profile. For example, the implants control the threshold voltage of the device or when device punch through occurs. Thus, a p-doped region 380 is formed. Doped region 380 is formed having approximately the same depth as layer 275 and couples to p-doped region 310. A protective layer 385 is then formed overlying the first major surface. In an embodiment of the wafer process, protective layer 385 comprises silicon nitride ($Si_3N_4$). The silicon nitride layer is formed approximately 250 Å thick.

Figure 12:
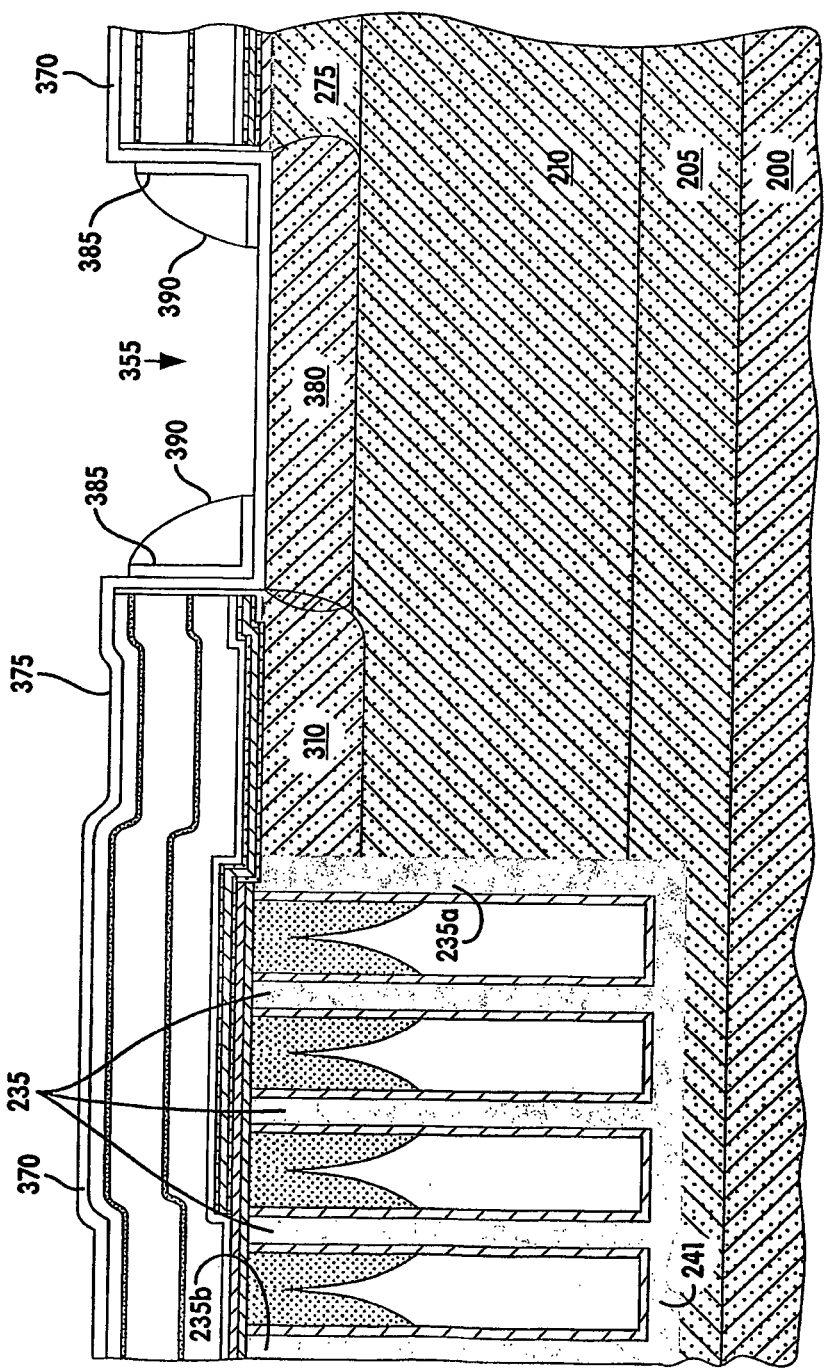

Referring to FIG. 12 a dielectric layer is formed overlying the first major surface. In an embodiment of the wafer process, the dielectric layer comprises TEOS. The TEOS layer is formed approximately 3500 Å thick. The dielectric layer is then anisotropically etched revealing portions of protective layer 385. The anisotropic etch leaves a dielectric region 390 on the sidewalls in opening 355. Dielectric region 390 acts as a mask for protective layer 385 on the sidewall and a portion of the floor of opening 355. Exposed portions of protective layer 385 are then removed revealing underlying dielectric layer 375. A sidewall spacer is thus formed comprising protective layer 385 and dielectric region 390.

Figure 13:
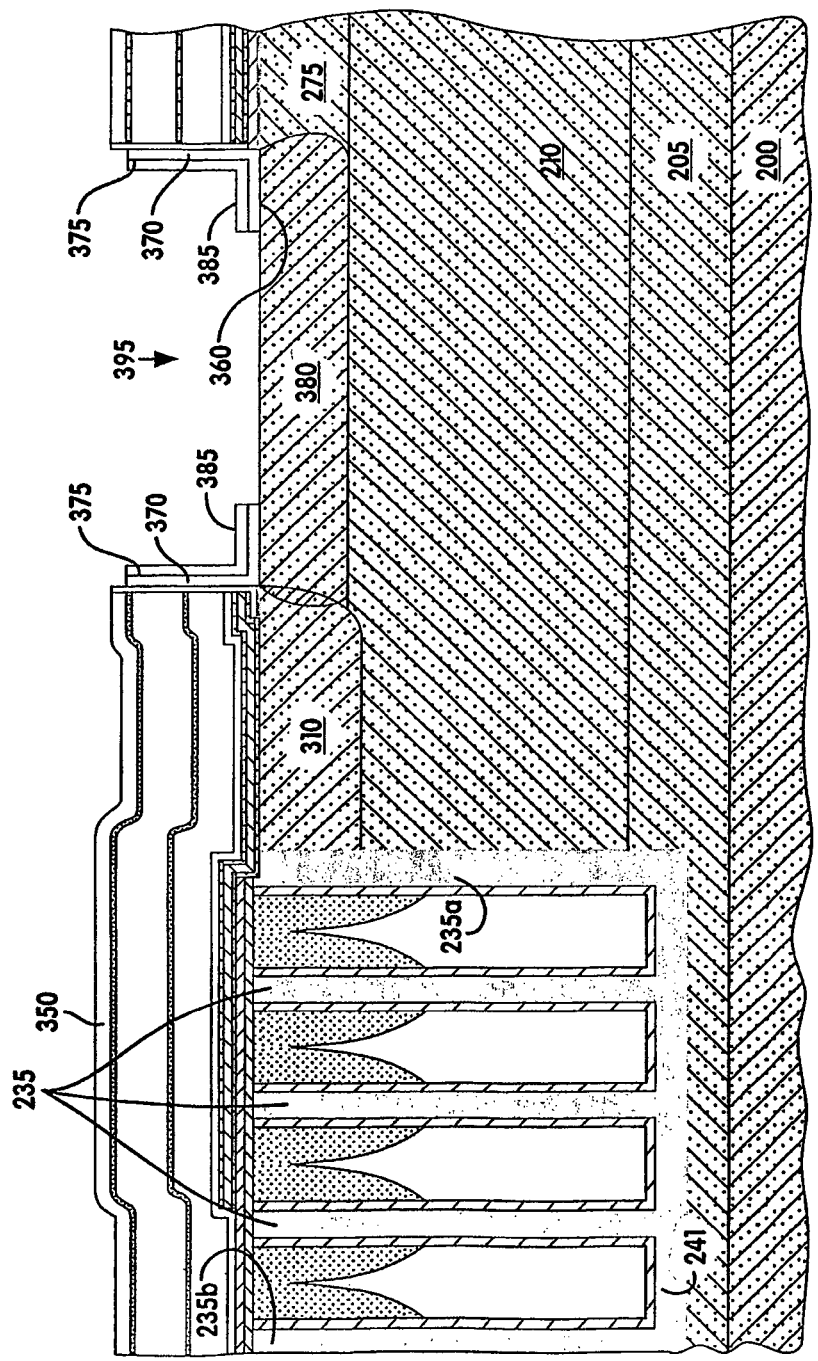

Referring to FIG. 13, exposed portions of dielectric layer 375 are removed revealing underlying polysilicon layer 370. Dielectric region 390 is also removed in this wafer process step. Dielectric layer 375 underlying protective layer 385 remains. Exposed portions of polysilicon layer 370 are then removed revealing protective layer 350. An opening 395 is formed by removing polysilicon layer 370 revealing underlying gate oxide layer 360. Gate oxide layer 360 in opening 395 is then removed revealing doped region 380. A sidewall spacer remains comprising polysilicon layer 370, dielectric layer 375, and protective layer 385.

Figure 14:
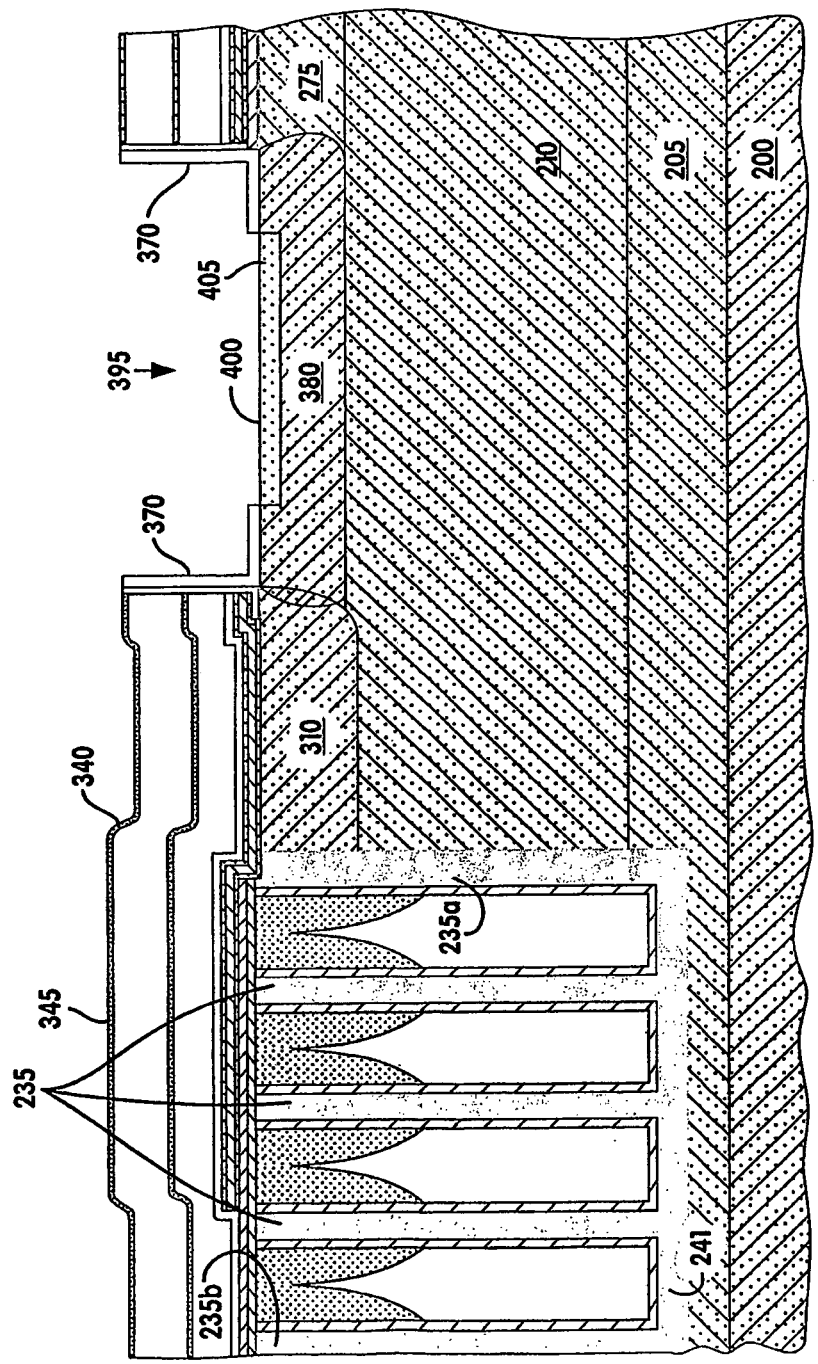

Referring to FIG. 14, protective layers 350 and 385 are removed. Removing protective layer 350 reveals underlying dielectric layer 345. Removing protective layer 385 reveals underlying dielectric layer 375. Dielectric layer 375 is then removed revealing underlying polysilicon layer 370. A dielectric layer 400 is formed in opening 395 on doped region 380. In an embodiment of the wafer process, dielectric layer 400 is a thin pre-implant thermal oxide. An implant step is then performed forming a doped region 405. In an embodiment of the wafer process, the dopant is arsenic (n-type). In particular, the implant dopes polysilicon layer 370 and is implanted through opening 395 into doped region 380 to form doped region 405 which relates to a source of the transistor cell. In an embodiment of the device to ensure adequate coverage, the ion implantation is performed at an angle of approximately 45°, in quadrature, such that the polysilicon layer 370 is converted to N type during the wafer process step.

Figure 15:
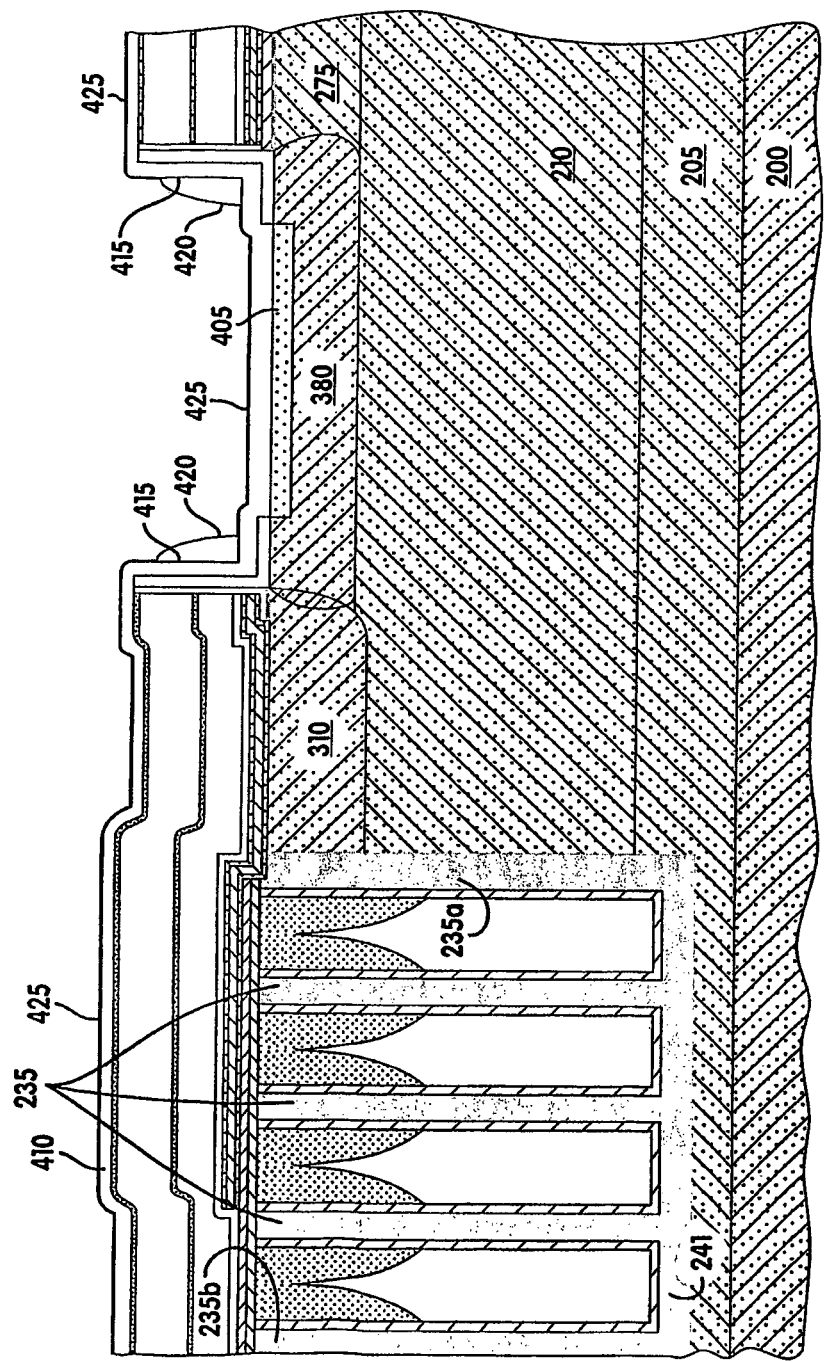

Referring to FIG. 15, dielectric layer 400 is removed from the first major surface. A polysilicon layer 410 is then formed overlying the first major surface. In an embodiment of the wafer process, the polysilicon is undoped polysilicon. The undoped polysilicon is formed approximately 1500 Å thick. A thermal oxidation step is then performed that forms a dielectric layer 415 by oxidizing a portion of polysilicon layer 410. In an embodiment of the wafer process, the thermal oxidation step forms dielectric layer 415 approximately 50 Å thick.

A protective layer is then formed overlying the first major surface. In an embodiment of the wafer process, the protective layer comprises silicon nitride ($Si_3N_4$). The silicon nitride layer is formed approximately 1500 Å thick. An anisotropic etch is performed on the protective layer leaving a sidewall spacer 420. A thermal oxidation process is then performed that oxidizes exposed portions of polysilicon layer 410. A dielectric layer 425 is formed by the thermal oxidation process. In an embodiment of the wafer process, dielectric layer 425 is formed approximately 300-400 Å thick. The thermal process converts polysilicon layer 410 from undoped polysilicon to n-type polysilicon. Although not shown, the thermal process also forms a thin layer (approximately 20 Å of oxide) on sidewall spacer 420.

Figure 16:
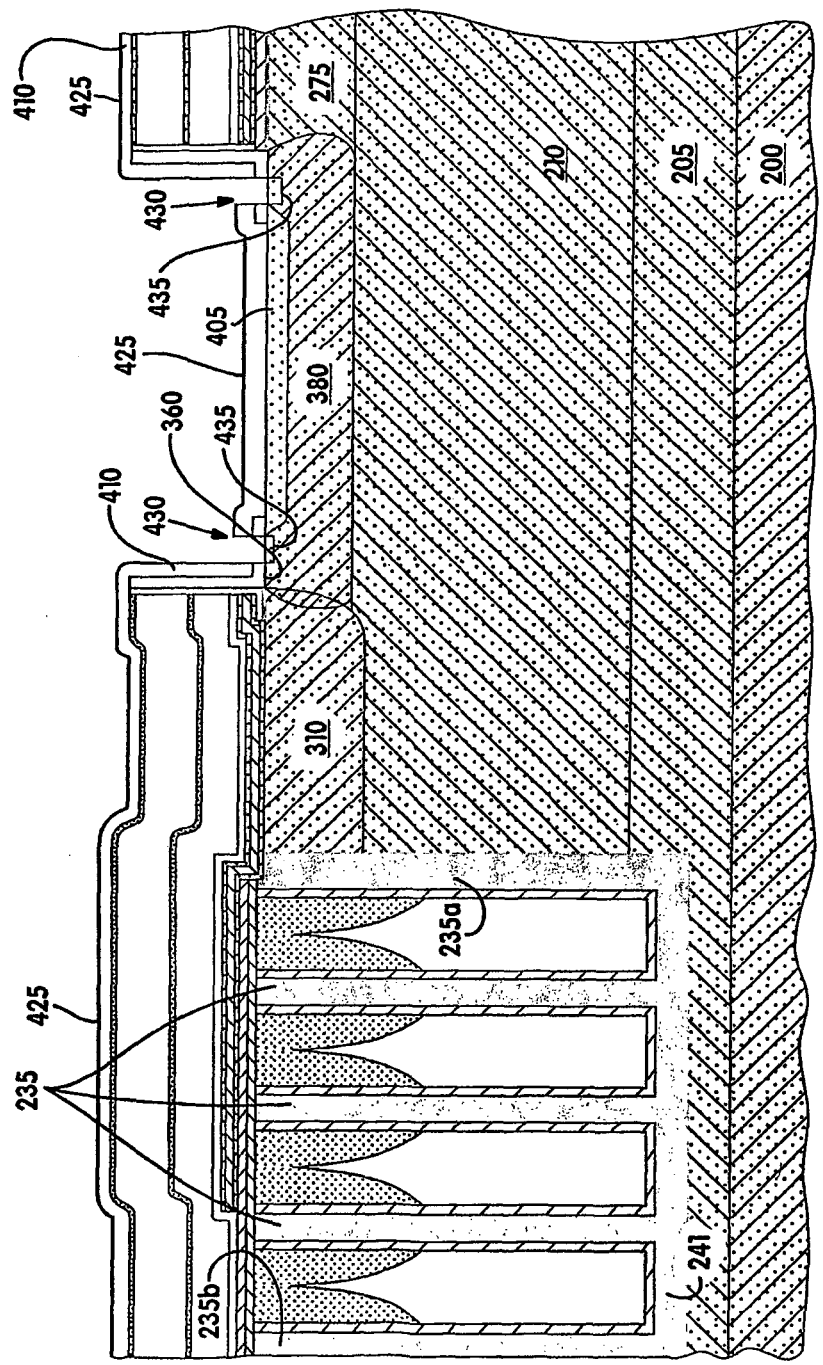

Referring to FIG. 16, sidewall spacer 420 of FIG. 15 is removed revealing underlying dielectric layer 415 of FIG. 15. The exposed portion of dielectric layer 415 is then removed. Dielectric layer 415 is thinner than dielectric layer 425 and thus can be removed while still leaving some of dielectric layer 425 intact. An anisotropic etch is then performed on an exposed portion of polysilicon layer 410. Anisotropically etching the exposed portion of polysilicon layer 410 forms opening 430 and reveals underlying gate oxide layer 360.

A thin pre-implant oxide layer is formed in opening 430. An implant step is performed to provide dopant through opening 430 into doped region 380. The implant forms a doped region 435. In an embodiment of the wafer process, an n-type dopant is used such as arsenic or phosphorus. The n-type dopant ion implantation is performed at 7° in quadrature having a concentration in the range of 1E14-1E16 to ensure good coverage. In an embodiment of the transistor a doping concentration of 5E14 is used in n-type doped region 435. Doped region 435 defines the edge of the source region that is adjacent to the channel region of the transistor cell. The thermal processes performed hereinabove causes doped region 405 to further diffuse, both vertically and horizontally, into doped region 380.

Figure 17:
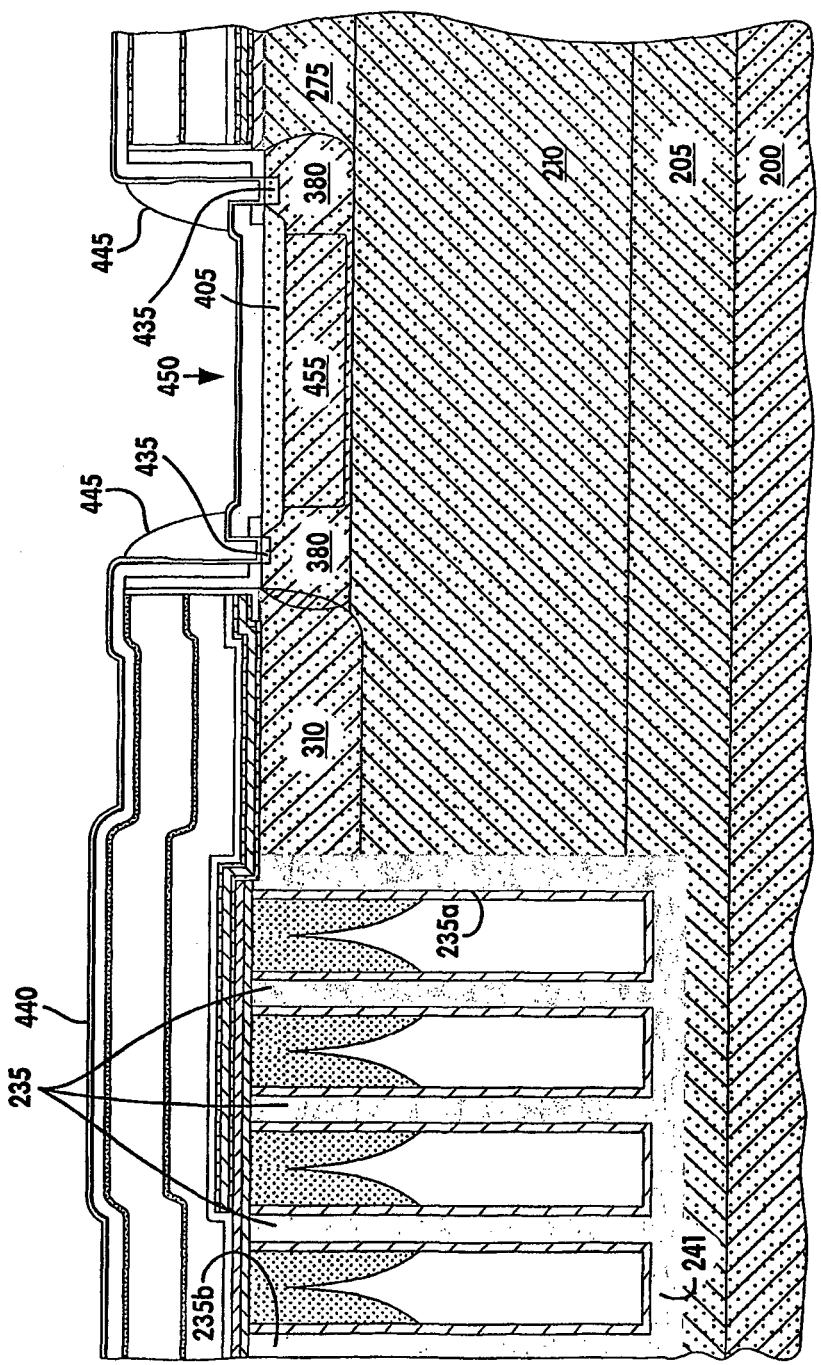

Referring to FIG. 17, a protective layer 440 is formed overlying the first major surface. In an embodiment of the wafer process, protective layer 440 comprises a silicon nitride layer ($Si_3N_4$). The silicon nitride layer is formed approximately 250 Å thick. A polysilicon layer is then formed overlying the first major surface. In an embodiment of the wafer process, the polysilicon layer comprises an undoped polysilicon layer. The undoped polysilicon layer is formed approximately 4000 Å thick. An anisotropic etch is performed on the polysilicon revealing portions of protective layer 440. The anisotropic etch leaves a portion of the polysilicon layer that is denoted as sidewall region 445.

A dielectric layer (not shown) is formed over the first major surface. In an embodiment of the wafer process, the dielectric layer comprises TEOS. The TEOS layer is formed approximately 150 Å thick. An implant step is then performed. In an embodiment of the wafer process, a boron implant having a concentration between 1E14 to 1E15 and more particularly a concentration of 2E14 is implanted. The implant is self aligning through opening 450 and penetrates through protective layer 440 and polysilicon layer 410 into doped region 380. A doped region 455 is formed by the implant that extends into doped region 380. The implant forms an enhanced p-type layer that is more lightly doped than the doped region 405 through which it was implanted. Doped region 455 reduces vertical gain of the parasitic bipolar transistor that is part of the RF power transistor structure.

Figure 18:
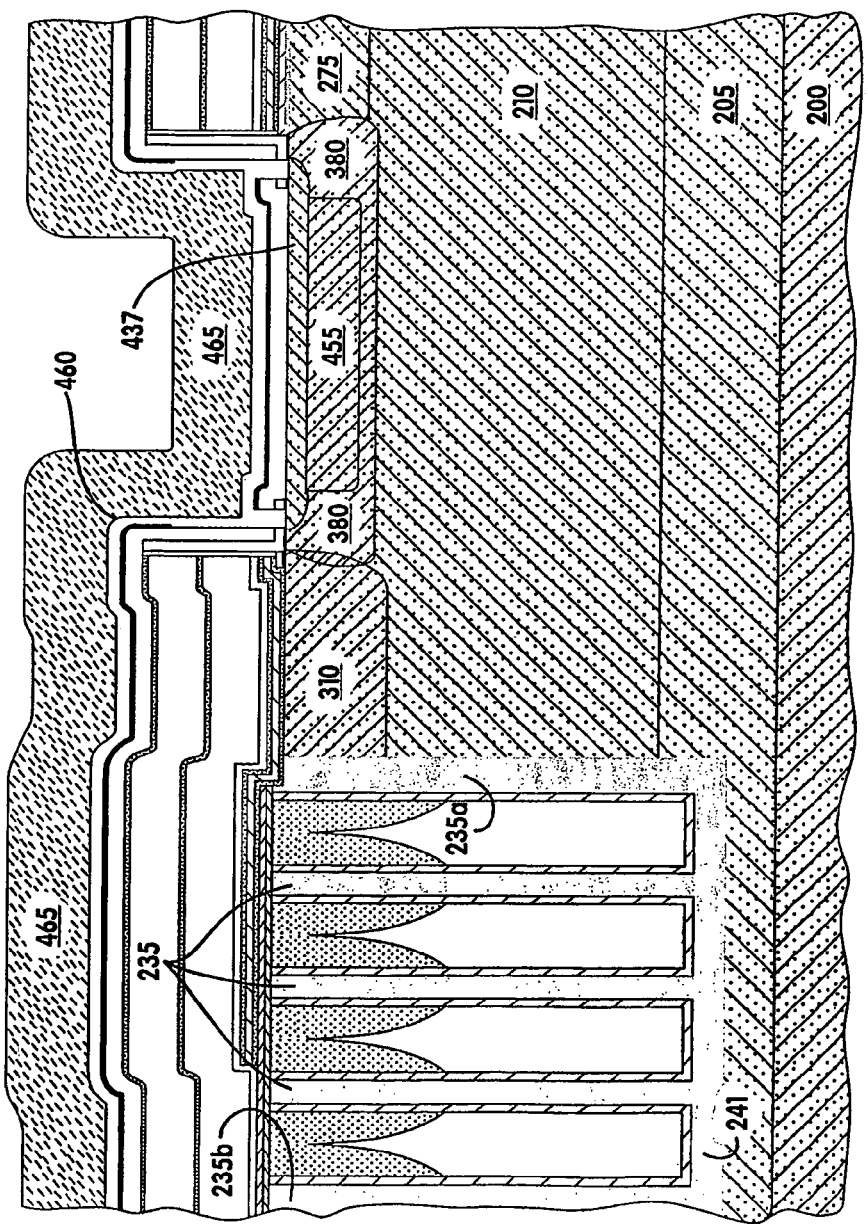

Referring to FIG. 18, the dielectric layer formed in FIG. 17 is removed. Sidewall region 445 is then removed revealing protective layer 440. A protective layer is then formed over the first major surface. In an embodiment of the wafer process, the protective layer is silicon nitride ($Si_3N_4$). The silicon nitride layer is then formed approximately 750 Å thick. The combination of the silicon nitride layer and protective layer 440 is denoted by protective layer 460. A dielectric layer 465 is then formed over the first major surface. In an embodiment of the wafer process, dielectric layer 465 comprises TEOS. The TEOS layer is formed approximately 6000 Å thick. The TEOS is densified in a thermal process at a temperature of approximately 700° C. The densification step is followed by a rapid thermal anneal process. These processes cause regions 405 and 435 of FIGS. 16-17 to combine to form region 437. Region 437 corresponds to the source of the transistor cell. The thermal anneal activates edge termination region 310, doped region 380, doped region 437, doped region 455, and optional doped region 275 and sets the junction profiles. Region 310 and region 380 are both p-type and electrically coupled together. It should be noted that the sequence of wafer processing steps provides substantial benefits from a thermal perspective. For example, dielectric platform 255 is formed before the transistor cells in the active area thus the high temperature steps required to oxidize large areas of the die are performed before implants are made. Similarly, the majority of the dopings in the active area of the transistor are activated near the end of the process flow which allows the implants to be placed without moving substantially due to additional thermal steps that plague other transistor designs. This produces a device that can be manufactured consistently with low process variation and higher device performance.

Figure 19:
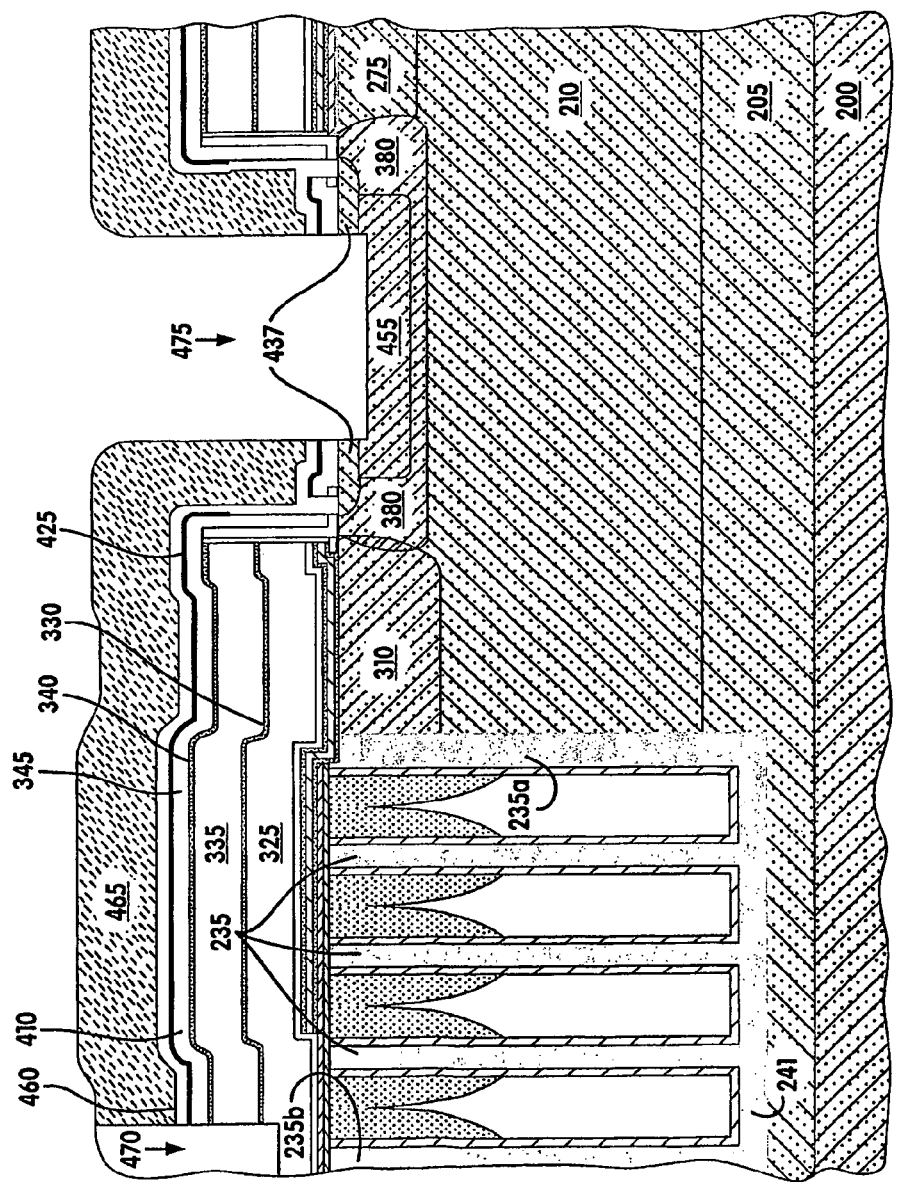

Referring to FIG. 19, a masking layer is formed and patterned overlying the first major surface. An opening 470 is exposed by the patterned masking layer and corresponds to a control electrode interconnection region that couples to the control electrode of each transistor cell of the RF power transistor. As shown, only part of opening 470 is illustrated. Opening 470 corresponds to control electrode interconnection region 57 of FIG. 1. In opening 470, the following layers are removed: dielectric layer 465, protective layer 460, dielectric layer 425, polysilicon layer 410, dielectric layer 345, polysilicon layer 340, tungsten silicide layer 335, polysilicon layer 330, and partially dielectric layer 325. In an embodiment of the wafer process, opening 470 is etched approximately 1000 Å into the TEOS layer corresponding to the exemplary embodiment of dielectric layer 325. The remaining masking layer is then removed.

A masking layer is then formed and patterned overlying the first major surface. An opening 475 is exposed by the patterned masking layer and corresponds to a first electrode interconnection region that couples to the first electrode of each transistor cell of the RF power transistor. The first electrode interconnection region corresponds to the first electrode interconnection region 58 of FIG. 1. In this embodiment, there is an array of mesh connected MOS transistor cells that are connected in parallel to form the RF power integrated circuit device of this invention. As will be explained, all of the gates of the transistor cells are connected via conductive pathways to the interconnection region 57 which, in turn, is mated with an external metallic contact of the package. In opening 475, the following layers are removed, dielectric layer 465, protective layer 460, and polysilicon layer 410. An etch step is performed that etches through doped region 437. Material is removed such that opening 475 extends into doped region 455.

Figure 20:
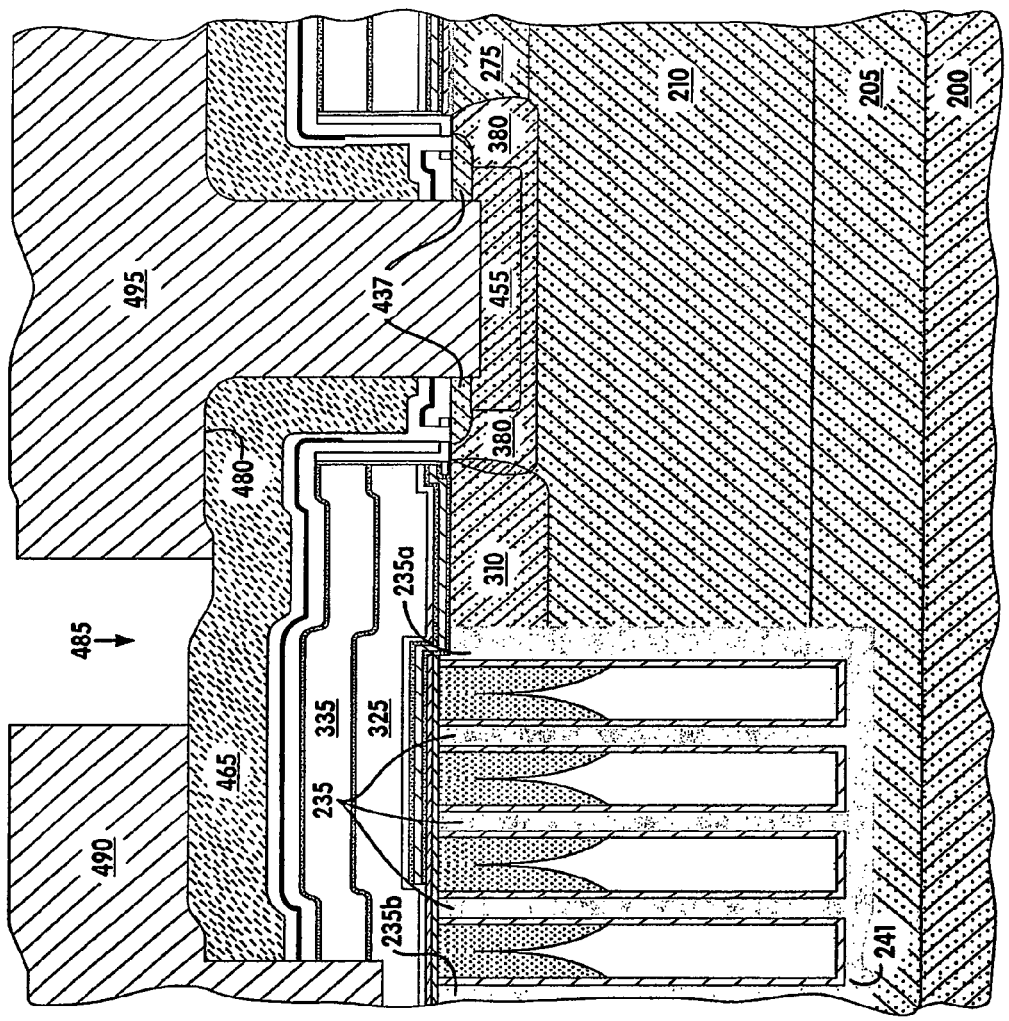

Referring to FIG. 20, the remaining masking layer is removed. A thin diffusion barrier material 480 is formed overlying the first major surface. In an embodiment of the wafer process, barrier material 480 comprises a material such as titanium and titanium nitride (Ti—TiN). A conductive layer is then formed overlying the first major surface. In an embodiment of the wafer process, a low electrical and thermal resistance material is used for the conductive layer, for example gold. In an embodiment of the wafer process, the gold layer is formed have a thickness of approximately 1 µm to 3 µm. Other metals or metal alloys known to one skilled in the art could also be used instead of gold.

A masking layer is formed and patterned overlying the first major surface. An opening 485 is formed through the conductive layer and barrier material 480 to separate a control electrode interconnection region 490 (corresponding to item 57 in FIGS. 1-2) from a first electrode interconnection region 495 (corresponding to item 58 in FIGS. 1-2). In an embodiment of the wafer process, opening 485 is between 10 µm and 50 µm in width.

Figure 21:
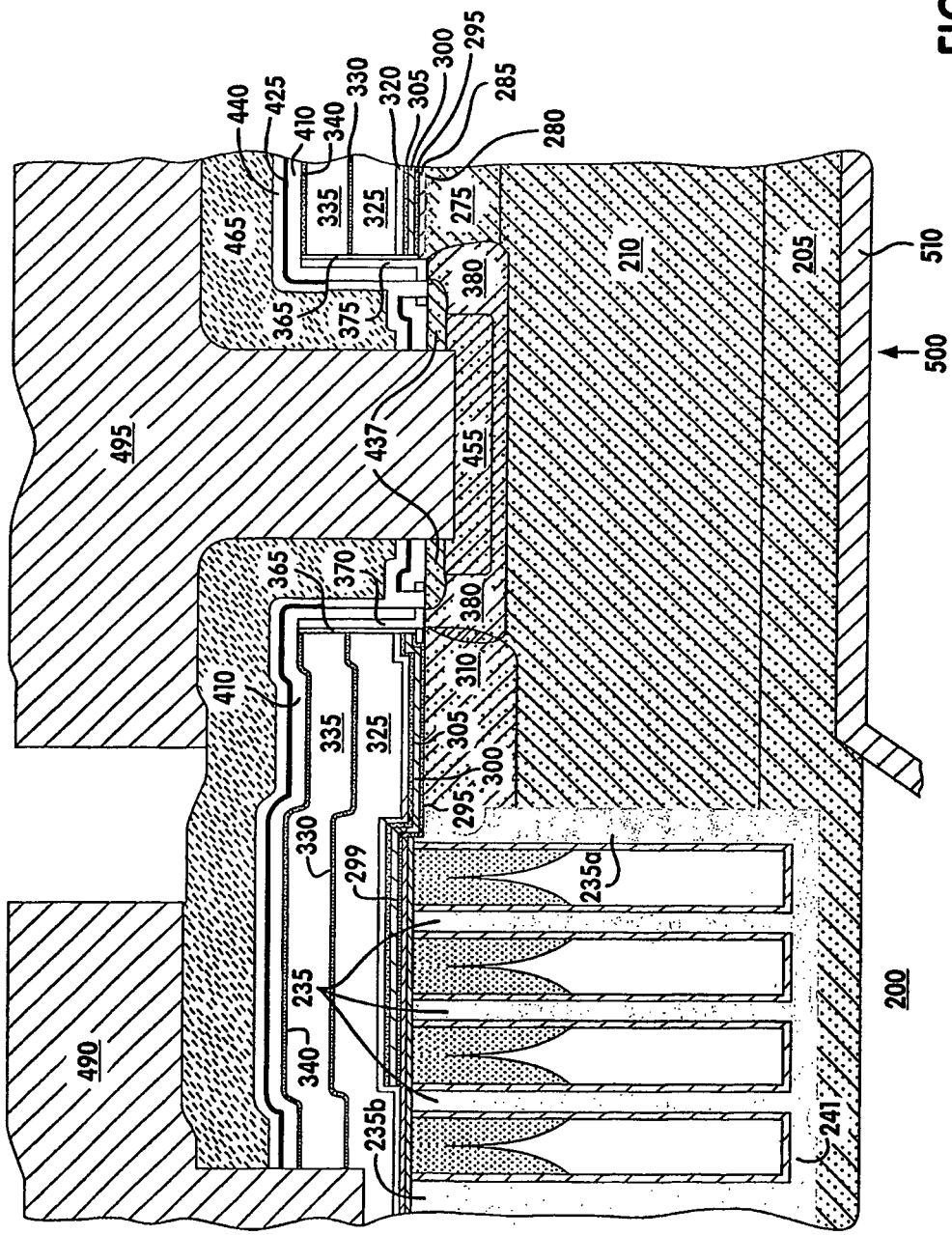

Referring to FIG. 21 is a cross-section of a portion of a RF power transistor in accordance with the present invention. Similar to FIG. 2, the RF power transistor is etched or thinned to reduce a thermal resistance of the device. In an embodiment, of the RF power transistor, an exposed surface of substrate 200 is masked exposing substrate 200 corresponding to the active area of the transistor. An etch process is performed on the exposed p-type material of substrate 200 that stops on the n-type buried layer 205 forming a cavity region 500. Thus, the die thickness in the region where current is conducted by the RF power transistor is approximately the thickness of epitaxial layer 210 and buried layer 205 making the thermal resistance and the on-resistance of the transistor very low.

In an embodiment of the RF power transistor, substrate 200 forms a support structure or frame at the periphery of the die. A metal layer is formed on buried layer 205 exposed after the etching process. The metal layer forms a second electrode interconnection region 510 that is electrically coupled to buried layer 205. Thus, first electrode interconnection region 495 and control electrode interconnection region 490 can be coupled to external contacts of a package from the top side of the die similar to that shown in FIG. 1 while second electrode interconnection region 510 can be coupled from a bottom side of the die to an external package contact. How contact is made from the first, control, and second electrodes to the package leads will be described in detail herein below.

As mentioned previously, a portion of the RF power transistor is shown in FIG. 21 near a periphery of the die to illustrate features of the device. Although only a single transistor cell is shown, the RF power transistor comprises a plurality of transistor cells coupled in parallel in the active area of the device. Transistor cells adjacent to the dielectric platform may differ from transistor cells (not shown) interior to the active area by p-type region 310. In general, a transistor cell has a channel that is contiguous around the source region. Thus, current conduction through the channel occurs in all directions away from the source region into the drain region (epitaxial layer 210). The transistor cell shown in FIG. 21 is prevented from conducting on the side where p-type region 310 resides because a conductive path to the drain region does not exist (epitaxial layer 210). The transistor cell conducts in all other directions where the channel couples to n-type layer 275.

Each transistor cell of the RF power transistor is a MOSFET structure having a gate region, source region and drain region. The RF power transistor has a common drain since epitaxial layer 210 is common to each drain of each transistor cell. Thus, the transistor cell drains cannot be decoupled from one another. The common drain (epitaxial layer 210) is coupled to buried layer 205 and second drain electrode interconnection 510 (60). The gates of each transistor cell are coupled together via a low resistance interconnect stack. For example, layers 330, 335, and 410 comprise a low resistance interconnect layer that couples to the gate of each transistor cell thereby coupling them in common. Layers 330, 335, and 410 couple to control electrode interconnection 490 (57). Similarly, the source of each transistor cell is coupled in common by first electrode interconnection region 495 (58). First electrode interconnection region 495, control electrode interconnection region 490, and second electrode interconnection region 510 respectively couple to the source, gate, and drain leads of the package.

In an embodiment of the RF power device the gate length of each transistor cell is determined non-photolithographically. The gate electrode of the transistor cell comprises polysilicon layer 370 and polysilicon 410. Polysilicon layer 370 overlies a thin gate oxide 360 (FIG. 16) formed over p-type region 380. Underlying the gate oxide is the channel region of the transistor cell. Forming the gate in this manner has advantages. The deposition of material such as polysilicon can be controlled with great accuracy in a wafer fabrication facility (wafer fab). The gate length is determined by the combined widths of polysilicon layers 370 and 410, i.e., the thickness of layer 370 and the thickness of deposited polysilicon layer 410. What this means is that a transistor can be produced with a state of the art gate length (ex. 0.2-0.3 microns or lower) in a wafer fab having photolithographic capabilities greater than 0.35 microns. The short channel length of the transistor results in high gain, low on-resistance, and extended frequency response. In particular, high gain that results in a wider frequency power gain curve is a result of the transistor cell design. The RF power device can be built at much lower cost since production cost is directly related to the photolithographic capability of the wafer fab. Moreover, tighter control over gate lengths can be achieved with lower variance because of the control wafer processing facilities have over material deposition thicknesses (such as polysilicon).

The RF power transistor and package is an electrical and thermal system. These devices have very stringent requirements that must be met for communication applications. In particular, a RF transistor has to be capable of operating under a full power condition for a period of no less than 34 years mean time to failure to meet the specification for use in a cellular base transceiver station power amplifier. Heat removal is one of the limiting factors in providing a reliable high power RF transistor. For example, it has been found that a silicon transistor operated at a junction temperature of 200 degrees Centigrade or less (under full power conditions) has proven to meet the 34 year mean time to failure specification. Thus, it is highly beneficial to have an efficient device and package system to remove heat.

In general, heat is removed through the source region of each transistor cell in the active area. A source region of the transistor cell comprises n-doped region 437. In an embodiment of the transistor cell, the via (or opening) for the transistor cell source region is etched through n-doped region 437 into p-doped region 455. First electrode contact region 495 (58 of FIGS. 1 and 2) is a deposited metal region over the active area of the RF power IC. The metal of first electrode contact region 495 fills the via of the transistor cell source region and couples to both n-doped region 437 and p-doped region 455. The metal in the via of the transistor cell not only makes excellent electrical contact to the source region but also is a low resistance thermal path for removing heat from the die. The metal that contacts region 437 and 455 in the bulk silicon is in close proximity to where the heat is generated in the transistor cell and thus can remove the heat very efficiently away from the bulk silicon to first electrode contact region 495. Each transistor cell in the active area removes heat in a similar fashion. First electrode contact region 495 is coupled to a source package lead and heat sink to dissipate heat which will be described in more detail herein below. As mentioned previously, heat can be pulled from both sides of the die. Second electrode contact region 510 is coupled to a drain package lead that can be coupled to a heat sink to further improve the system efficiency to remove heat.

The on-resistance or $r_{dson}$ of the transistor relates to the efficiency of the transistor and the heat generated by the device. Lowering the on-resistance of the RF power transistor reduces the thermal requirements of the package and heat sink. The transistor cell structure reduces the on-resistance of the transistor. As shown, the conductive path of a transistor comprises first electrode contact region 495, n-type region 437, the transistor cell channel, n-type layer 275, n-type epitaxial layer 210, n-type buried layer 205, and second electrode contact region 510. First electrode contact region 495 is a metal such as gold which has a low resistance. First electrode contact region 495 couples to n-type region 437. N-type region 437 is in close proximity and a low resistance path to the source side of the transistor cell channel. In an embodiment of the transistor cell, the channel length is 0.2-0.3 microns in length. On the drain side of the transistor cell channel n-type layer 275 provides a low resistance path to epitaxial layer 210. The current path of the transistor cell changes from a horizontal direction to a vertical direction in n-type layer 275. The main component of $r_{dson}$ for the transistor cell is epitaxial layer 210. Epitaxial layer 210 has to standoff the voltage applied to the device. As mentioned previously, the sidewall of dielectric platform 255 adjacent to the active area promotes planar breakdown (edge termination) by preventing curvature of the electric field in epitaxial layer 210. Planar breakdown allows the use of the lowest resistivity epitaxy to standoff the required voltage thereby minimizing $r_{dson}$ of the transistor cell. Epitaxial layer 210 couples to buried layer 205. Buried layer 205 is a highly doped low resistance layer. In an embodiment of the device, a cavity etch is performed in the active area of the die that further reduces the resistance through buried layer 205 (reduces thickness). The conductive path hereinabove applies to each transistor cell in the active area, thus the device has been optimized to have lowest on-resistance possible.

The frequency performance of the RF power transistor is increased substantially by minimizing parasitic capacitances of the device. In particular, each transistor cell is optimized to reduce the gate to drain capacitance. The gate to drain capacitance is the dominant capacitance in relation to the operating frequency because it's value gets multiplied by the gain of the device. This is known as the Miller effect or Miller multiplied capacitance. In other words, reducing gate to drain capacitance directly improves the bandwidth of the device. The gate to drain capacitance is minimized by the grounded shielding plate formed adjacent to the gate (polysilicon layers 370 and 410) of the transistor cell. Grounded shielding plate (labeled 299 in FIG. 21) comprises conductive layers 295, 300, and 305 which forms a low resistance electrically conductive stack. In an embodiment of the device, the grounded shielding plate 299 approximately overlies all of the active area except the doped regions (corresponding to p-type doped region 380) that define the channel and source regions of each transistor cell. Grounded shielding plate 299 is isolated from the top surface of the die by non-conductive layers 280 and 285 in the active area of the die except at the periphery of the active area adjacent to dielectric platform 255 where conductive layer 295 couples to p-type region 310 to make the connection to ground. In general, the source of the RF power transistor is coupled to ground when used in a RF power amplifier. The grounded shielding plate is coupled to ground through the source regions of transistor cells adjacent to p-type region 310. As illustrated in FIG. 21, layer 295 of the grounded shielding plate couples to p-type region 310. P-type region 310 is coupled to p-type region 380 which in turn couples to p-type region 455. P-type region 455 couples to first electrode contact region 495 which couples to the source region of each transistor cell and ground through a source package lead. Thus, the electrical path for connecting grounded shielding plate to ground is through bulk silicon of the die which is highly beneficial because it reduces die area and simplifies the interconnection scheme of the device.

The grounded shielding plate is placed between the polysilicon gate structure/gate interconnect and the drain (layer 275 and epitaxial layer 210) of the transistor cells. The placement of the grounded shielding plate converts (or decouples) parasitic gate to drain capacitance into two separate capacitors which can be described as a gate to ground (source) capacitance and a drain to ground (source) capacitance. Neither of these capacitance values are Miller multiplied by the gain of the transistor cell thereby enhancing frequency performance of the device. Each transistor cell has a centralized source region and a channel region defined by the gate structure that is circumferential around the source region. The grounded shielding plate is spaced as close as possible to the gate. In the embodiment of the device, the grounded shielding plate is isolated from the gate by protective layer 365 on the drain side of the transistor cell. The protective layer 365 is 500 Å thick, thus the grounded shielding plate is spaced 500 Å from the gate. Similarly, the grounded shielding plate is placed close to the top surface of the die. In the embodiment, layer 295 of the grounded shielding plate is isolated from the top surface by layers 280 and 285. Layer 280 is an oxide layer having a thickness of approximately 700 Å. Layer 285 is a protective layer having a thickness of approximately 500 Å. Thus, grounded shielding plate is approximately 1200 Å from the top surface of the die.

It should be evident that the grounded shielding plate 299 is placed close to the edge of the channel on the drain side of the transistor cell. A capacitance value is a direct function of the distance between two conducting surfaces and the dielectric constant of the isolating material. Fringing capacitance from gate to drain of the transistor cell occurs between the vertical polysilicon gate region (layers 370 and 410) and layer 275. The highest value of fringing gate to drain capacitance occurs at the channel boundary to the drain of the transistor cell because the spacing between the gate and the drain is the smallest. Thus, the placement of grounded shielding plate as shown has a significant impact on reducing gate to drain capacitance. Placing the grounded shielding plate near the edge of the channel of the drain side must be balanced against device reliability and creating a large drain to ground capacitance value. Layers 280 and 285 are designed to reliably isolate the grounded shielding plate from layer 275. Grounded shielding plate and layer 275 form the conductive plates of a capacitor (drain to ground) that covers a substantial portion of the active area. The thickness and dielectric constant of layers 280 and 285 are a factor in the total drain to ground capacitance created by the grounded shielding plate and layer 275. Adjusting the thickness of layers 280 and 285 can be balanced to determine an optimum value of gate to drain fringing capacitance versus gate to ground capacitance for maximum device performance. Furthermore, placing grounded shielding plate near the top surface provides an additional benefit of increasing the breakdown voltage of the transistor. The grounded shielding plate acts to deplete the top surface of n-type layer 275. This reduces the curvature of the field lines around p-type region 380 of the transistor cell on the drain side of the channel improving high voltage operation. The improvement can be substantial. Simulation results of a transistor cell without the grounded shielding plate for yielded a 60V breakdown which improved to 75V with the grounded shielding plate yielding a 25% improvement in breakdown voltage.

Gate interconnect between transistor cells comprises conductive layers 330, 335, and 340. The conductive stack of layers ensures a low resistance interconnect to the gates of all transistor cells. The gate interconnect is patterned similarly and approximately overlies the grounded shielding plate in the active area region. The gate interconnect and the grounded shielding plate form the conductive plates of a capacitor. They are separated by isolation layers 320 and 325. The thickness of layers 320 and 325 can be adjusted to decrease the gate to ground capacitance value but must be balanced against other transistor cell design tradeoffs such as the depth of the via to ensure good metal coverage and short thermal path to pull heat from the device. It should be noted that the grounded shielding plate extends over a portion of dielectric platform 255 to ensure that parasitic gate to drain capacitance is decoupled as the gate interconnect of the active area couples to control electrode interconnection region 490. Control electrode interconnection region 490 is formed overlying dielectric platform 255 to further minimize gate to drain capacitance. Control electrode interconnection region 490 and buried layer 205 form conductive plates of a gate to drain capacitor. Dielectric platform 255 has an extremely low dielectric constant and provides separation between the conductive plates greater than the thickness of epitaxial layer 210. Dielectric platform 255 reduces gate to drain capacitance due to control electrode interconnection region 490 to an inconsequential value. Thus, parasitic capacitances on a transistor cell level as well as at the die level have all been minimized which results in a low $r_{dson}$ radio frequency power transistor having substantial power gain above 10 GHz.

Typically a RF power transistor is used in a power amplifier operated with the source coupled to ground. The drain of the RF power transistor typically swings between ground and the supply voltage of the power amplifier. In the disclosed embodiment of the device, the RF power transistor is a n-channel enhancement mode device. An n-channel is formed when a voltage greater than the threshold voltage is applied to the gate of a transistor cell. The n-channel electrically couples the n-type drain to the n-type source to conduct a current. The current conducted is a function of the applied gate voltage. One characteristic that affects the performance of the RF power transistor is the doping profile of the device. In particular, the doping profile underlying the gate oxide is important as it determines the characteristics of the channel under different operating conditions. The doping profile underlying the gate oxide impacts the output impedance of device which affects the ability of the RF power transistor to transmit information in a format such as wideband CDMA.

Figure 22:
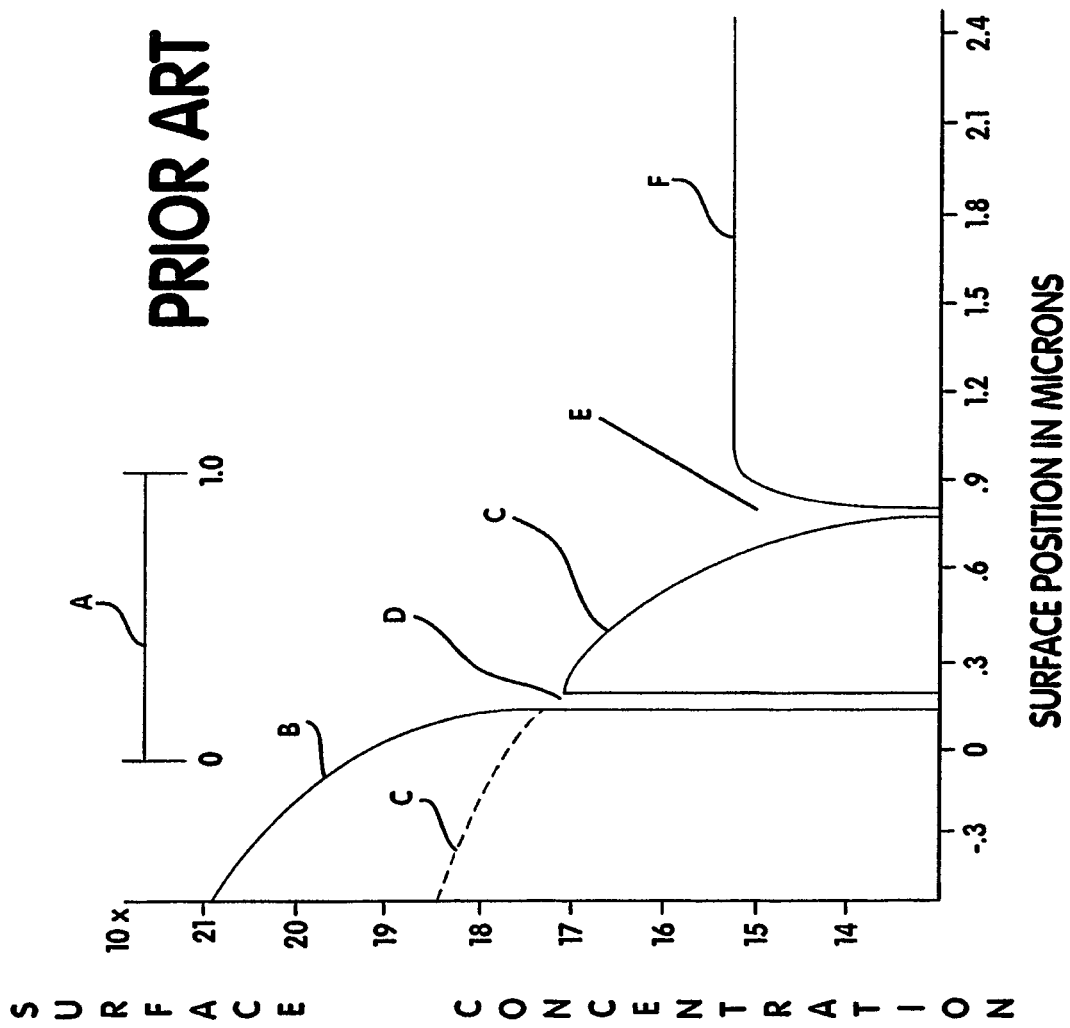
FIG. 22 is a doping profile of a Prior Art RF power transistor.

FIG. 22 is doping profile of a prior art RF power transistor. The doping profile corresponds to a RF LDMOS (laterally diffused MOS) transistor well known to one skilled in the art. The y-axis is the doping concentration at the surface of the device. The x-axis is the relative surface position of the dopings. A gate polysilicon length A corresponds to the drawn or lithographic dimensions of the prior art LDMOS device prior to wafer processing. The zero reference point corresponds to the lithographically defined edge of the gate polysilicon on a source side of the LDMOS transistor. As is well understood, doped regions out diffuse as thermal cycles of the wafer process occur changing the original dimensions of the RF power transistor. The photolithographic defined gate polysilicon length A of the example RF LDMOS transistor is 1 μm.

A doping profile C corresponds to the doping concentration in the channel region (underlying the gate oxide) of the RF LDMOS transistor. Doping profile C is a p-type dopant. Doping profile C is formed of an intermediate doping concentration between the source and drain doping concentrations. Doping profile C in the channel region is not constant but varies in concentration from drain to source.

A doping profile B corresponds to the doping concentration of the source of the RF LDMOS transistor. Doping profile B is a n-type dopant. Doping profile C extends into the source as shown by the dashed line and varies in concentration in the source. Doping profile B has a substantially higher doping concentration than doping profile C. A p-n junction region D is formed between the n-type doping profile B and p-type doping profile C.

A doping profile F corresponds to the doping concentration of the drain of the RF LDMOS transistor. Doping profile F is an n-type dopant. Doping profile F is formed adjacent to doping profile C. A p-n junction region E is formed between n-type doping profile F and p-type doping profile C. In general, doping profile F has a lower doping concentration than doping profile C. The doping concentration differential between doping profile F and doping profile C does not exceed an order of magnitude difference until more than half way in the channel region towards the source end of the channel region.

An effective gate length of the RF LDMOS transistor corresponds to the doping profile C between source region B and drain region F. The effective gate length is approximately 0.6 μm which is shorter than photolithographic defined gate polysilicon length A. Note that the doping profile changes in concentration from drain to source. The wafer process steps used to form the drain, channel region, and source of a RF LDMOS device creates the characteristic doping concentration throughout the channel region. Doping profile C has the affect of reducing the output impedance of the RF LDMOS transistor due to drain induced barrier lowering. The effective gate length of the RF LDMOS transistor is reduced with increasing drain voltage due to p-n junction E encroaching into the channel thereby reduce the length of the channel. A factor in channel length reduction is the area utilized for the space charge region in the p-type channel region under high voltage conditions due to low doping concentrations near the drain. As shown, the doping concentration in the channel region does not reach one order of magnitude greater than the drain doping concentration until approximately at half the distance to the source. Thus, the space charge region may encroach a significant distance into the channel region producing a wide variation of gate length over the operating range of the device. This results in a low output impedance that impacts the performance of the RF power transistor.

Another fact that is not apparent from the doping profile is a substantial gate to drain capacitance. The gate to drain capacitance occurs because of out diffusion of the drain region under the gate. The gate to drain capacitance is significant because the value is multiplied by the gain of the device thus it is typically the limiting factor for frequency response.

Figure 23:
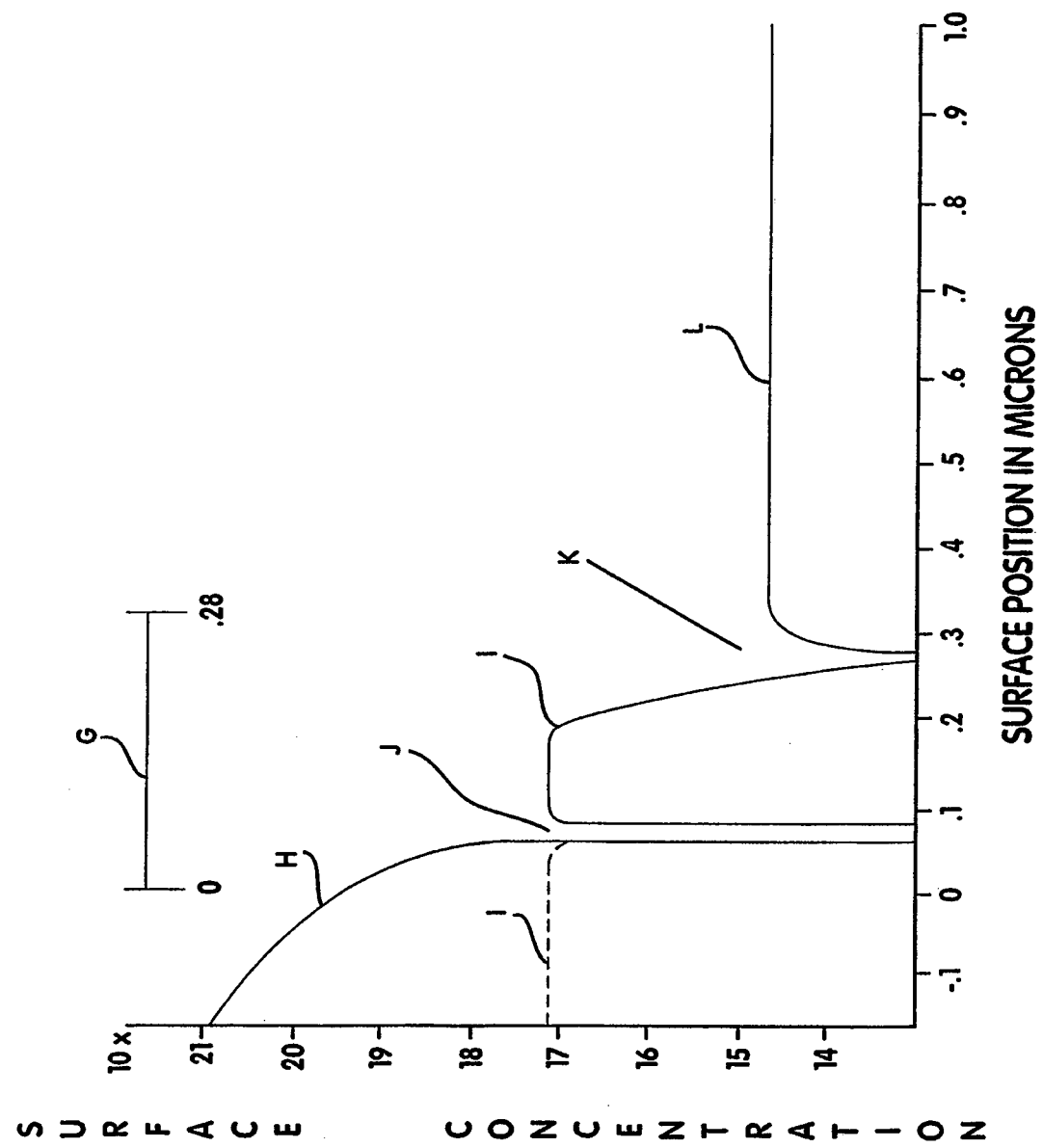
FIG. 23 is a doping profile of the RF power transistor of FIG. 21 in accordance with the present invention.

FIG. 23 is a doping profile of the RF power semiconductor device of FIG. 21 in accordance with the present invention. The y-axis is the doping concentration at the surface from the source (region 437) to drain (layer 275) of the device including the channel region (region 380) there between. The x-axis is the position of a doping profile with a zero reference point corresponding to a photolithographic (drawn) defined gate polysilicon length G starting at the source side (0 x-axis) of the channel and ending at the drain side (0.28 x-axis). The photolithographic defined gate polysilicon length G is approximately 0.28 μm for this embodiment of the invention. Both FIGS. 21 and 23 will be used in the description herein below.

P-type doped region 380 is formed having a doping concentration of approximately $1E17$ atoms/cm$^3$ as shown in doping profile I. N-type doped region 437 is the source of the transistor cell and has a doping concentration that has a peak of $1E21$ atoms/cm$^3$ at a distance greater than −0.1 microns from the zero reference point. A doping profile H corresponds to the source of the transistor cell. A portion of p-type doped region 380 extends into the source of the transistor cell as shown by the dotted line portion of doping profile I. In an embodiment of the RF power transistor, the dotted line portion of doping profile I is substantially constant within the source of the RF power transistor A p-n junction J is formed by p-type doped region 380 and n-type doped region 437. P-n junction J occurs at approximately 0.05 microns from the zero reference point.

N-type doped layer 275 is formed adjacent to p-type doped region 380. N-type doped region 275 is the drain of the transistor cell and has a doping profile L. In an embodiment of the RF power transistor, the doping concentration of the drain is approximately $5E14$ atoms/cm$^3$. A p-n junction K is formed by p-type doped region 380 and n-type doped layer 275 at a distance of 0.28 μm from the zero reference point.

An effective gate length of the RF power transistor is the channel length after all wafer processing steps have been performed. In an embodiment of the RF power transistor, the effective gate length of a transistor cell is approximately 0.2 μm. It should be noted that the device structure and the wafer processing steps used to form a transistor cell as described in FIGS. 3-21 yields an approximately constant doping through the channel region of the device in p-type doped region 380 between the source and drain. The approximately constant doping in the channel regions is due in part to the formation of p-type doped region 380 using three implant energies and doping in quadrature and also that the device does not undergo thermal cycles that would out diffuse adjacent doped regions to modify the doping concentration in region 380. Not only is the doping concentration approximately constant in the channel region but the concentration level falls off very rapidly at p-n junction K. This approximately constant doping is indicated by doping profile I shown as a solid line from approximately 0.08 to 0.2 on the x-axis. Doping profile I in the channel of the RF power transistor is near ideal and reduces drain induced barrier lowering.

As mentioned previously, drain induced barrier lowering is a short channel effect that changes the channel length as a function of the drain voltage. The channel length is reduced as the space charge region of p-n junction K encroaches into the channel region of p-type doped region 380 corresponding to an increase in drain voltage. The area taken up by the space charge region in the channel region reduces the channel length at higher drain voltages resulting in a lowering of the output impedance. The characteristic constant doping level of doping profile I within the channel region has a rapid falloff in doping concentration near p-n junction K. The doping concentration in the channel region (doping profile I) is more than 2 orders of magnitude greater than the doping level of the drain (doping profile L). Moreover, the doping concentration is an order of magnitude greater than the doping concentration of the drain at approximately 0.03 μm from p-n junction K. Thus, the space charge region does not encroach significantly into the channel region because of the high doping concentration. In other words, the effective gate length of the RF power transistor does not vary significantly as the drain voltage of the device is increased resulting in the RF power transistor having a high output impedance.

It is expected that the RF power transistor will have substantial power gain in 10-20 GHz range, in part due to the effective gate length of approximately 0.2 μm. A substantial benefit of the device structure is that it can be made with wafer processes having critical dimensions greater than the effective gate length. In an embodiment of the RF power transistor, a 0.35 μm wafer process is used to form the device. In general, the photolithographic critical dimension of a wafer process is not the limiting factor on the gate length that can be achieved in the RF power transistor. It is the control over the deposition of materials that, in part, determines the gate length. In particular, the deposition of polysilicon is the step that affect the gate length.

Another factor in the extended frequency response of the RF power transistor is reduced parasitic capacitance. In general, the sequence of wafer process steps described hereinabove is done in a manner that minimizes out diffusion under the gate. In particular, the sequence of wafer process steps used to form the device reduces the number of thermal cycles that cause implants to out diffuse under the gate thereby lowering gate to drain capacitance (also known as the Miller capacitance). Device variation from wafer lot to wafer lot is also minimized.

Figure 24:
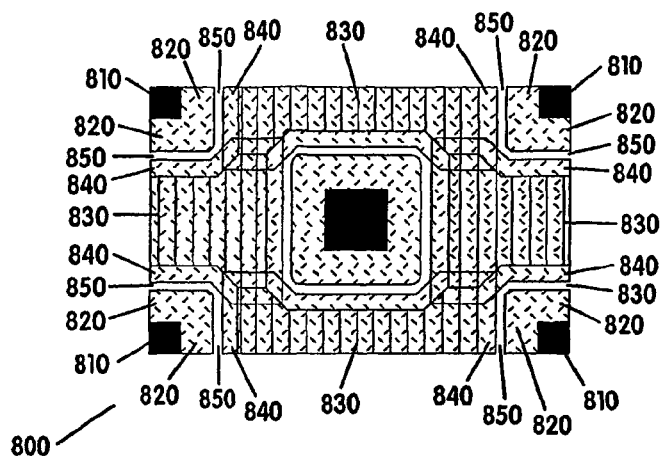
FIG. 24 is a top view of a mesh transistor cell that can be arrayed to form a larger composite structure in accordance with the present invention.

FIG. 24 is a top view of mesh transistor cells 800 in accordance with the present invention. Mesh transistor cells 800 are designed to be arrayed or tiled to form a larger RF power transistor comprising a plurality of mesh transistor cells in parallel. The number of mesh transistor cells used to form the device can range from one to hundreds of thousands of transistor cells depending on the required device power output. It should be noted that thermal considerations are a determining factor of device power output. A reliable RF power transistor cannot be manufactured if the heat cannot be removed from the die. Mesh transistor cells 800 corresponds to the transistor cell described in FIGS. 3-21 in structure but differs in the fact that it is designed be arrayed to form the bulk of the transistors cells in the active area. In the embodiment, mesh transistor cells 800 includes partial mesh transistor cells adjacent to a central mesh transistor cell. A different transistor cell would be used near the active area periphery where a mesh transistor cell abuts p-type region 310 (FIG. 21) and completes the area such that there are no partial mesh transistor cells left in the transistor cell array. Mesh transistor cells 800 are formed and replicated in n-type layer 275 (FIG. 21). This allows each mesh transistor cell of mesh transistor cells 800 to conduct current from all sides (360 degrees) around each source region. Conversely, the transistor cell shown in FIGS. 3-21 is a transistor cell that abuts p-type region 310 (FIG. 21) on one side of the transistor cell near the dielectric platform. The transistor cell of FIGS. 3-21 cannot conduct on the side where the channel abuts p-type region 310 but will conduct in all other directions into n-type layer 275. P-type region 310 prevents the channel from coupling to n-type layer 275 thereby preventing a conductive path from drain to source when a gate voltage inverts the channel region to form an n-channel.

The transistor cell configuration disclosed herein has substantial advantages due to the efficiency in device structure in reducing parasitic resistances, capacitances, and inductances as well as improved linearity, distortion, power density, and frequency response when compared to prior art RF power transistors using an interdigitated finger geometry. An example of an interdigitated finger transistor is RF LDMOS (laterally diffused MOS). LDMOS transistors comprise long alternating stripes of drain and source regions separated by the channel region. A large transistor is formed by connecting the gate regions in common and a top surface gate contact region is provided. Similarly, the drain regions are coupled in common and a drain contact region is provided. The source contact region is on a back surface of the die. The source regions are coupled to the source contact region through low resistance sinkers that are formed in the substrate. The low resistance sinkers increase the size of the die and source regions. A device of this type will typically have a current density of approximately 40-50 microamperes per micron of device Z (width).

Figure 25:
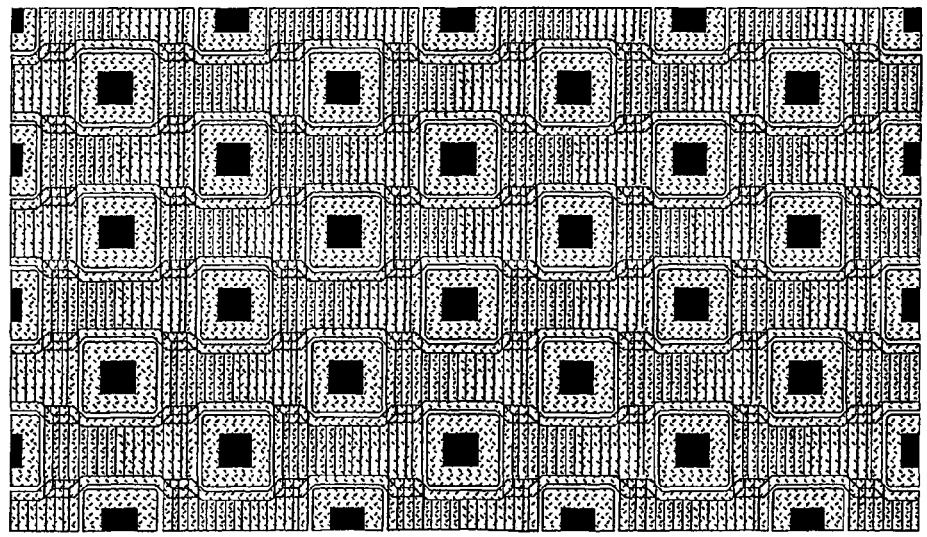
FIG. 25 is a top view of an array of mesh transistor cells formed from the mesh transistor cell of FIG. 24 in accordance with the present invention.

The mesh transistor structure disclosed herein greatly increases the current density per square micron of transistor area. Part of the efficiency increase is a direct function of the mesh transistor topology which allows closely spaced transistor cells that generate a large transistor Z/L ratio per unit area. A first difference between mesh transistor cell 800 and an LDMOS structure is that the source and drain contact regions are on different sides of the die. In mesh transistor cell 800 the source contact region is on the top side of the die and the drain is on the back side of the die. A second difference is that mesh transistor cell has a centralized source region having a channel region that is formed circumferentially around the source region. As mentioned previously, mesh transistor cell 800 conducts current a full 360 degrees around the source region (except the transistor cells adjacent to the dielectric platform (blocked by p-type region 310). A third difference is that the drain of each transistor cell is common to one another. In the disclosed embodiment, the epitaxial layer 210 (FIG. 21) is the drain of each transistor cell which comprises the RF power transistor. Thus, the transistors of mesh transistor cell 800 are vertical transistors (not lateral devices coupled in common). A fourth difference is the gate interconnect between mesh transistor cells. This is shown in FIGS. 24 and 25 and will be described in more detail herein below. The gate interconnection results in an extremely low gate resistance.

Mesh transistor cells 800 comprises a single centrally located mesh transistor cell and four partial transistor cells. The four partial cells are located symmetrically around the complete mesh transistor cell. Layers above the gate interconnect are not shown to better illustrate features of mesh transistor cells 800. For example, layers corresponding to first electrode interconnection region 495 (FIG. 21) and the underlying isolation layers (layers 425, 460, and 465 of FIG. 21) are not shown. The four partial transistors cells are one fourth of a single mesh transistor cell. Mesh transistor cells 800 are tiled in both the x and y direction. Tiling mesh transistor cells 800 is a process of replicating the cell and abutting cells next to one another.

In an embodiment of the device, the channel region formed circumferentially around the central mesh transistor of mesh transistor cells 800 has eight sides. The eight sided shape of the channel region eliminates sharp 90 degree corners that could lead to non-uniform channel length. Interior to the circumferential channel is a source region of the transistor cell. A preohmic (or via) region 810 is an opening formed to expose the source region of each mesh transistor cell. In general, a metal (not shown) overlies preohmic regions 810 filling the opening and coupling to each source to form a first electrode interconnection region (coupling the sources of the mesh transistor cells in common). The first electrode interconnection region corresponds to the first electrode interconnection region 495 of FIG. 21 A polysilicon layer 820 couples to the first electrode region and corresponds to polysilicon layer 410 within the source region of a mesh transistor cell. Polysilicon layer 820 couples to the source region of the mesh transistor and increases the vertical surface area for contacting the metal that fills preohmic region 810.

A gap 850 corresponds to the separation or spacing between polysilicon regions of mesh transistor cell 800. In particular, gap 850 shows the separation between polysilicon layers 820 and a polysilicon layer 840. A protective layer (not shown) separates polysilicon layer 820 from polysilicon layer 840. The protective layer corresponds to protective layer 460 of FIG. 18 which separates polysilicon in the source from the polysilicon which forms the gate and gate interconnect. Polysilicon layer 840 comprises a gate of each mesh transistor cell and the gate interconnect that couples to gates of adjacent transistor cells. Polysilicon layer 840 corresponds to polysilicon layer 410 (FIG. 21) that couples to polysilicon layer 370 of FIG. 21. The combination of polysilicon layers 370 and 410 form the gate of each mesh transistor cell and the horizontal width or thicknesses of the polysilicon layers determines the gate length. Polysilicon layer 830 couples to polysilicon layer 840 which is used to lower the control electrode resistance. Polysilicon layer 830 corresponds to polysilicon layer 330, tungsten silicide layer 335, and polysilicon layer 340 that are coupled in common (as shown in FIG. 21) and are used to couple the gate (polysilicon layer 370 of FIG. 21) to control electrode interconnection region 490 on the periphery of the die. Thus, the gates of each mesh transistor cell can be coupled together in a fashion that results in an extremely low resistance path.

FIG. 25 is a top view of an array 801 of mesh transistor cells in accordance with the present invention. Array 801 illustrates mesh transistor cell 800 of FIG. 24 replicated and tiled together to form a plurality of transistor cells coupled in parallel to form a RF power transistor in the active area of the die. Note that partial mesh transistors cells are shown on the periphery of the array. Typically, additional mesh transistor cells (not shown) would be tiled to the array to form complete transistor cells on the periphery such that only complete transistors comprise the finished array used to form the RF power transistor. The top view of array 801 is useful to show how the majority of the heat is pulled from the transistor die. Each preohmic (or via) centrally located in each mesh transistor cell when filled with metal to form first electrode interconnection region 495 (FIG. 21) forms a thermal conduction path comprising the bulk silicon, metal in the preohmic, first electrode interconnection region (metal that couples all of the mesh transistor cell sources together), package lead, and external heat sink. Pulling heat from the top side of the die in close proximity to where the heat is generated is a very efficient way of removing heat.

Semiconductor Package

A semiconductor package for a radio frequency (RF) power transistor die, such as the die described above, must adequately perform several functions. First, it houses the power transistor die and thus isolates the die from harmful elements from the external environment that can affect the performance and reliability of the die. For example, humidity is often a problem that can produce corrosion and ultimately the failure of the device. Second, a power transistor generates substantial amounts of heat. Consequently, the power transistor package of this invention is designed to be a thermal conductor that channels the heat away from the die. The ability to effectively remove heat greatly impacts device performance. A transistor operating at a lower temperature is more reliable and has better performance characteristics than a device operating at a higher temperature. Finally, a power transistor is typically coupled to a printed circuit board or module to form an amplifier circuit. The semiconductor package has electrical leads or contacts that couples the power transistor die to the printed circuit board. The package itself can add parasitic resistance, inductance, and capacitance that can greatly degrade the performance of the power transistor.

FIG. 26 is a top view of a prior art semiconductor package 509 for a RF power die 511. Semiconductor package 509 comprises a die mount 512, a ceramic mount ring 513, a gate lead 514, and a drain lead 515. In this example, RF power die 511 is a MOS power transistor having a drain, a gate, and a source.

Die mount 512 acts as an electrical interconnect, a heat sink/thermal path, and strong supportive area for mounting RF power transistor 511. Die mount 512 is typically made of a metal having good electrical and thermal conductive characteristics such as copper or a copper alloy. An upper surface of die mount 512 on which die 511 is mounted is planar. Ceramic mount ring 513 defines the area in which die 511 is placed. In other words, the cavity formed by ceramic mount ring 513 is sufficiently large to allow die 511 to be placed with the opening. Ceramic mount ring 513 is made of a non-conductive ceramic material. The source contact of die 511 is the backside of the die. Typically, a metal layer is formed on the backside of the die to form a low resistance source contact. The source contact of die 511 is soldered to die mount 512 within the cavity formed by ceramic mount ring 513.

The top side of die 511 includes gate contacts and drain contacts. In general, die mount 512 is rectangular in shape, gate lead 514 and drain lead 515 oppose one another and extend beyond an edge of die mount 512 to simplify connection to package leads. Gate lead 514 and drain lead 515 are made of metal and comprise a substantial area to reduce resistance and inductance. Gate lead 514 is fastened to ceramic mount ring 513 to electrically and physically isolate it from die mount 512. Similarly, drain lead 515 is mounted on the opposing side of ceramic mount ring 513.

As mentioned previously, ceramic mount ring 513 is non-conductive so gate lead 514 and drain lead 515 are not electrically coupled together nor to die mount 512. Gate lead 514 is electrically coupled to the gate of die 511 through a number of gate wire bonds 516. Similarly, drain lead 515 is electrically coupled to the drain of die 511 through a number of drain wire bonds 517.

It should be noted that RF power transistor die 511 has a long and narrow aspect ratio. This is done intentionally to minimize the length of gate wire bonds 516 and drain wire bonds 517 to reduce inductance. In general, a radio frequency power transistor operating at high frequencies and power will have a large active transistor area that requires more than one drain wire bond. In fact, distribution of the wire bonds is critical to minimize the resistive path to active areas of the RF power transistor die 511.

A cap (not shown) is placed on and fastened to an upper surface of ceramic mount ring 513 such that the cavity is covered thereby protecting the gate wire bonds 516, drain wire bonds 517, and die 511 from the external environment.

Semiconductor package 509 is a low cost package that has been widely used for RF power transistors operating at frequencies up to 2 gigahertz. One aspect of semiconductor package 509 is die mount 512 which contacts the source of die 511 through the backside of the die. Typically, the source of die 511 is coupled to ground in an amplifier application. Electrically coupling through the backside of RF power transistor 511 provides a large thermal pathway to die mount 512 to dissipate heat.

Unfortunately, the use of gate wire bonds 516 and drain wire bonds 517 causes unwanted problems. Gate wire bonds 516 and drain wire bonds 517 add parasitic resistance and inductance to RF power transistor 511. This has proven problematic at best and can severely degrade the performance of the device, for example transistor bandwidth. In particular, gate wire bonds 516 and drain wire bonds 517 are in series respectively with gate lead 514 and drain lead 515. Die 511 operating at high frequencies has reduced operating efficiency due to the parasitic inductance. Shunt capacitors are often added to reduce the problems due to parasitic inductance. A shunt capacitor could be added in parallel with gate wire bonds 516 or drain wire bonds 517. However, the shunt capacitors have to be matched to the actual parasitic inductance such that the input impedance of semiconductor package 509 matches the impedance of the external circuit driving the device. Impedance mismatch due to variation in capacitance or inductance values results in a loss of efficiency. Adding shunt capacitors to semiconductor package 509 to reduce these high frequency problems also increases cost.

Perhaps more important is the fact that parasitic electrical components and thermal transfer characteristics of semiconductor package 509 degrades the bandwidth and the linearity of the device. Linearity is an important characteristic. In general, parasitics change the operating characteristics of a radio frequency device to be more non-linear. Linearity is critical in the ability of a device to transmit information accurately. For high speed wireless data applications, the amount of channels that can be operated in a given bandwidth is directly related to the linearity of the power amplifier. Using power transistors that have non-linear characteristics generates noise signals that are coupled to adjacent channels. Data can be lost if the noise is high enough. Moreover, the main solution to reduce this problem is to increase the bandwidth of each channel thereby decreasing the amount of channels that can be transmitted over a given bandwidth.

FIGS. 27-28 are substantially similar to FIGS. 1-2 previously discussed but are included in this point of the discussion of the package aspects of this invention for ease in reference. FIG. 27 is a top view of a radio frequency (RF) power transistor die 520 in accordance with the present invention. RF power transistor die 520 has a first electrode interconnection region 521 and control electrode interconnection region 522 on a first major surface of RF power transistor die 520. A second electrode interconnection 510 region (see, e.g., FIG. 21)) is provided on a second (bottom) major surface of 520.

As mentioned previously, a radio frequency power semiconductor device according to this invention finds particular (but not exclusive) utility as a device that operates at frequencies greater than 500 megahertz and dissipates more than 5 watts of power for purposes of describing the radio frequency package disclosed herein. In particular, a RF power transistor in cellular communication gear is operated under some of the most severe conditions when compared to other devices. For example, in a class-A power amplifier the transistor is biased to a level where the device is dissipating about the maximum power output of the amplifier continuously, 24 hours a day, 365 days a year. Class-A operation is desirable in a cellular RF power amplifier for increased linearity. The transistor and package are designed to meet these thermal characteristics with an expected mean time to failure exceeding 34 years. In general, the die must be maintained at a temperature 200 degrees centigrade or less to achieve the mean time to failure specification. Lowering the temperature greatly increases device reliability. Thus, the package interaction to the die is critical in both the electrical and thermal performance. Moreover, RF high power transistor device specifications are probably the most difficult to meet and thus the transistor/package disclosed herein is capable of meeting the needs of almost all other discrete transistor applications.

In an embodiment of RF power transistor die 520, first electrode interconnection region 521, control electrode interconnection region 522, and the second electrode interconnection region are respectively coupled to a source, gate, and drain of RF power transistor die 520. Other embodiments are also possible using this contact scheme for different device types. First electrode interconnection region 521 is an exposed metal layer centrally located over the active area of RF power transistor die 520. Ideally, first electrode interconnection region 521 has multiple connections distributed throughout the active area of RF power transistor die 520 to the source of the die 520 to minimize the contact resistance to each transistor cell. The use of first electrode interconnection region 521 to connect to the source of an MOS device is for illustrative purposes only and can be used for device regions depending on the semiconductor device configuration.

In an embodiment of RF power transistor die 520, control electrode interconnection region 522 is formed as a ring around first electrode interconnection region 521. The ring is an exposed metal layer that couples to the gate of RF power transistor die 520. In general, the same metal interconnect layer of the wafer process would be used to form both first electrode interconnection region 521 and control electrode interconnection region 522 thereby making them substantially planar to one another. A space 523 comprises an insulative material such as silicon dioxide for electrically isolating first electrode interconnection region 521 from control electrode interconnection region 522. Forming the control electrode interconnection region 522 as a ring allows interconnection from all sides of the active area to minimize the resistance of the connection. Ideally, control electrode interconnection region 522 is formed to reduce parasitic capacitance coupled to the RF power transistor to increase performance and linearity.

In an embodiment of RF power transistor die 520, solder is used to couple first electrode interconnection region 521 and control electrode interconnection region 522 to leads of a package. Space 523 is sufficiently wide to prevent any potential bridging of the solder either during its initial application or in other subsequent reflow steps. Although control electrode interconnection region 522 is shown as a continuous ring around first interconnection region 521 it could be made in separate pieces if beneficial. Similarly, first electrode interconnection region 521 is not required to be a contiguous metal layer but could be broken into more than one contact. In one embodiment, forming control electrode interconnection region 522 as a contiguous ring is desirable for making a hermetically sealed package as will be described in more detail hereinafter. Control electrode interconnection region 522 as a gate contact is for illustrative purposes only and can be used as a gate or drain contact depending on the semiconductor device configuration.

In an embodiment of RF power transistor die 520, the RF power transistor is formed in an epitaxial layer 525. Epitaxial layer 525 underlies first electrode interconnection region 521. In an embodiment of RF power transistor die 520, a dielectric platform 524 is an isolation region that comprises a dielectric material. Control electrode interconnection region 522 overlies dielectric platform 524 to reduce parasitic capacitance. Dielectric platform 524 reduces gate to drain capacitance and increases a breakdown voltage of the RF power transistor.

As described above a metal layer 510 (FIG. 21) is formed on the backside of the substrate as the second electrode interconnection region. The metal layer is a low resistance electrical conductor coupling to the substrate. Solder can be applied to the metal layer for coupling to a lead. The second electrode interconnection region corresponding to the drain of the device is for illustrative purposes only and can be other electrodes of a RF power device depending on the configuration.

FIG. 28 is a cross-sectional view of radio frequency power transistor die 520 of FIG. 27. RF power transistor die 520 has a first major surface and a second major surface. On the first major surface of RF power transistor die 520, first electrode interconnection region 521 and control electrode interconnection region 522 are exposed for coupling to leads of a RF package. In an embodiment of die 520, first electrode interconnection region 521 is centrally located on the first major surface. Furthermore, the active area of die 520 substantially underlies first electrode interconnection region 521 to ensure maximum thermal transfer and minimum resistance when coupled to leads of the RF package disclosed herein. The active area of die 520 is the area where transistor cells of RF power transistor die 520 are formed.

Control electrode interconnection region 522 is formed in a ring around first electrode interconnection region 521. In an embodiment of die 520, a dielectric platform 524 underlies control electrode interconnection region 522. Dielectric platform 524 is an isolation region comprising dielectric material that separates control electrode interconnection region 522 from an epitaxial layer 525 and a buried layer 538 of die 520. Dielectric platform 524 reduces a gate to drain capacitance and increases a breakdown voltage of the RF power transistor.

In an embodiment of the RF power transistor, die 520 comprises a substrate 536, a buried layer 538 overlying substrate 536, and epitaxial layer 525 overlying buried layer 538. In an embodiment of die 520, the second major surface is masked, patterned, and etched. The etch removes substrate 536 in the non-masked areas forming a cavity 537. Buried layer 538 is used as an etch stop because it is doped an opposite type as substrate 536. A portion of substrate 536 remains near the periphery of die 520. The remaining portion of substrate 536 forms a ring or frame that stiffens and supports the thin active area of the RF power transistor overlying cavity 537. Thinning die 520 aids in lowering Rdson of the device and the thermal resistance to remove heat. The second electrode interconnection region 501 is formed in cavity 537 overlying exposed buried layer 538. The shape of cavity 537 is useful in aligning a lead to contact the second electrode interconnection region as will be described later herein below.

FIG. 29 is a top view of a RF power transistor package 540 in accordance with an embodiment of the present invention. RF power transistor package 540 comprises a first external contact or lead 541, a second lead 542, a third lead 543, and an isolation ring 544. First lead 541, second lead 542, and third lead 543, respectively correspond to a source lead, gate lead, and drain lead. RF power transistor die 520 of FIGS. 27 and 28 is mounted in package 540.

A die mount pedestal 545 underlying RF power transistor die 520 is centrally located on first lead 541. Die mount pedestal 545 is formed on first lead 541 as a raised area that has a surface area smaller than die 520. This configuration allows both the first and control electrode interconnection regions of die 520 to be coupled respectively to lead 541 and lead 542 in a manner that is easily manufactured, reduces parasitic resistance/capacitance/inductance, and removes heat from the die efficiently.

An insulation ring 544 surrounds die 520 and die mount pedestal 545 Insulation ring 544 is made of a non-conductive material such as a ceramic or plastic material. In an embodiment of RF power transistor package 540, insulation ring 544 is made of a ceramic material.

First lead 541 is a contact that provides external connection to the first electrode interconnection region 521 on die 520. In such manner, access is obtained to the sources of the transistor cells. First lead 541 is a metal lead, typically copper, copper-tungsten alloy, or other low resistance thermally conductive metal. Referring to back to FIG. 27, die mount pedestal 545 couples to first electrode interconnection region 521 of FIG. 27. Die mount pedestal 545 is made of electrically conductive material and is coupled to first lead 541. Pedestal 545 could be formed integral with lead 541, if desired. As mentioned previously, the source of a RF power transistor is typically coupled to ground.

Referring back to FIG. 29 first lead 541 has extremely low resistance and inductance. In an embodiment of package 540, inductance is minimized by coupling first lead 541 to first electrode interconnection region 521. In particular, the large surface of die mount pedestal 545 is coupled to first electrode interconnection region 521 through an electrical and thermal conductive material such as solder or conductive epoxy. The electrical and, thermal conductive material physically attaches first electrode interconnection region 521 to die mount pedestal 545. It should be noted that first electrode interconnection region 521 substantially overlies the active area of the RF power transistor. Thus, coupling first lead 541 essentially directly thereto results in low resistance, low thermal resistance, and low inductance as compared to the use of conventional wire bonds.

Figure 32:
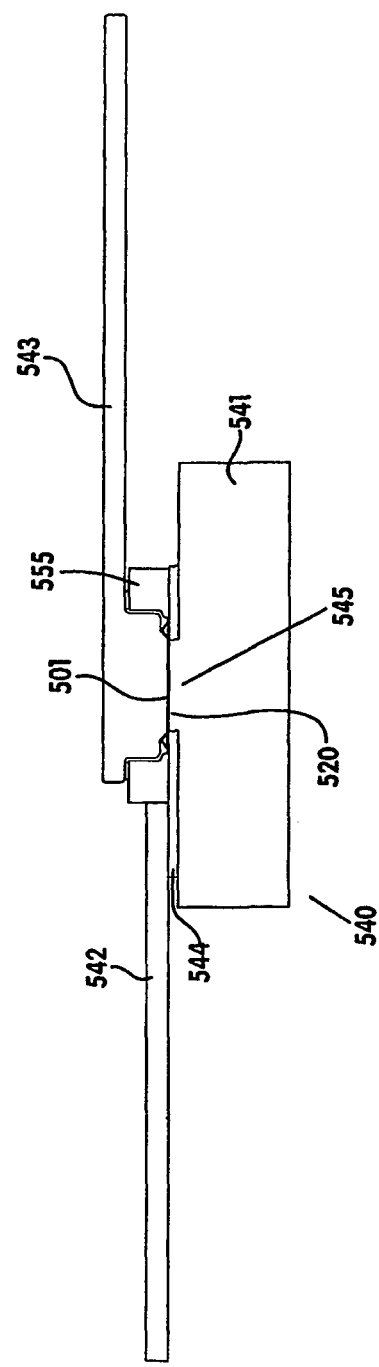
FIG. 32 is a cross-sectional view of the RF power transistor package of FIG. 29 in accordance with the present invention.

Referring also to FIG. 32, the large exterior surface of first lead 541 when coupled to a printed circuit or power amplifier module ground provides an ideal electrical and thermal coupling. Removing heat is an important factor in RF device performance and long-term reliability. First lead 541 will often be coupled to a heat sink on a printed circuit board 546 to efficiently remove heat. Liquid cooled or forced air heat sinking is useful to bring die temperatures lower when operating at high power such as when the printed circuit board 546 is part of a transmitter in a cellular base transceiver station.

Second lead 542 is mounted to isolation ring 544. Inner portions of second lead 542 are electrically connected to a metal layer formed within or on isolation ring 544. Inner portions of the metal layer correspond in shape to the annular control electrode interconnection region 522 of FIG. 27 in the form of an interconnect ring. This will be shown in greater detail herein below. The inner interconnect ring of isolation ring 544 is further electrically coupled by way of the metal layer to an outer interconnect region on isolation ring 544 where second lead 542 is attached. Thus, the control (gate) electrodes of the cells comprising the RF power transistor are also coupled to second external metal lead 542 without wire bonds. The interconnect between second lead 542 and control electrode interconnection region 522 is low in resistance and low in inductance. Inductance and resistance are greatly reduced when compared to prior art packages. Furthermore, the gate to source parasitic capacitance due to first lead 541 and second lead 542 can be kept to a minimum by utilizing a low k dielectric material for isolation ring 544 and spacing each away from one another. Also, it is believed that no shunt capacitors are required yet the maximum useable frequency response of die 520 is achieved through the design of RF power transistor package 540.

Third lead 543 is coupled to the drain interconnection 510 of die 520. Referring back to FIG. 27, third lead 543 directly connects to the backside drain interconnection 510 (FIG. 21). Third lead 543 is coupled to the second major (back side) surface of die 520. Wire bonds are again not used in providing external connection to the drain of the power transistor. Die 520 has significantly reduced parasitic resistance and inductance when packaged in accordance with the teachings of this invention, resulting in little or no loss in operating efficiency. Furthermore, third lead 543 provides another heat sink for die 520. Since third lead 543 contacts a large portion of the die 520, it is an excellent thermal pathway to remove heat. RF power transistor package 540 is almost a perfect thermal conductor to remove heat from die 520 because it has the capability to remove heat from both the top and bottom of the die 520.

Having two thermal paths allows more choices in a thermal strategy in the operation of the RF power transistor die 520. In a first strategy, additional external heat sinks can be coupled to both first lead 541 and third lead 543 to rapidly remove heat from RF power transistor die 520 and operate at as low a die temperature as possible. A second strategy regulates the temperature of the die to minimize temperature fluctuations. A stable or constant die temperature greatly reduces thermally induced non-linearities in the RF power transistor due to changing operating conditions. Non-linear behavior by the RF power transistor generates distortion components that affect power amplifier performance in radio frequency applications.

FIG. 30 is an illustration of a first lead 541 of a radio frequency power transistor package 540. First lead 541 electrically couples to first electrode interconnection region 521 of FIG. 27 and is a thermal path for conducting heat away from the die 520 of FIG. 2. First lead 541 typically is made from metal, for example copper or copper-tungsten alloy. First lead 541 comprises a main body 541 and die mount pedestal 545. First lead 541 can be mounted such that a major surface 550 is coupled to a substrate or a heat sink. First lead 541 is sized to be a substantial thermal mass and low resistance contact. Die mount pedestal 545 is shaped similarly to first electrode interconnection region 521 of FIG. 27. The surface of die mount pedestal 545 is equal to or smaller than first electrode interconnection region 521. In general, lead 541 and die mount pedestal 545 are made of the same material and can be formed from a single piece of metal using a stamping process, a casting process or other manufacturing process known to one skilled in the art.

FIG. 31 is a top view of first lead 541. In an embodiment of package 540, die mount pedestal 545 is centrally located on first lead 541. Typically, lead 541 is substantially larger than radio frequency power transistor die 520 of FIG. 2. Lead 541 forms a large thermal mass for pulling heat from die 520. The large size also reduces the resistance of lead 541. Slots can be formed in first lead 541 to simplify fastening of the package to a heat sink or substrate.

FIG. 32 is a cross-sectional view of RF power transistor package 540. Isolation ring 544 overlies a major surface of first lead 541. The first electrode interconnection region 521 of RF power transistor die 520 couples to die mount pedestal 545 of first lead 541. A portion of die 520 overlies isolation ring 544.

The interconnect ring formed on isolation ring 544 couples to control electrode interconnection region 522 of die 520. The interconnect ring on isolation ring 544 forms a contact region on isolation ring 544. Second lead 542 couples to the contact region on isolation ring 544 thus coupling second lead 542 to the control electrode interconnection region.

An annular collar or isolation ring 555 overlies isolation ring 544. Isolation ring 555 aids in the alignment of third lead 543 to die 520. Isolation ring 555 also aids in forming a hermetic seal to isolate die 520 from an external environment. Isolation ring 555 is made from a non-conductive material such as ceramic or plastic. In an embodiment of package 540, second lead 542 is exterior to isolation ring 555.

Third lead 543 couples to the second electrode interconnection region 501 on the second major surface of die 520. Note that third lead 543 is shaped complementarily to the cavity defined by ring 555.

In particular, a contact surface is shaped similar to the second major surface of die 520 to couple to the second electrode interconnection region. Third lead 543 includes outer walls that slidingly fit within the inner walls of isolation ring 555 to aid in aligning the lead 543 with die 520 during assembly. Third lead 543 also has a portion that extends over an upper surface of isolation ring 555. This feature or lip of third lead 543 attaches to the upper surface of isolation ring 555 forming a hermetic seal.

Figure 33:
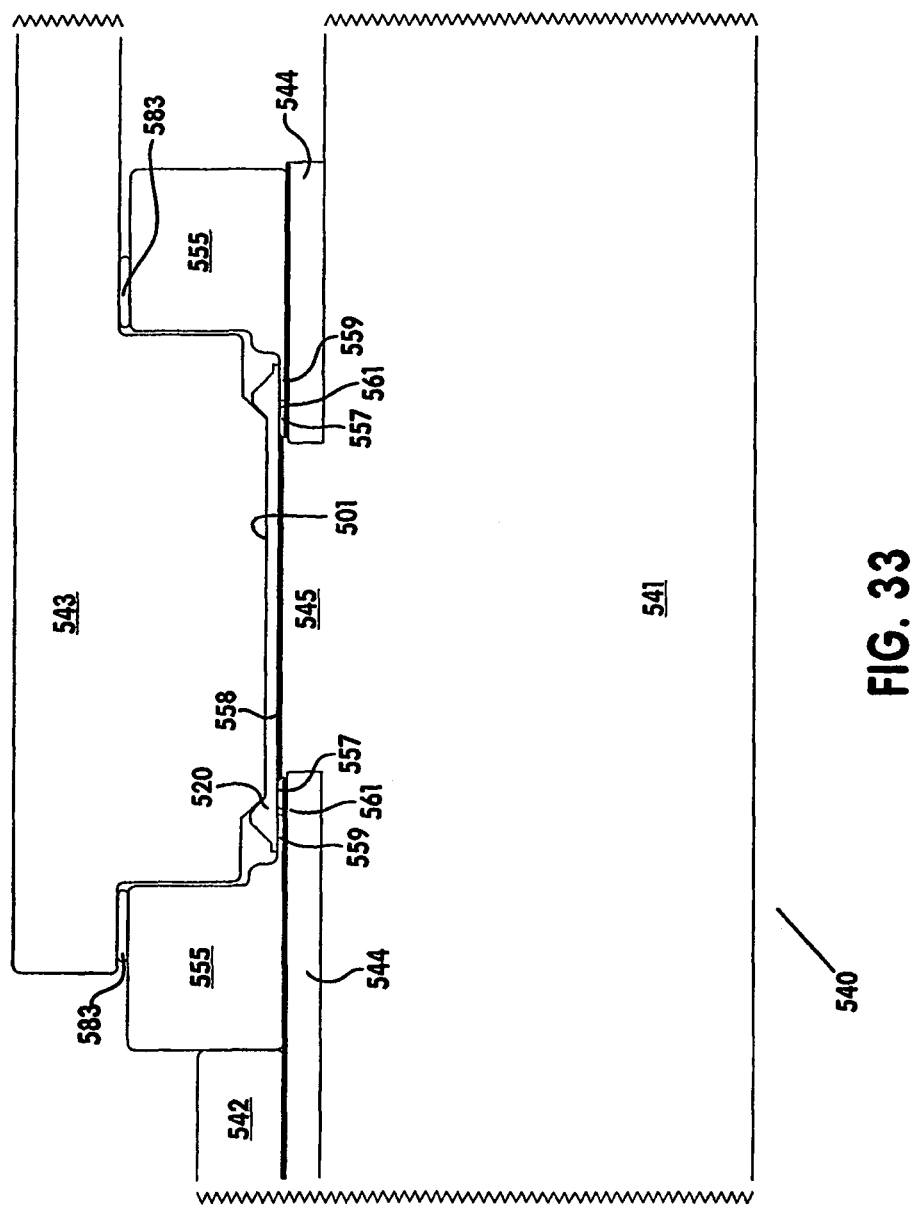
FIG. 33 is an enlarged cross-sectional view of a portion of the RF power transistor package illustrated in FIG. 32.

FIG. 33 is an enlarged cross-sectional view of the package 540 illustrated in FIG. 32. In particular, the central area of package 540 where the RF power transistor die 520 is coupled to first lead 541, second lead 542, and third lead 543 is shown in more detail.

In an embodiment of the RF power transistor, the first electrode interconnection region 521 is centrally located on the first major surface of die 520 overlying the active area of the device while the control electrode interconnection region 522 is formed as a ring around the first electrode interconnection region 521. First lead 541 includes die mount pedestal 545 that couples to the first electrode interconnection region 521 of die 520. Isolation ring 544 couples to first lead 541 and includes an opening which die mount pedestal 545 protrudes. Die mount pedestal 545 is approximately the same size as the first electrode interconnection region 521 or smaller to prevent shorting to the third electrode interconnection region. Isolation ring 544 is made from a non-electrically conductive material. In an embodiment of package 540, the surfaces of isolation ring 544 and die mount pedestal 545 are parallel to one another but the surface die mount pedestal 545 is above the surface of isolation ring 544.

In general, die mount pedestal 545 electrically couples to the first electrode interconnection region 521 of die 520. Die mount pedestal 545 couples to the active area of the first major surface of die 520 to provide a thermal path to remove heat from die 520 through first lead 541. In particular, die mount pedestal 545 couples to the majority of the active area of the RF power transistor that is conducting a substantial current. In an embodiment of package 540, first lead 541 is made of metal such as copper or copper-tungsten alloy and is physically and electrically coupled to the first electrode interconnection region 521 by a solder layer 558, electrically conductive epoxy or other equivalent means.

Outer edges of die 520 overhang die mount pedestal 545. In one embodiment the control electrode interconnection region 522 is formed as a ring around the first electrode interconnection region 521. The control electrode interconnection region 522 is on the region of die 520 that overhangs die mount pedestal 545. The amount of overhang is approximately the same on each side of die mount pedestal 545.

Isolation ring 544 underlies the region of die 520 that overhangs die mount pedestal 545. As mentioned previously, isolation ring 544 is placed such that a first major surface overlies first lead 541 and is adjacent to die mount pedestal 545. In this embodiment, second lead 542 does not directly contact die 520. Second lead 542 is supported by a second major surface of isolation ring 544. Isolation ring 544 includes a metallic layer or interconnect 561 that couples lead 542 to the control electrode interconnection region 522 of die 520. Interconnect 561 may be formed on or within isolation ring 544.

Isolation ring 544 is a non-electrically conductive, non-porous material such as ceramic, plastic, or organic material. Isolation ring 544 is bonded or attached to first lead 541 in a sealed manner. In an embodiment of package 540, the second major surface of isolation ring 544 is below a surface of die mount pedestal 545. The height difference between the second major surface of isolation ring 544 and the surface of die mount pedestal 545 accommodates solder 557 that couples the control electrode interconnection region 522 on die 520 to interconnect 561 on isolation ring 544. For example, interconnect 561 is formed in a corresponding ring shape that aligns to the control electrode interconnection region 522.

Coupling the ring shaped portion of interconnect 561 to the control electrode interconnection region 522 with solder 557 seals a perimeter of die 520, hermetically sealing the active area of die 520 from an external environment. Other materials such as a conductive epoxy could be used in place of solder 557.

Isolation ring 555 overlies isolation ring 544. Die mount pedestal 545 protrudes through the opening in isolation ring 555. Isolation ring 555 separates second lead 542 from third lead 543, aids in the alignment of third lead 543 to RF power transistor die 520, and is part of the housing of RF power transistor package 540. Isolation ring 555 is a non-electrically conductive, non-porous material such as a ceramic, plastic, or organic material. Isolation ring 555 does not have to be a separate component but can be formed as part of isolation ring 544. If isolation ring 555 is a separate component, it is attached to isolation ring 544 by an appropriate methodology that physically holds it in place and is sealed. In an embodiment of package 540, isolation ring 555 is coupled or fastened to interconnect 561 on isolation ring 544. As shown, sharp corners on isolation ring 555 are chamfered to reduce stress on the material.

Isolation ring 555 includes a inwardly projecting finger region 559 that underlies an edge of die 520 to provide support for outer portions of die 520. Third lead 543 is shaped to fit within isolation ring 555. In an embodiment of the RF power transistor, the second major surface of die 520 is etched to have a predetermined shape. Third lead 543 is shaped similarly to the etched second major surface of die 520 to aid in coupling third lead 543 to die 520. An inner wall of isolation ring 555 retains third lead 543 from moving a significant distance laterally. An upper surface of isolation ring 555 also supports and seals to third lead 543 as it extends beyond the package. Third lead 543 is attached to the upper surface of isolation ring 555 to hermetically seal die 520 from an external environment.

Third lead 543 physically and electrically couples to the second electrode interconnection region 501 on the second major surface of die 520. Third lead 543 is coupled to the second electrode interconnection region 501 using solder, conductive epoxy or other equivalent means. As shown, the second electrode interconnection region 501 is located in a cavity 537 as shown in FIG. 28 that aids in alignment when coupling third lead 543 thereto. In an alternate embodiment, the second major surface of die 520 is planar. Third lead 543 then couples to the second electrode interconnection region 501 on the planar second major surface of die 520. Isolation ring 555 aids in aligning third lead 543 to the second electrode interconnection region in this alternate embodiment. In either case, third lead 543 is coupled to the second electrode interconnection region 501 of the RF power transistor.

Third lead 543 is made of metal such as copper or copper-tungsten alloy. Third lead 543 is a thermal path for removing heat from die 520. Thus, RF power transistor package 540 minimizes lead inductance by coupling first lead 541 and third lead 543 to die 520 without wire bonds. The thermal resistance of package 540 is substantially reduced by removing heat from both sides of die 520 through first lead 541 and third lead 543. Moreover, package 540 simplifies assembly and lowers manufacturing costs of a high power radio frequency transistor.

Figure 34:
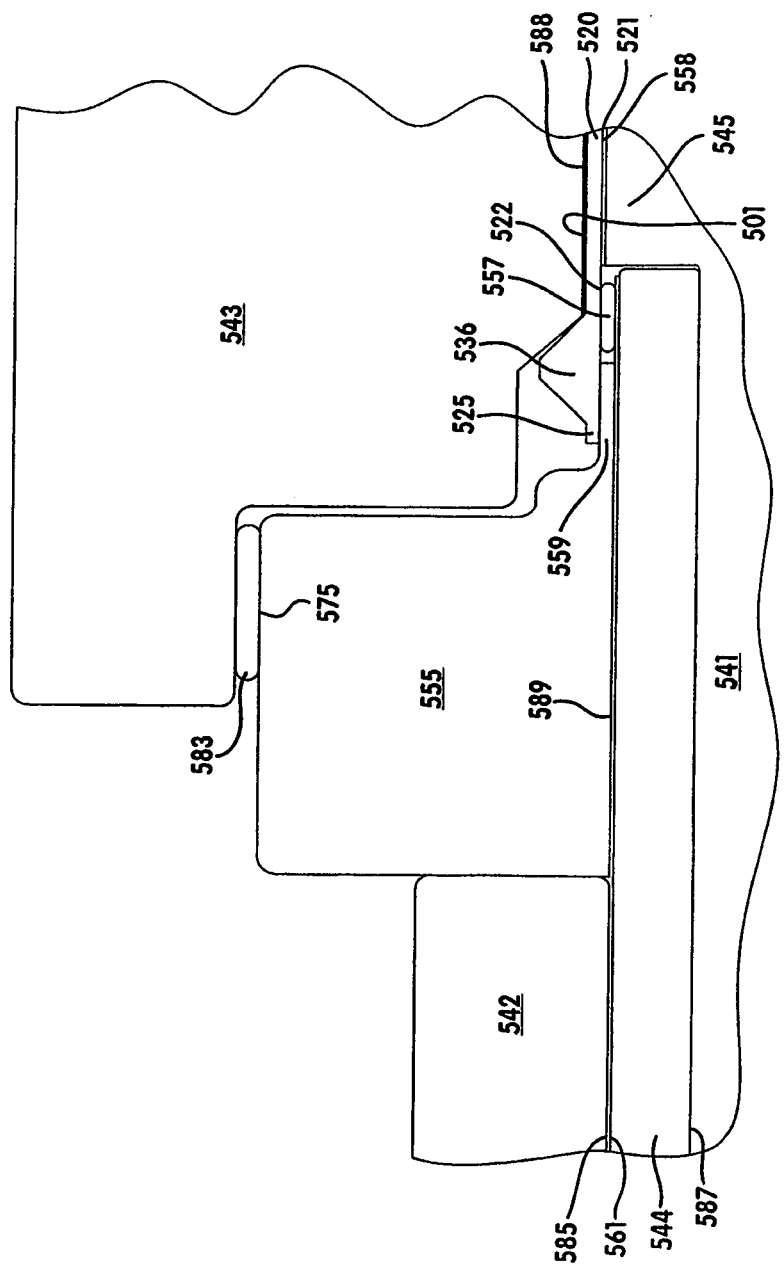
FIG. 34 is a further magnified view of the RF power transistor package of FIG. 33.

FIG. 34 is a further magnified view of RF power transistor package 540 of FIG. 33. The magnified view better illustrates how components of RF power transistor package 540 are attached together. In an embodiment of package 540, the first major surface of isolation ring 544 has a metallic layer 587 for coupling with first lead 541. Metallic layer 587 is bonded securely to the first major surface. In an embodiment where isolation ring 544 is a ceramic material, a high temperature reflow process can be performed to bond metallic layer 587 to first lead 541. The high temperature reflow process securely fastens isolation ring 544 to first lead 541 such that subsequent manufacturing steps do not affect bonding.

Second lead 542 and isolation ring 555 are coupled to the second major surface of isolation ring 544. In an embodiment of package 540, interconnect 561 is formed on the second major surface of isolation ring 544. A bottom surface of isolation ring 555 includes a metallic layer 589. Metallic layer 589 is securely fastened to isolation ring 555. In an embodiment of package 540, isolation ring 555 is made of ceramic. A high temperature reflow process can be performed to bond metallic layer 589 to interconnect 561. Other known high temperature coupling methodologies can also be used. In an embodiment of package 540, second lead 542 abuts isolation ring 555 and is coupled to interconnect 561 on isolation ring 544 by a high temperature solder. The physical attachment of second lead 542 and isolation ring 555 to isolation ring 544 is not affected by subsequent manufacturing steps to produce package 540.

Solder 557 and solder 558 are used to respectively couple control electrode interconnection region 522 of die 520 to interconnect 561 on isolation ring 544 and first electrode interconnection region 521 to die mount pedestal 545. Solder 588 couples third lead 543 to the second electrode interconnection region 501 on the second major surface of die 520. In an embodiment of package 540, the upper surface of isolation ring 555 includes a metallic layer 575 formed thereon. Solder 583 couples third lead 543 to the upper surface of isolation ring 555 such that lead 543 and isolation ring 555 form a hermetic seal to isolate die 520 from an external environment.

A methodology for assembling radio frequency power transistor package 540 begins with two assemblies. A first assembly is made by physically and electrically attaching die 520 to third lead 543. Third lead 543 can then be used as a handle to move and position die 520 for subsequent steps. The attachment methodology of third lead 543 to die 520, for example solder 588, is selected to be unaffected by subsequent manufacturing or thermal steps to form package 540.

A second assembly comprises first lead 541, isolation ring 544, isolation ring 555, and second lead 542. Isolation ring 544 is attached to first lead 541. Isolation ring 555 is attached to isolation ring 544. Second lead 542 may also be attached to interconnect on isolation ring 544 if desired or can be attached in a later step. Similar to that described above, the attachment processes employed are unaffected by subsequent manufacturing or thermal steps to form package 40.

Solders 557, 558, and 583 are placed on a predetermined surface. The surface on which the solder is placed is selected to simplify and ensure uniform solder placement. For example, solder 583 can be placed on third lead 543, metal layer 575, or both. In an embodiment of package 540, lead 543 and die 520 is fitted within the opening of isolation ring 555. Solder 557 is coupled between control electrode interconnection region 522 of die 520 and interconnect 561. Solder 558 is coupled between first electrode interconnection region 521 of die 520 and die mount pedestal 545. Finally, solder 583 is coupled between third lead 543 and metal layer 575. Package 540 can be placed in an oven, furnace or hot plates so that solders 557, 558, and 583 reflow to form a physical bonding connection.

The amount and thickness of solder 557, 558, and 583 are selected to ensure consistent connections are formed under the tolerances and variations of the manufacturing process. It may also be beneficial to utilize solders of different temperatures to allow one solder to reflow before another. Pressure may also be applied to package 540 to ensure coupling of solders 558, 558, and 583 during the reflow process.

FIGS. 35-42 illustrate an alternative embodiment for the package of this invention. In this embodiment the die 520' is shown has a flat thinned wafer instead of the die 520 having the backside cavity formed therein. The external lead for the drain in this embodiment has two parts: a drain stub 600 and a terminal 602. The drain stub 600 has an inner portion which is substantially complementary with the second interconnection region 501 (FIG. 28) on the backside of die 520' physically attached using an electrically conductive material such as a solder preform 604. It should be noted that solder or solder preforms are described hereinbelow to electrically and physically connect metal regions together but other attachment methodologies can be used such as an electrically conductive organic adhesive, dispensed solder, conductive bumping, eutectic bonding or other known attaching methodologies.

Turning to FIG. 36, the source lead 606 is substantially similar to the earlier embodiment and includes a pedestal 608 for receiving the front side of die 520'. An insulating material 610 is formed on source lead 606 in proximity to pedestal 608. In an embodiment of the package, insulating material 610 comprises one or more regions formed on an upper surface of source lead 606. For example, insulating material 610 comprises a ring shaped region surrounding pedestal 608 where the upper surface of insulating material 610 is substantially planar to the upper surface of pedestal 608. Insulating material 610 comprises electrically non-conductive material types such as ceramics, polymers, polyimides, beryllia, alumininum nitride, glass, quartz. Insulating material 610 is attached to source lead 606 by injection molding, adhesive, or by metal connection such as solder (to a metal layer on a bottom surface of insulating material 610). The inner end of gate lead 612 is electrically connected (e.g., by way of solder, wirebond, ribbon bond, weld, bumping, conductive adhesive, euctectic bond, etc. . . . ) to a metallization layer 614 on the upper surface of insulating material 610. Similarly, the inner end of drain lead 602 is mounted to a metalized region on the outer portions of insulating material 610 using an attachment method as described hereinabove. The upper inner end of drain lead 602 includes solder 616. As will appear, solder 616 is used to make electrical connection with drain stub 600. A solder preform 618 is also provided. Solder preform 618 generally corresponds with the centralized metallization or first electrode interconnection area 521 (FIG. 27) on the front side of the die 520'. Solder preform 620 corresponds generally in shape with the metallization or interconnection 522 (FIG. 27) on the front side of the die.

An alternate version that includes more than one region of insulating material 610 is described herein to illustrate that insulating material 610 is not limited to being a ring shape. A first region of insulating material 610 is formed adjacent but not surrounding pedestal 608. The upper surface of first region of insulating material 610 is substantially planar to the upper surface of pedestal 608. A portion of the die will overlie and connect to metal interconnect on the upper surface of the first region. A second region isolating material 610 comprises a ring formed on the periphery of the upper surface of source lead 606. Gate lead 612 and Drain lead 602 attach to the second region. A third or fourth region of isolating ring material 610 for mounting other devices can be formed on the upper surface of source lead 606 (in the opening of the ring of the second region) for adding matching networks or mounting devices that will be internal to the package. The devices would be interconnected to form a circuit with the die.

Turning now to FIG. 37, the subassembly of FIG. 35 is now attached to the package base by placing the components together in the orientation shown in FIG. 37 and then heating the subassembly to melt the solder and attach the components together. In this manner, the sources of the transistor cells of the die 520' are coupled together in parallel by way of source lead 606 which provides external connection to the die. Connection to the drain metallization or interconnection 501 (of the die) is made via drain stub 600 and lead 602. Electrical connection to the gate interconnection area 522 is provided by gate lead 612 and metallization layer 614. Finally, a lid 622 is affixed to the upper portion of the package at the periphery of insulating material 610 as shown in FIG. 38 to provide a hermetic seal about the die 520'. Lid 622 comprises a non-conductive material such as ceramic or polymer. An epoxy or adhesive is used to fasten lid 622. In an embodiment of the package, lid 622 is formed to fit around leads 602 and 612. Alternately, a glop top or non-conductive encapsulation could also be used to seal the die from an external environment.

It should also be noted that, while the above examples of the package have been illustrated with three leads, the present invention contemplates more than three leads. For example, multiple gate leads could be coupled to various points on the non-conductive member adjacent the platform. In addition, the conductor on the non-conductive member could connect to still other leads, or circuitry or components.

Figure 39:
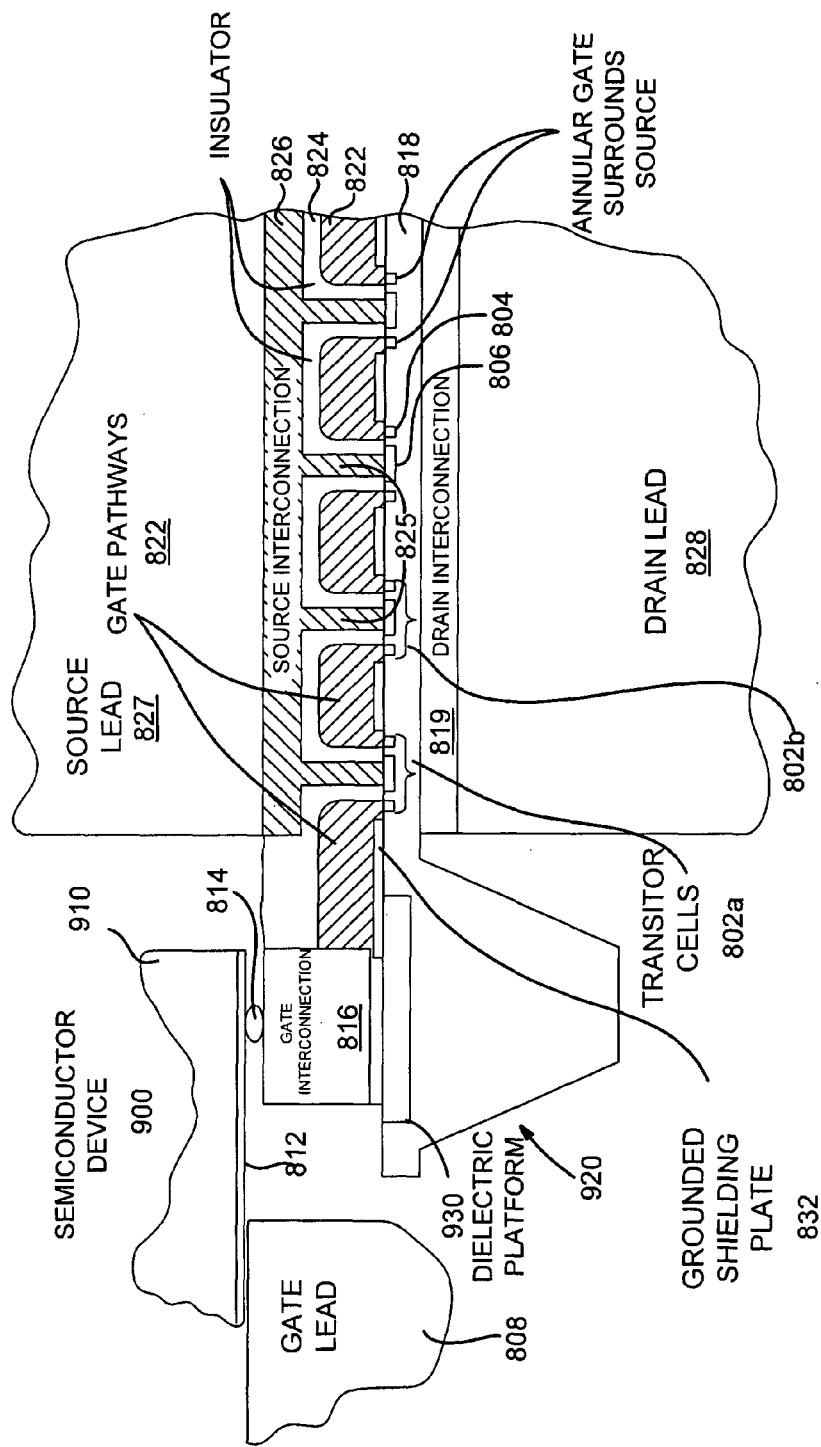
FIG. 39 is a simplified enlarged partial cross-sectional view showing the various interconnections between the die and the leads of the package, in accordance with the teachings of the present invention.
Figure 40:
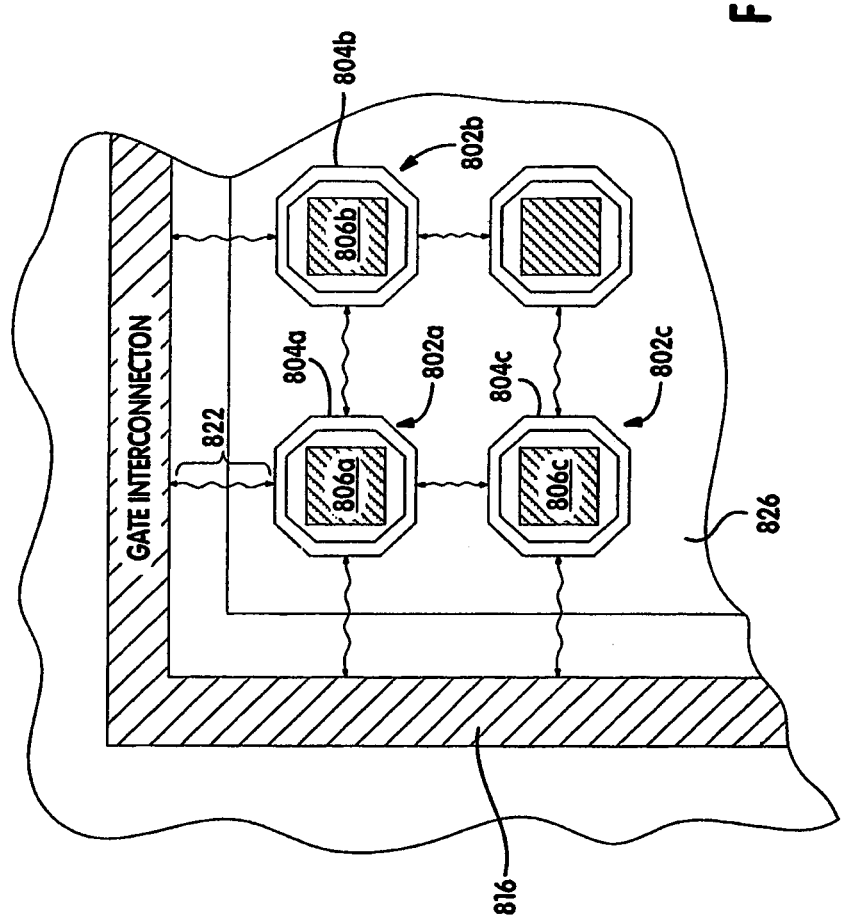
FIG. 40 is a simplified partial top plan view of the device of FIG. 39.

Reference to FIGS. 39 and 40 will be helpful in summarizing certain aspects of the present invention. RF power semiconductor device 900 includes an array of mesh-connected transistor cells 802a, 802b, etc. Each cell 802 includes an annular gate region 804 which surrounds a source region 806. Control signals are applied to the gates 804 of the cells 802 by way of an electrical signal applied to gate lead 808 which is affixed to insulating ring 910 having a conductive metallization layer 812 thereon. Layer 812 is connected via solder 814 to the annular gate interconnection 816 on the surface of semiconductor die 818. The control signal is fed inward from the gate interconnection 816 through gate pathways 822 As perhaps can be seen best in FIG. 40, the gates 804 of all of the transistor cells 802 are connected together in parallel. The signal flow from gate interconnection 816 is radially inwardly through pathways 822 which are connected to the gate regions 804 of the transistor cells 802. The gate pathways are covered with an insulating layer 824 which electrically isolates the gate pathways from the source metallization layer or source interconnection 826 (521 in FIG. 27).

In operation, an appropriate signal on gate lead 808 causes the channel underneath the gate regions to become conductive. As a result, current flows from source lead 827 (normally connected to ground) to drain lead 828. In particular, the current flow is from source lead 827 through source interconnection 826 down through the source regions 806, then through the channel region underneath the gate electrodes, then through the drain interconnection 819 and out through the drain lead 828.

The dielectric platform 930 and grounded shielding plate 832 are shown diagrammatically in FIG. 39. The construction and function of the dielectric platform 930 and grounded shielding plate 832 have been described in detail herein.

Thermal Considerations

Figure 41:
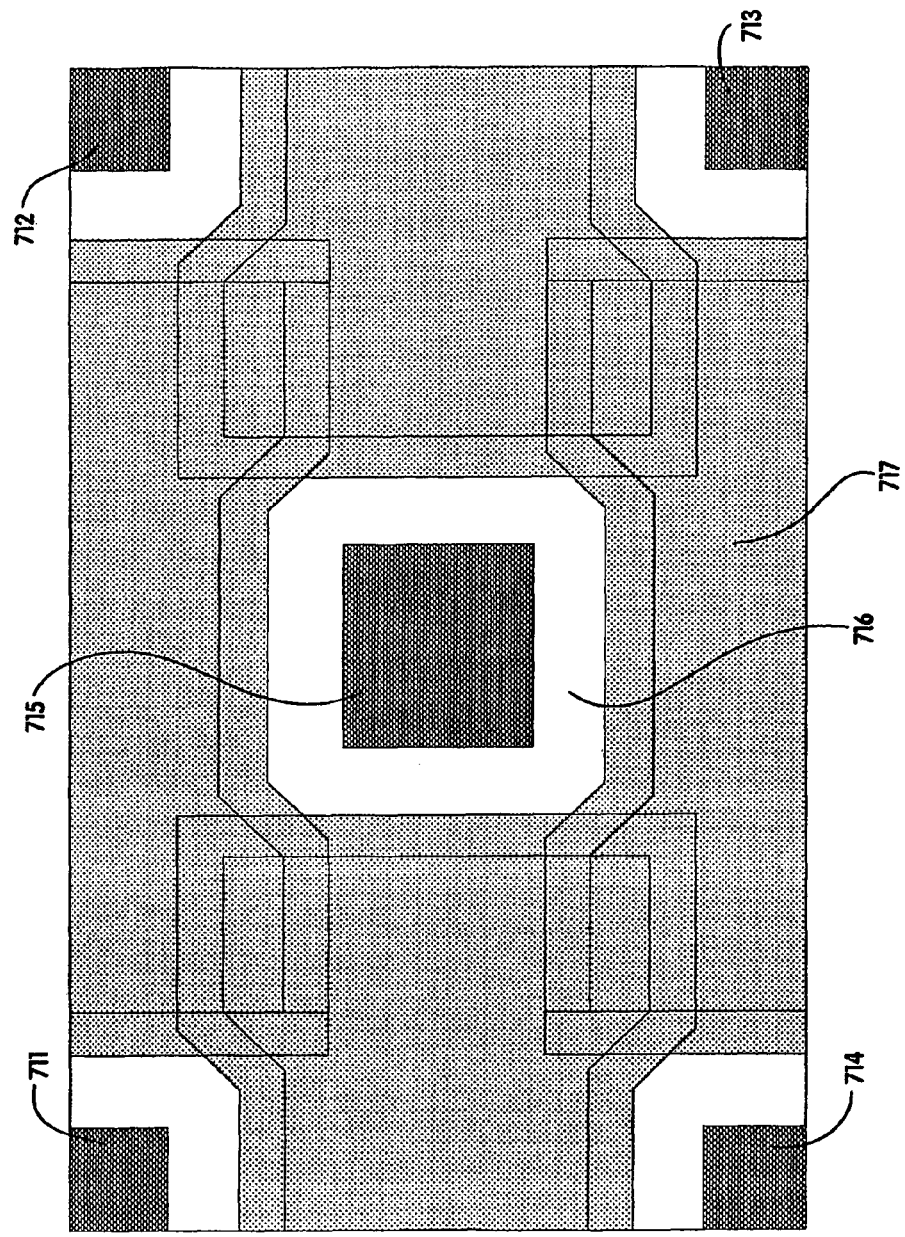
FIG. 41 is a top plan view of a mesh connected cell that can be arrayed to form a larger composite structure, in accordance with an embodiment of this invention.

LDMOS, a type of prior art power transistor most prevalently used for RF amplification today, pulls heat from the bottom side of the device through a heat sink, which is also an electrical source contact. Since large amount of heat underneath n and p-doped regions has to be transmitted through the epitaxial and bulk silicon layers, heat dissipation is less efficient than a case in which thermal energy is pulled out from the top side of the device through a source contact, as in the preferred embodiments of this invention. In the present invention, due to the vertical configuration of the device, heat is mainly dissipated through ohmic contacts 711-715 on the top side of the die as shown in FIG. 41. These ohmic contacts correspond to the metal 825 (FIG. 39) extending downwardly through the vias from the larger, flat source interconnection 826 that contact the silicon of the die.

Ohmic contact 715 in the center of FIG. 41 and adjacent ohmic contacts 711-714 are offset by approximately a quarter of the size of each transistor cell. Source region 716 and gate interconnect 717 are also schematically illustrated. In this instance of the present invention, each transistor cell is of equal width and height, and is somewhat square shaped (in the preferred embodiment the source has eight sides as described hereinabove). In one embodiment, the ohmic contact of a single transistor cell is approximately 1.8 micron by 1.8 micron square.

Figure 42:
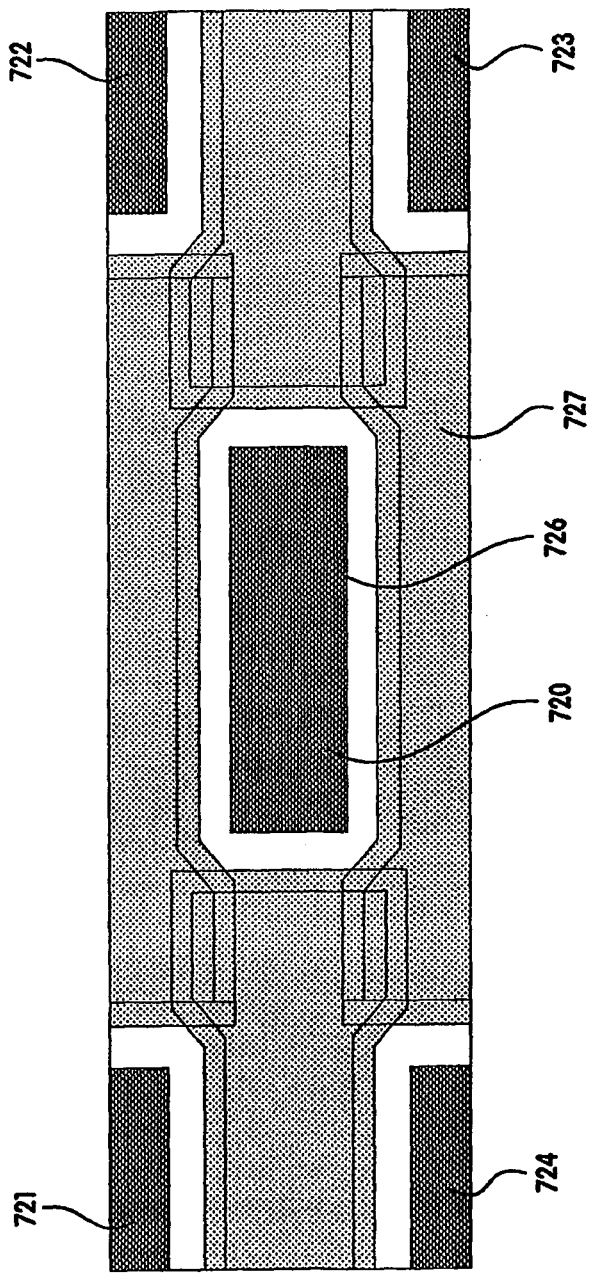
FIG. 42 is a top plan view of a mesh connected transistor cell that can be arrayed to form a larger composite structure, in accordance with an alternative embodiment of the present invention.

While the square cell configuration of FIG. 41 is acceptable for most applications, further improvements can be implemented if desired as shown, for example in FIG. 42. FIG. 42 is similar to FIG. 41 but the dimension of each transistor cell is rectangular, instead of square, to maximize source ohmic contact area. In one embodiment, the dimension of the ohmic contact 720 of a single transistor cell is 6.0 micron by 1.8 micron. Compared to a square transistor cell, a rectangular transistor cell with an ohmic contact of size 6.0 micron by 1.8 micron increases the source ohmic contact region by factor of 3.33. Larger source contact area significantly improves thermal conductivity of each transistor cell by providing a wider area of thermal transfer from heated, active areas of a semiconductor die to colder metal contacts at the source. Furthermore, thermal vectors tend to crowd around the boundaries 726 of ohmic contact 720 relative to its center. Thus, heat from the center of a source ohmic contact has a more difficult time being removed than heat generated near the boundary. Expanding the perimeter (larger contact area) surrounding the ohmic contacts increases the rate at which heat can be removed from each transistor cell through the source contact metal. In addition, the transistor cell array has a meshed cell configuration with equal spacing between transistor cells, thereby preventing heat-dissipating transistor cells to create excessive hotspots caused by constructive overlap of thermal vectors from adjacent cells.

The change in the dimensions of a square ohmic contact to a rectangular ohmic contact is a compromise between current density and thermal characteristics of the device. While some sacrifice of current density may occur, a surprising gain in thermal dissipation more that makes up for the loss. For example, in one instance of the present embodiment, changing a square cell to a rectangular cell configuration resulted in a 13% loss in current density yet a gain of over 40% for thermal dissipation was achieved. Higher thermal dissipation enables the present invention to accommodate higher power at the output, and a relatively minor loss in current density with respect to a high gain in thermal dissipation is a good compromise.

Figure 43:
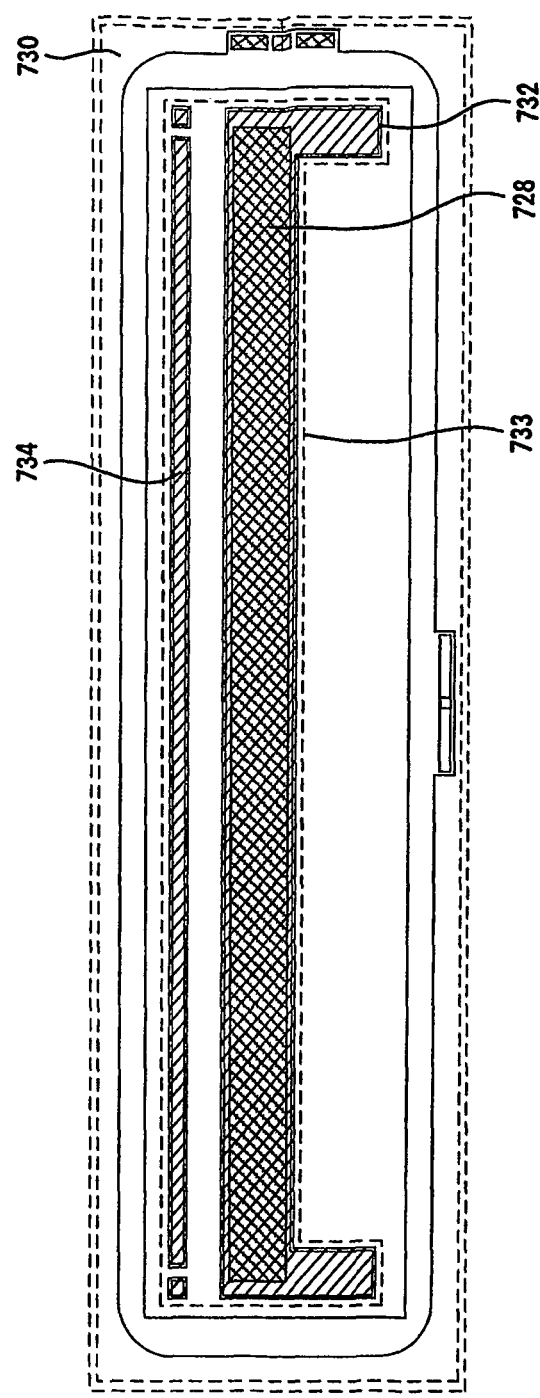
FIG. 43 is a top plan view of a semiconductor die made in accordance with an alternative embodiment of the present invention.

FIG. 43 illustrates another possible improvement where the layout of the entire active area 728 of the die 730 itself has been elongated into a rectangle with a large length/width ratio, preferable exceeding 10:1. The dielectric platform 733 surrounds the active area and the gate electrode interconnection 734 is displaced and runs parallel to active area 728. Suitable pathways (not shown) couple the gate interconnection 734 with the gates in the active area 728. Connections to the drain of the active area can be made in any suitable manner, for example, in the manner previously discussed herein. Source metallization 732 covers the active area and make connection to the sources of the cells in a manner described previously.

The elongated configuration of the active area 728 aids in efficient removal of heat from the device because it provides an increased boundary area about the periphery of the active area. In other words, heat generated in the cells in the middle of active area 728 can escape more efficiently than, for example, when the active area approaches a square-like configuration as show in FIG. 1. One aspect of this embodiment is that the active area 728 has a single active area region that may comprise up to hundreds of thousands of transistor cells, each of which generates a substantial amount of heat. The active area aspect ratio is selected to prevent buildup of "hotspots" due to constructive thermal energy from each transistor cell thereby increasing the efficiency and reliability of the device.

Figure 44:
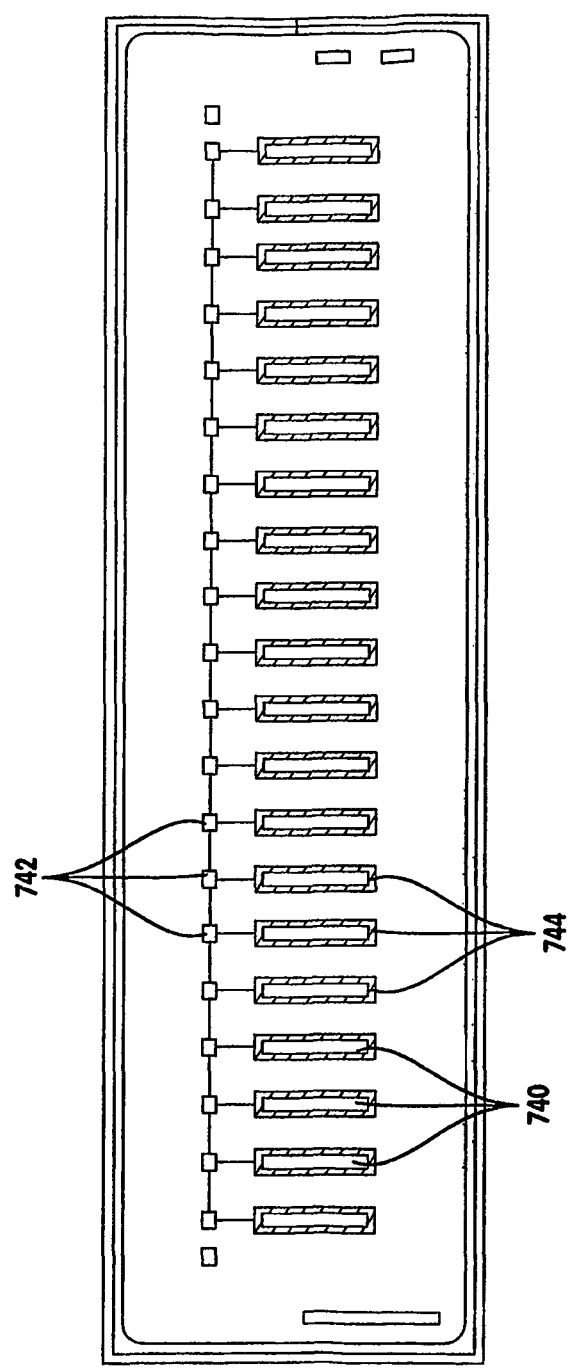
FIG. 44 is a top plan view of still another embodiment of a semiconductor die made in accordance with the teachings of the present invention.
Figure 45:
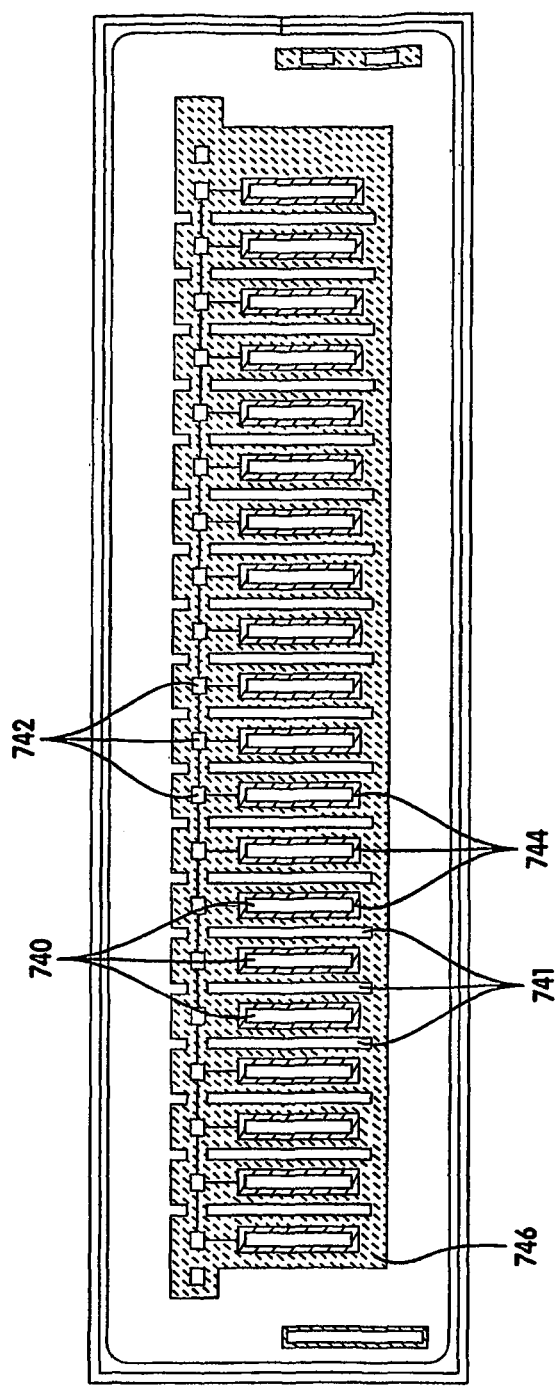
FIG. 45 is a top plan view of the die of FIG. 44 at a subsequent processing stage.
Figure 46:
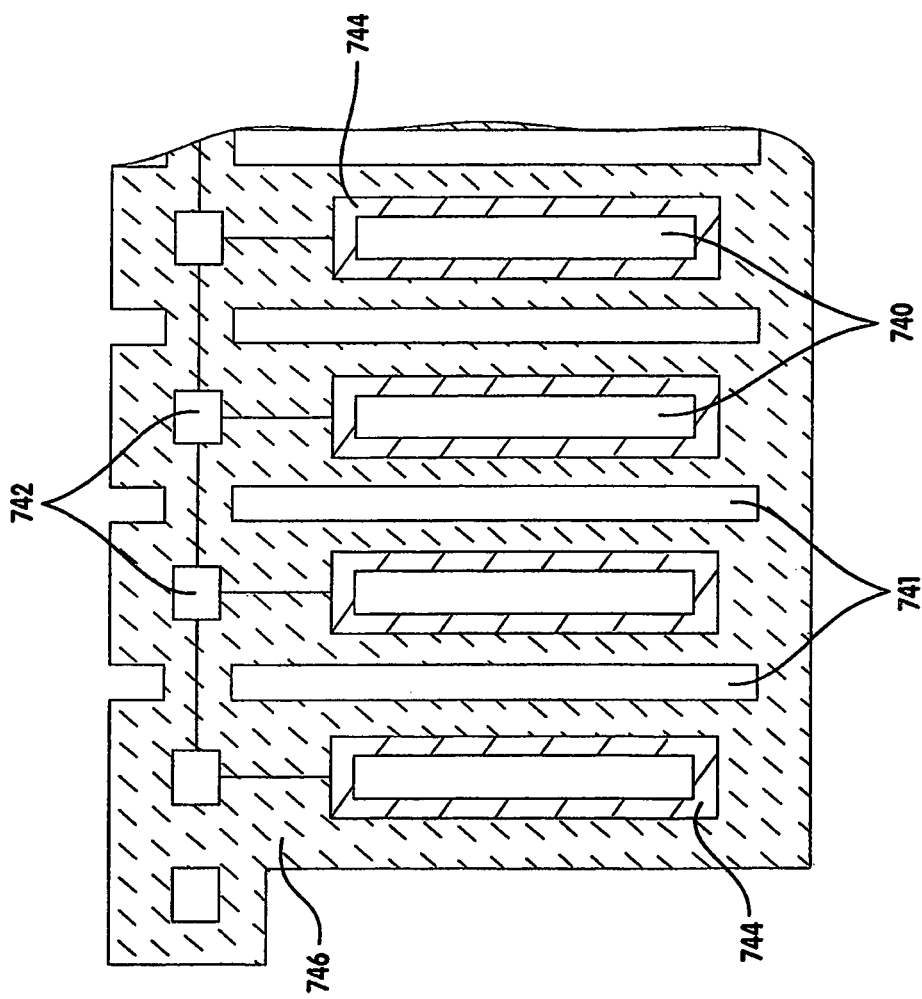
FIG. 46 is an enlarged view of portions of the die of FIG. 45.

Still further improvements are illustrated in FIGS. 44-46. Instead of placing all of the transistor cells in a single region of active area, individual separated banks 740 of active areas are connected together such that the transistor cells from separated banks 740 are in parallel to perform an equivalent function of a single active area. In one instance of the present embodiment, 1-micron thick field oxide 741 (FIGS. 45-46) separates individual active area banks 740 constructed on 216 micron center to center spacings. In the present embodiment, each bank 740 contains 8 by 21 transistor cells for a total of 168 cells per bank. The length of each bank 740 is 600 microns and the width is 160 microns. Bus connections (not shown) may be provided to ensure that banks of active area retain identical electrical potential to each other to prevent oscillation at the output. Gate connections 742 typically have solder bumps on top and function as a single gate when connected in parallel. A metal layer 744 overlies each bank 740 and makes connection to the sources of the transistor cells formed therein. In one embodiment, each metal layer 744 of separated banks 740 is bumped for connecting to a source package lead. Gate connections 742 overlie dielectric platform 746 to reduce parasitic capacitance. Dielectric platform 746 surrounds each bank of separated banks 740 to induce planar breakdown in the transistor cells within each bank.

The thermal advantage of this embodiment—also called the "spread-cell" approach—with a group of banks spread apart by relatively large distances (e.g., 216 microns), is significant. The source of heat resides in epitaxial layer of the die, which is well below n and p-doped regions. Thermal energy is dissipated through source contacts, which typically comprise multi layers of aluminum, titanium, titanium nitride, and gold on top of banks 740. As thermal vectors rise toward the source contacts, they tend to spread out, exiting the surface of the active area at approximately 45 degree angle. The large distance of separation between each bank allows efficient heat dissipation without creating excessive hotspots due to constructive buildup of thermal energy due to clustering of transistor cells in a single region. A thermal simulation of the "spread cell" approach for a 100 watt transistor when compared an equivalent device having all the transistor cells in a single active area region resulted in a 40% improvement in thermal efficiency.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device comprising:
a semiconductor material;
an active area;
a transistor including:
a gate over a first surface of the semiconductor material;
a source region in the active area;
a drain region;
a source electrode coupled to the source region;
a drain electrode coupled to the drain region; and
a channel region disposed between the source region and the drain region, wherein the channel region has an approximately constant doping profile;
a first layer of conductive material positioned over the first surface of the semiconductor material and adjacent to a portion of the gate of the transistor; and
a dielectric structure extending from the first surface of the semiconductor material into the semiconductor material, wherein at least a portion of the first layer of conductive material is positioned over the dielectric structure, wherein the dielectric structure is at least partially disposed between the first layer of conductive material and the drain region; and
wherein the dielectric structure includes a plurality of vertically extending dielectric structures separated by one or more cavities.

2. The semiconductor device of claim 1,
wherein the first layer of conductive material is a layer of polysilicon;
wherein a portion of the first layer of conductive material is positioned substantially between the gate and the drain region to reduce gate to drain capacitance; and
wherein the first layer of conductive material is electrically coupled to the source electrode of the transistor.

3. The semiconductor device of claim 1,
wherein the semiconductor material is an epitaxial layer;
wherein the source region of the transistor and the drain region of the transistor are formed in the epitaxial layer;
wherein the dielectric structure extends from the first surface through the epitaxial layer; and
wherein a wall of the dielectric structure adjacent to the outer boundary of the active area provides edge termination to maintain substantially planar equipotential lines in the epitaxial layer during operation of the semiconductor device.

4. The semiconductor device of claim 1,
wherein the dielectric structure comprises an oxide;
wherein the dielectric structure is at least about 10 microns wide; and
wherein the dielectric support structure surrounds the active area.

5. The semiconductor device of claim 1, wherein the area of the dielectric structure is approximately equal to at least ten percent of the total area of the semiconductor material.

6. The semiconductor device of claim 1, wherein the dielectric structure is a solid structure substantially devoid of any air gaps.

7. The semiconductor device of claim 1, wherein the dielectric structure includes an air gap within at least one of the one or more cavities.

8. The semiconductor device of claim 1, further comprising:
a second layer of conductive material positioned over the first layer of conductive material and adjacent to the portion of the gate of the transistor, wherein at least a portion of the second layer of conductive material is positioned over the dielectric structure; and
a third layer of conductive material positioned over the second layer of conductive material and adjacent to the portion of the gate of the transistor, wherein at least a portion of the third layer of conductive material is positioned over the dielectric structure.

9. The semiconductor device of claim 8, wherein the first layer of conductive material comprises polysilicon, wherein the second layer of conductive material comprises a silicide, and wherein the third layer of conductive material comprises polysilicon.

10. The semiconductor device of claim 1, wherein a dielectric material is deposited within the one or more cavities.

11. The semiconductor device of claim 1, wherein each vertically extending dielectric structure of the plurality of vertically extending dielectric structures comprises a first portion of dielectric material and a second portion of dielectric material having a different composition than the first portion of dielectric material.

12. A semiconductor device comprising:
a semiconductor material;
a first region of a first conductivity type in the semiconductor material;
a second region of a second conductivity type in the semiconductor material adjacent to the first region, wherein the second region has a higher doping concentration than the semiconductor material, wherein the first region and the second region extend from a top surface of the semiconductor material into the semiconductor material, and wherein a depth of the second region relative to the top surface of the semiconductor material is approximately equal to a depth of the first region;
a third region of the second conductivity type extending from the top surface of the semiconductor material into the semiconductor material;
a conductive material over the first region; and
a dielectric structure in the semiconductor material and adjacent to an area that includes the first region, wherein the dielectric structure extends from the top surface of the semiconductor material into the semiconductor material, and wherein the dielectric structure is at least partially disposed between the conductive material and the second region;
wherein the dielectric structure includes a plurality of vertically extending dielectric structures separated by one or more cavities;
wherein the semiconductor device comprises a transistor and wherein the transistor comprises:
a portion of the semiconductor material;
the first region, wherein a portion of the first region is a channel region of the transistor;
the second region, wherein the second region and the portion of the semiconductor material are a drain region of the transistor and wherein the second region is adjacent to the first region;
the third region, wherein the third region is a source region of the transistor;

the conductive material, wherein the conductive material is a gate of the transistor, and wherein the conductive material is positioned over the top surface of the semiconductor material; and a gate interconnect coupled to the gate;

wherein the source region is in the first region and the channel region of the transistor surrounds the source region of the transistor.

13. The semiconductor device of claim 12, wherein the first region is adjacent to the top surface of the semiconductor material, wherein the second region is adjacent to the top surface of the semiconductor material, and wherein the second region is electrically coupled to the first region.

14. The semiconductor device of claim 12, wherein the channel length is equal to or less than approximately 0.35 microns (μm).

15. The semiconductor device of claim 12, wherein the transistor is a vertical radio frequency (RF) power transistor.

16. The semiconductor device of claim 12, further comprising:
a source electrode coupled to the source region and adjacent to the top surface of the semiconductor material; and
a drain electrode coupled to the drain region and adjacent to a bottom surface of the semiconductor material, wherein the bottom surface is opposite the top surface.

17. The semiconductor device of claim 12, further comprising a layer of conductive material over the top surface of the semiconductor material and adjacent to the gate of the transistor.

18. The semiconductor device of claim 17, wherein the layer of conductive material is a layer of polysilicon and is positioned over the upper surface of the semiconductor material; and wherein at least a portion of the gate interconnect is positioned over the layer of conductive material to reduce gate to drain capacitance.

19. The semiconductor device of claim 17, wherein the layer of conductive material is a shield and is electrically coupled to the source region of the transistor.

20. The semiconductor device of claim 17, further comprising a fourth region of the first conductivity type in the semiconductor material, coupled to the first region, and adjacent to the dielectric structure.

21. The semiconductor device of claim 20, wherein the layer of conductive material is coupled to the fourth region; wherein the fourth region extends from a top surface of the semiconductor material into the semiconductor material; and wherein a depth of the second region relative to the top surface of the semiconductor material is less than a depth of the fourth region.

22. The semiconductor device of claim 12, wherein the dielectric structure surrounds the source region and is adjacent to the conductive material.

23. The semiconductor device of claim 12, wherein at least a portion of the gate interconnect is positioned over the dielectric structure.

24. The semiconductor device of claim 12, wherein the dielectric structure is at least about ten microns wide.

25. The semiconductor device of claim 12, wherein the dielectric structure comprises an oxide and wherein the dielectric structure is a solid dielectric structure substantially devoid of any air gaps within the one or more cavities.

26. The semiconductor device of claim 12, wherein the dielectric structure includes an air gap within at least one of the one or more cavities.

27. The semiconductor device of claim 12, wherein the dielectric structure includes a vertical structure adjacent to the transistor to stand off a voltage of approximately 75 volts.

28. The semiconductor device of claim 12,
wherein the semiconductor material includes a semiconductor substrate and an epitaxial layer positioned over the semiconductor substrate;
wherein the first region, the second region, and the third region are formed in the epitaxial layer;
wherein the dielectric structure extends from the first surface of the epitaxial layer through the epitaxial layer;
wherein the dielectric structure comprises a ring structure that surrounds the first region; and
wherein the area of the dielectric structure is approximately equal to at least ten percent of the total area of the semiconductor material.

29. The semiconductor device of claim 12, wherein the semiconductor material is an epitaxial layer of the second conductivity type.

30. A semiconductor device comprising:
a semiconductor material including a channel region, wherein the channel region has a substantially constant doping concentration profile;
an active area in the semiconductor material;
a first region of a first conductivity type in the active area extending from a first surface of the semiconductor material into the semiconductor material;
a second region of a second conductivity type in the active area extending from the first surface of the semiconductor material into the semiconductor material;
a third region of the second conductivity type in the active area extending from the first surface of the semiconductor material into the semiconductor material;
a fourth region of the first conductivity type in the active area extending from the first surface of the semiconductor material into the semiconductor material; and
a dielectric structure extending at least about four microns from a surface of the semiconductor material into the semiconductor material, wherein the dielectric structure is a structure surrounding the active area, wherein the fourth region is contiguous around the periphery of the active area and adjacent to the dielectric structure, wherein the dielectric structure is at least partially disposed between a gate of a transistor in the active area and the second region, and wherein the dielectric structure includes a plurality of vertically extending dielectric structures separated by one or more cavities.

31. The semiconductor device of claim 30, wherein the active area comprises a transistor, and wherein the transistor includes:
the first region abutting the fourth region, wherein a portion of the first region is a channel region of the transistor, and wherein a depth of the fourth region relative to the first surface of the semiconductor material is greater than a depth of the first region;
the second region of a second conductivity type coupled to the first region, wherein the second region is a portion of the drain region of the transistor;
the third region of the second conductivity type coupled to the first region, wherein the third region is a source region of the transistor; and
an electrically conductive material, wherein the electrically conductive material is polysilicon and is a portion of a gate of the transistor, and wherein the electrically conductive material is positioned over the first surface of the semiconductor material and over the first region.

32. The semiconductor device of claim 31, wherein the transistor is a vertical transistor.

33. The semiconductor device of claim 31, wherein the semiconductor material includes an epitaxial layer extending from a first surface of the semiconductor material into the semiconductor material;
wherein the fourth region, the first region, the second region, and the third region are formed in the epitaxial layer;
wherein the area of the dielectric structure is approximately equal to at least ten percent of the total area of the semiconductor substrate;
wherein the dielectric structure extends from the first surface through the epitaxial layer; and
wherein a wall of the dielectric structure adjacent to the outer boundary of the active area provides edge termination to maintain substantially planar equipotential lines in the epitaxial layer during operation of the semiconductor device.

34. The semiconductor device of claim 31, further comprising a layer of conductive material positioned over the first surface of the semiconductor material and adjacent to a portion of the gate of the transistor to reduce gate to drain capacitance.

35. The semiconductor device of claim 34,
wherein the layer of conductive material is a layer of polysilicon;
wherein at least a portion of the gate is positioned over the layer of conductive material to reduce gate to drain capacitance;
wherein the fourth region is electrically coupled to the source region of the transistor; and
wherein the fourth region is directly connected to the layer of conductive material at the first surface of the semiconductor material.

36. The semiconductor device of claim 30, wherein the dielectric structure comprises a ring structure surrounding the active area and wherein the fourth region comprises a ring shaped region coupled to the dielectric structure.

37. A semiconductor device comprising:
a semiconductor material;
a vertical transistor including a gate, a drain region, a source region, and a channel region, wherein the channel region of the vertical transistor is in the semiconductor material and has a substantially constant doping concentration profile; and
a dielectric structure extending from a first surface of the semiconductor material into the semiconductor material, wherein the dielectric structure is at least partially disposed between the gate and the drain region to reduce a capacitance between the gate and the drain region, and wherein the dielectric structure includes a plurality of vertically extending dielectric structures separated by one or more cavities.

38. The semiconductor device of claim 37, wherein vertical transistor is a radio frequency (RF) transistor configured to operate at frequencies of greater than about 500 MHz.

39. The semiconductor device of claim 37,
wherein a portion of the gate of the vertical transistor is positioned over the dielectric structure to reduce gate to drain capacitance;
wherein the semiconductor material is an epitaxial layer;
wherein the source region of the transistor and the drain region of the transistor are formed in the epitaxial layer; and
wherein the dielectric structure extends from the first surface of the epitaxial layer through the epitaxial layer.

40. The semiconductor device of claim 37,
wherein the dielectric structure comprises an oxide; and
wherein the dielectric structure surrounds the vertical transistor.

41. The semiconductor device of claim 37, wherein the area of the dielectric structure is approximately equal to at least ten percent of the total area of the semiconductor material.

42. The semiconductor device of claim 37, wherein the dielectric structure is a solid structure substantially devoid of any air gaps within the one or more cavities.

43. The semiconductor device of claim 37, wherein the dielectric structure includes an air gap within at least one of the one or more cavities.

44. The semiconductor device of claim 37, further comprising a layer of conductive material positioned over the first surface of the semiconductor material, wherein at least a portion of the gate is positioned over the layer of conductive material to reduce gate to drain capacitance, and wherein the layer of conductive material is electrically coupled to the source region of the vertical transistor.

* * * * *